United States Patent
Olligs et al.

(10) Patent No.: US 8,021,933 B2
(45) Date of Patent: Sep. 20, 2011

(54) INTEGRATED CIRCUIT INCLUDING STRUCTURES ARRANGED AT DIFFERENT DENSITIES AND METHOD OF FORMING THE SAME

(75) Inventors: Dominik Olligs, Dresden (DE); Joachim Deppe, Langebruck/Dresden (DE); David Pritchard, Dresden (DE); Christoph Kleint, Dresden (DE)

(73) Assignee: Qimonda AG, Munich (DE)

( * ) Notice: Subject to any disclaimer, the term of this patent is extended or adjusted under 35 U.S.C. 154(b) by 868 days.

(21) Appl. No.: 11/847,095

(22) Filed: Aug. 29, 2007

(65) Prior Publication Data
US 2009/0057743 A1    Mar. 5, 2009

(51) Int. Cl.
*H01L 21/82* (2006.01)
(52) U.S. Cl. ........ 438/129; 438/128; 438/599; 438/700; 257/E23.532; 257/E21.598; 257/E21.602
(58) Field of Classification Search .................. 438/599, 438/709; 257/E21.532, E21.533, E21.534, 257/E21.536, E21.598
See application file for complete search history.

(56) References Cited

U.S. PATENT DOCUMENTS

| | | | |
|---|---|---|---|
| 5,916,821 A | 6/1999 | Kerber | |
| 6,168,904 B1 | 1/2001 | Cuthbert et al. | |
| 6,809,027 B2 | 10/2004 | Strane et al. | |
| 6,982,221 B1 | 1/2006 | Hsu | |
| 7,148,547 B2 | 12/2006 | Rudeck | |
| 2005/0142497 A1 | 6/2005 | Ryou et al. | |
| 2005/0167839 A1 | 8/2005 | Wetzel et al. | |
| 2005/0196685 A1 | 9/2005 | Wang et al. | |
| 2006/0024621 A1 | 2/2006 | Nolscher et al. | |
| 2006/0046484 A1* | 3/2006 | Abatchev et al. | 438/689 |
| 2006/0077702 A1 | 4/2006 | Sugimae et al. | |
| 2006/0216923 A1* | 9/2006 | Tran et al. | 438/622 |
| 2007/0148558 A1 | 6/2007 | Akbar | |

FOREIGN PATENT DOCUMENTS

| | | |
|---|---|---|
| DE | 4235702 A1 | 4/1994 |
| DE | 4236609 A1 | 5/1994 |
| DE | 10249216 B3 | 6/2004 |
| DE | 10301475 A1 | 7/2004 |
| WO | 2006101695 A1 | 9/2006 |

OTHER PUBLICATIONS

S. Wolf, "Silicon Processing for the VLSI Era," vol. 4, Deep-Submicron Process Technology, Lattice Press, 2002, p. 679.
Lars Bach, non-published U.S. Appl. No. 11/583,145, "Hard Mask Arrangement, Contact Arrangement and Methods of Patterning a Substrate and Manufacturing a Contact Arrangement," filed Oct. 19, 2006.

* cited by examiner

*Primary Examiner* — Charles Garber
*Assistant Examiner* — Cheung Lee
(74) *Attorney, Agent, or Firm* — Edell, Shapiro & Finnan, LLC

(57) ABSTRACT

A method of forming an integrated circuit includes forming first structures in a first portion of the integrated circuit and forming second structures, which are arranged more densely than the first structures, in a second portion. The first and second structures are defined by lithography processes using photomasks. At least one of the photomasks includes both openings in a first region for supporting the definition of the first structures and openings in a second region for supporting the definition of the second structures.

16 Claims, 48 Drawing Sheets

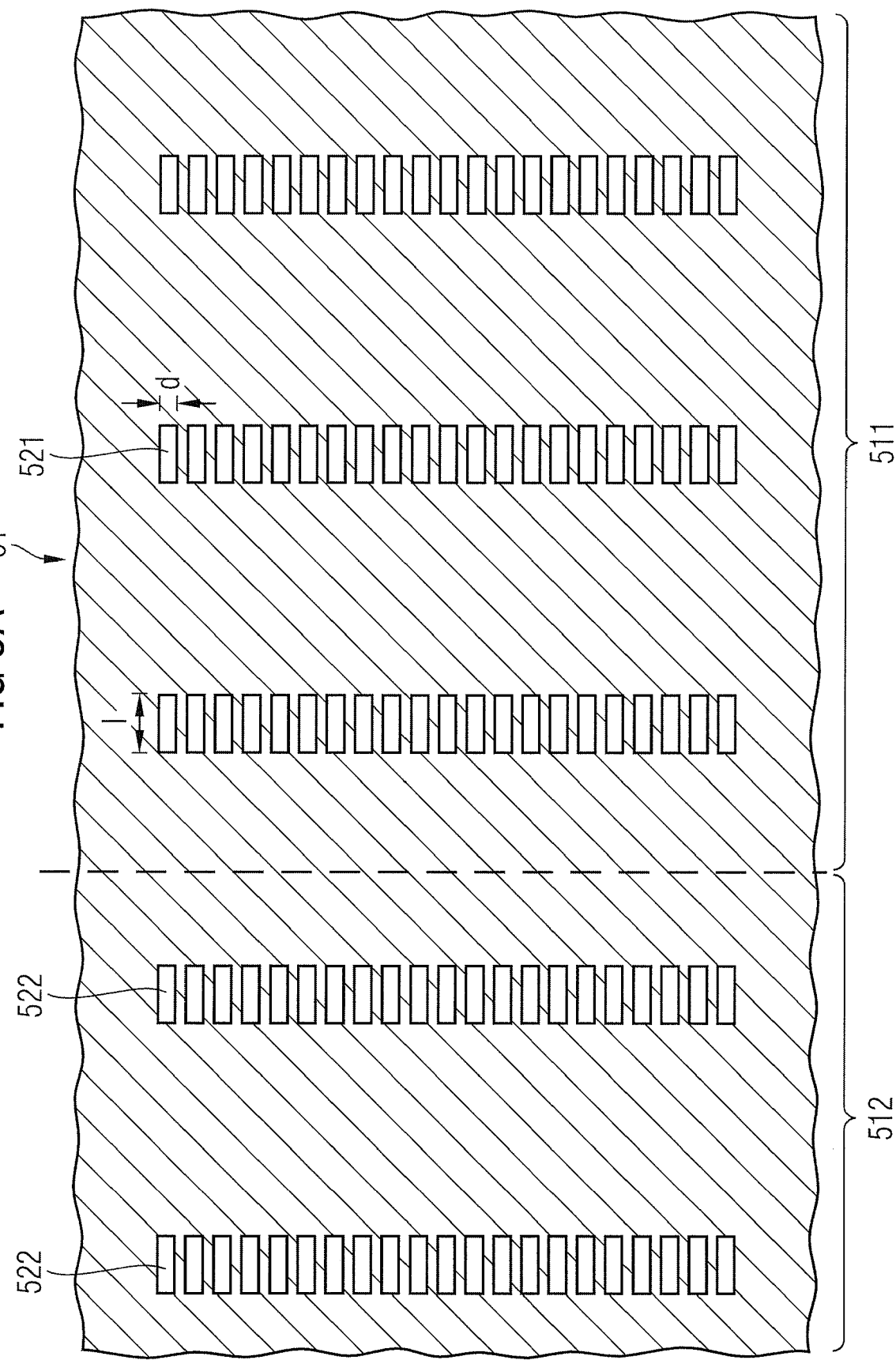

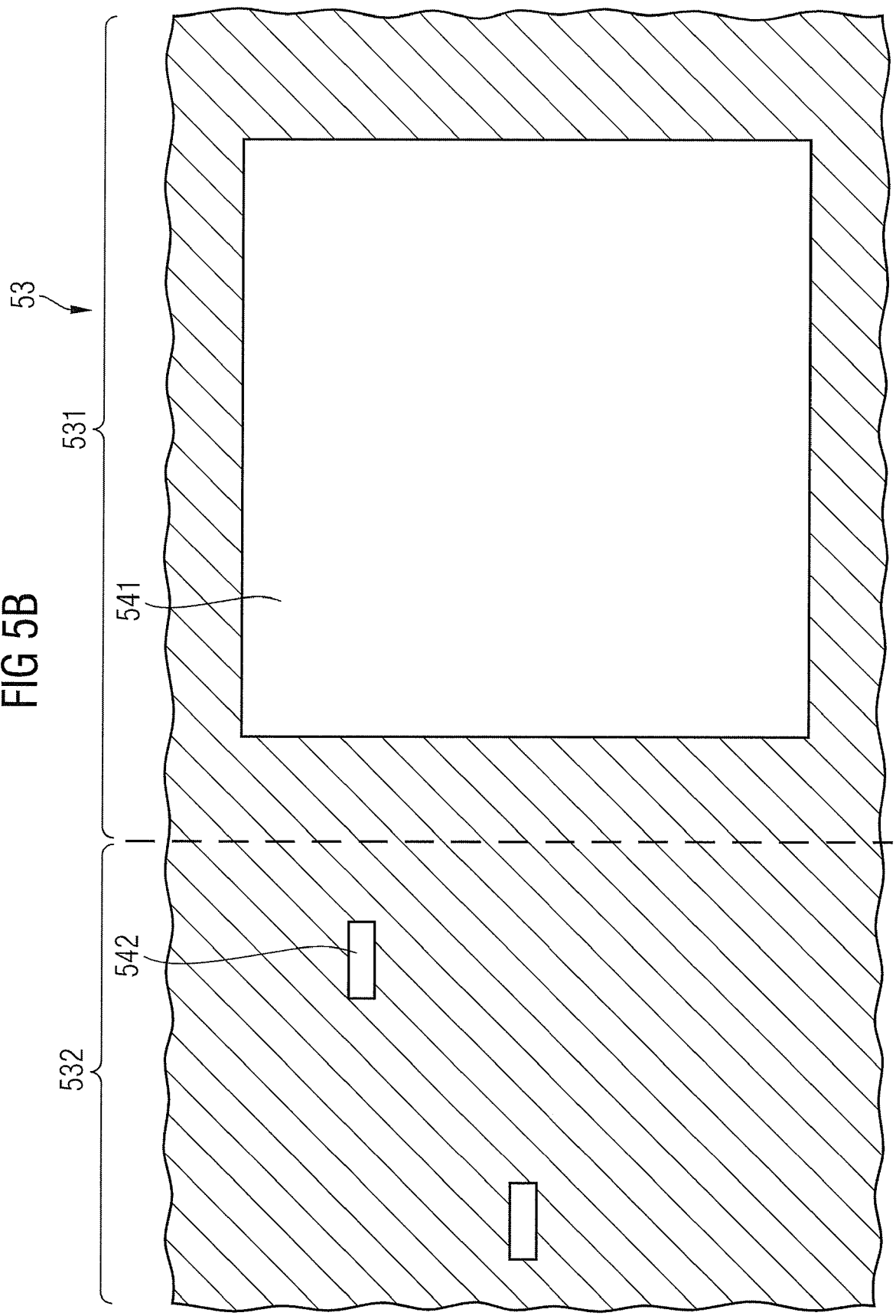

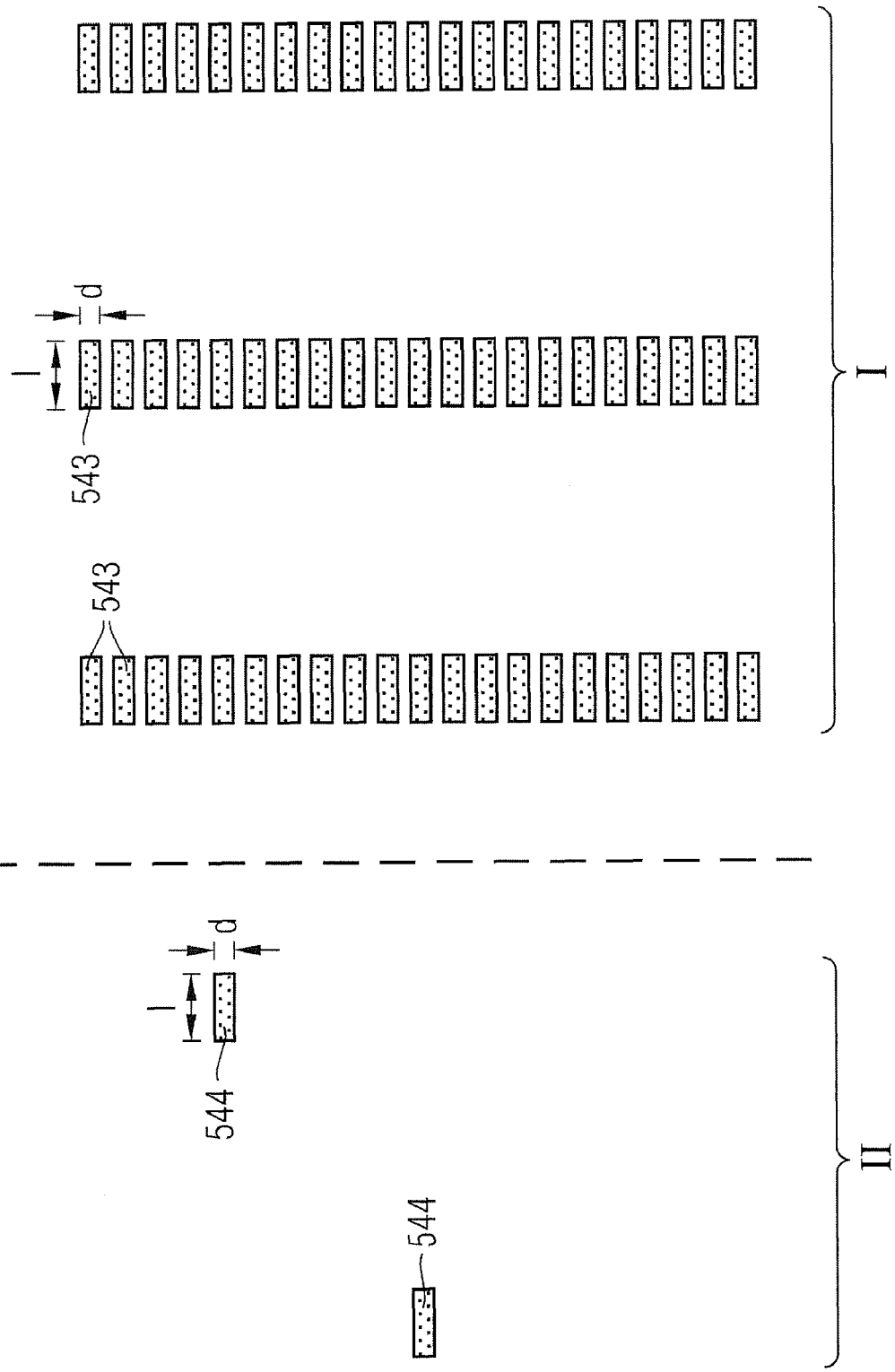

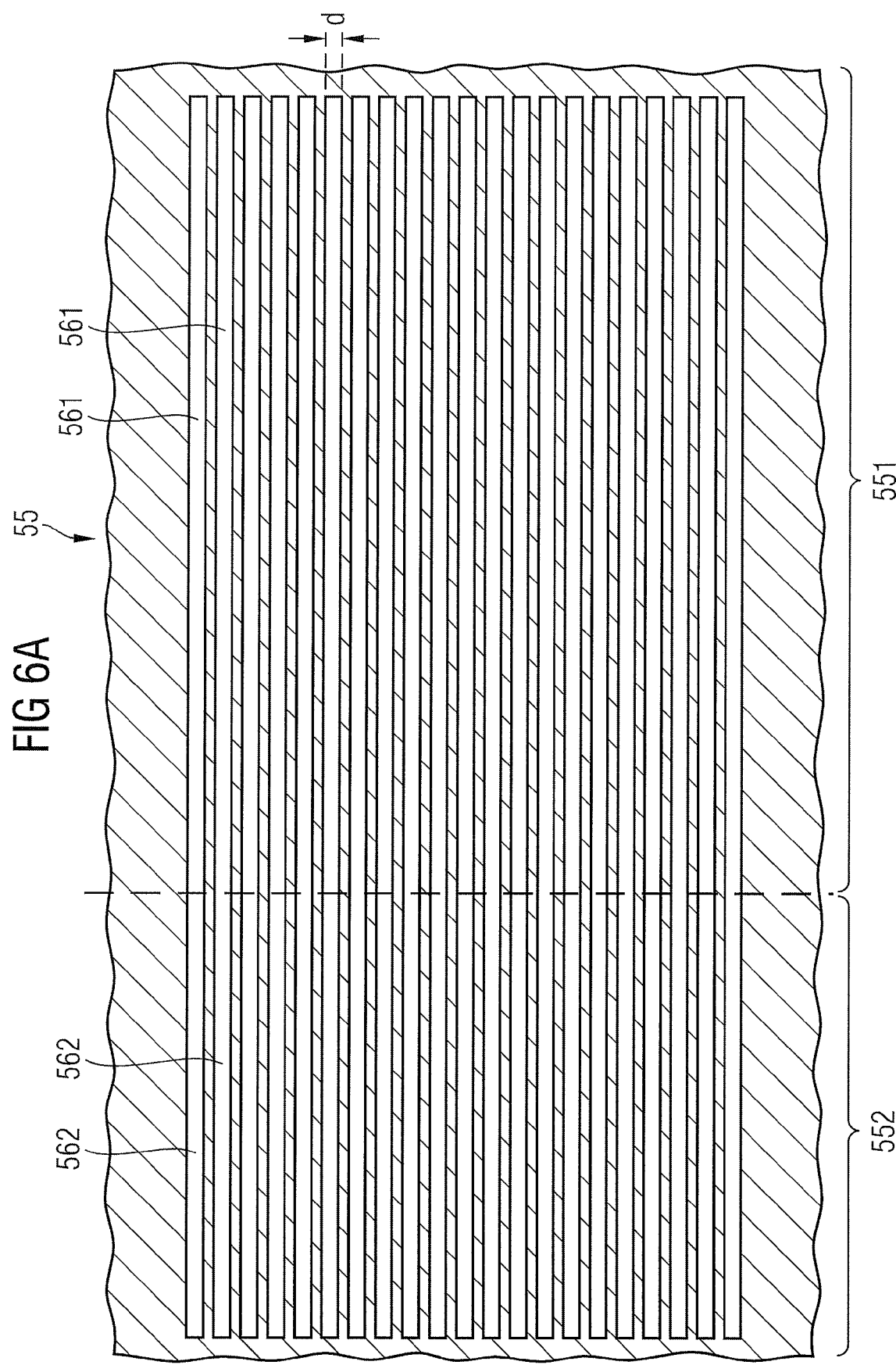

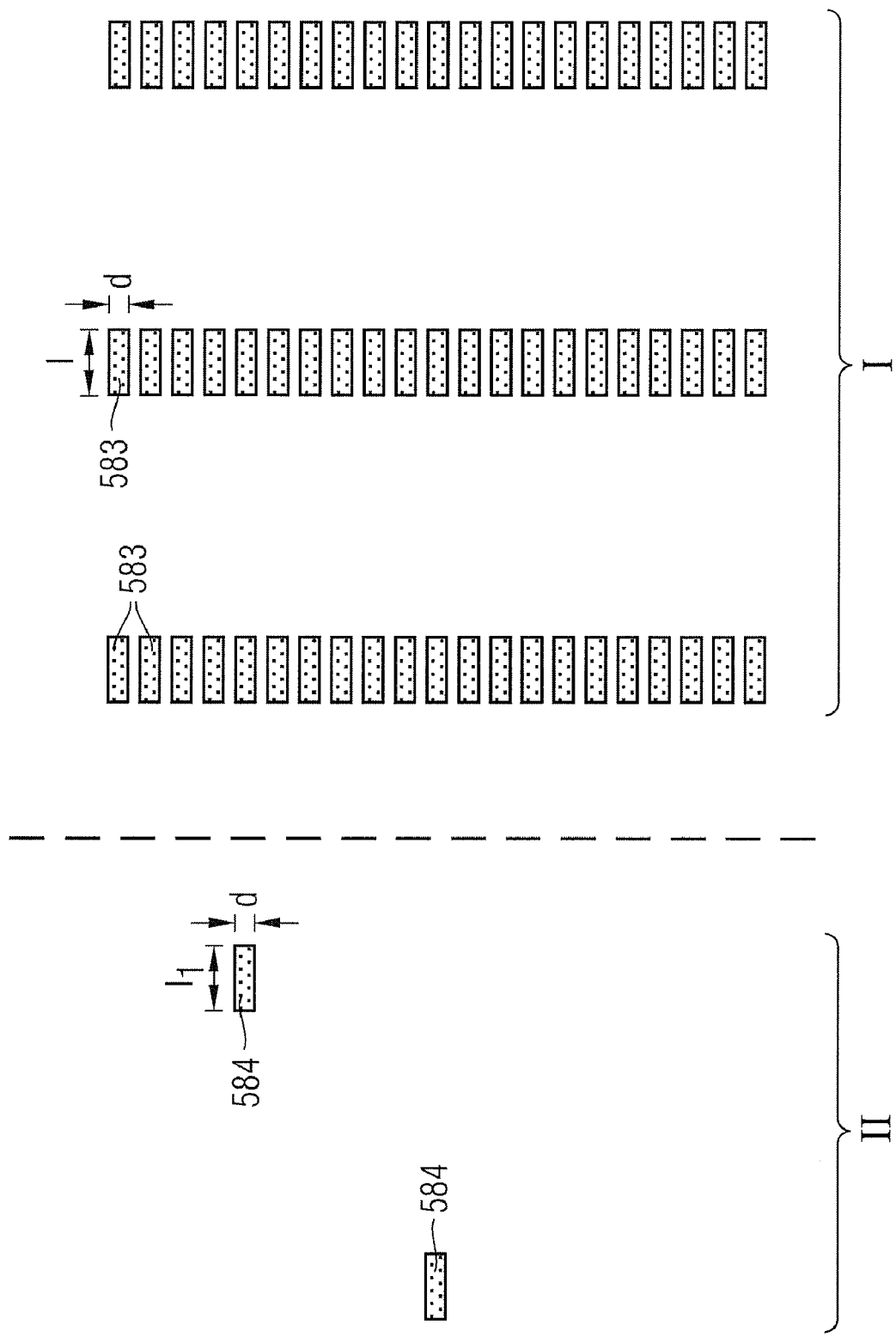

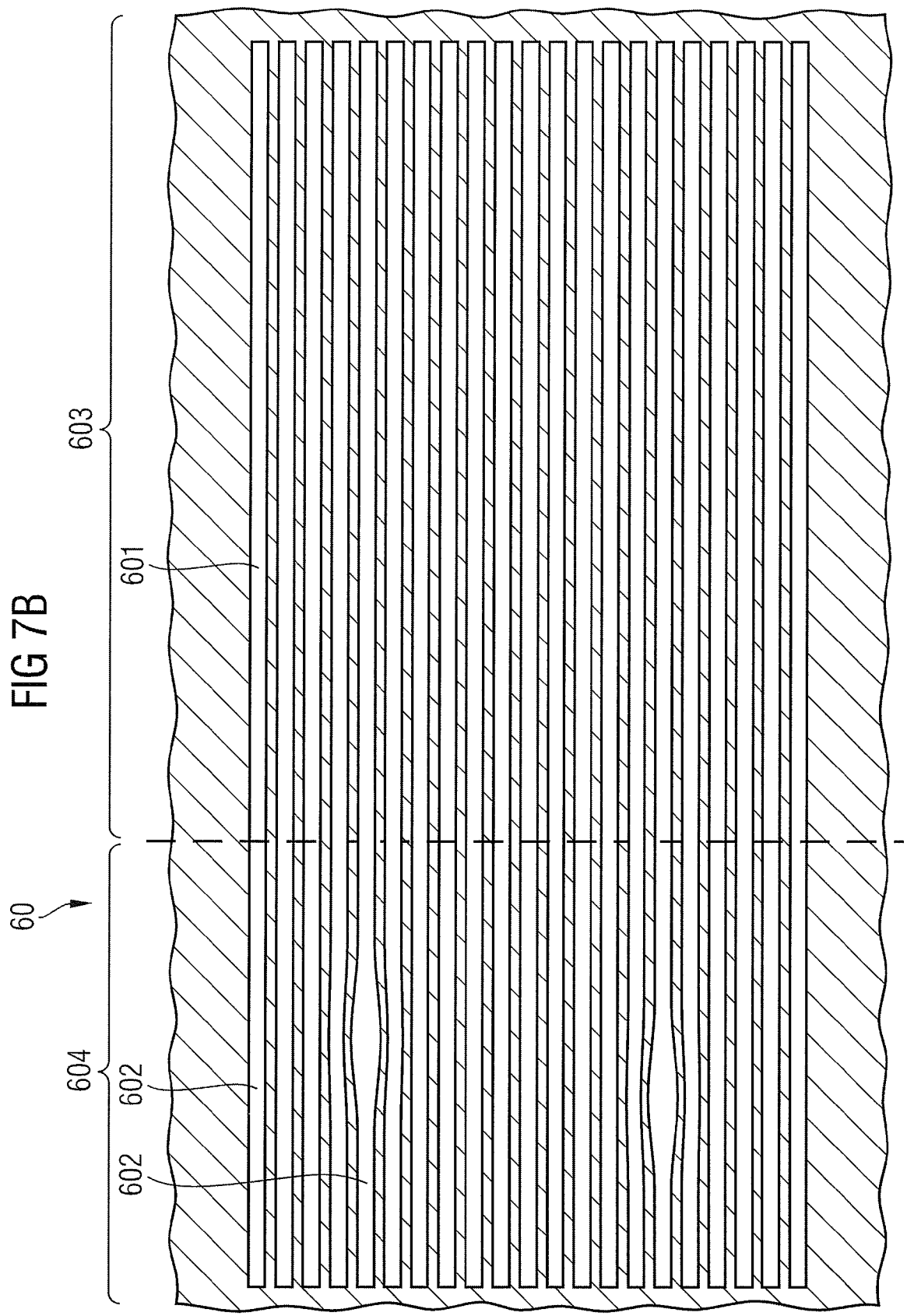

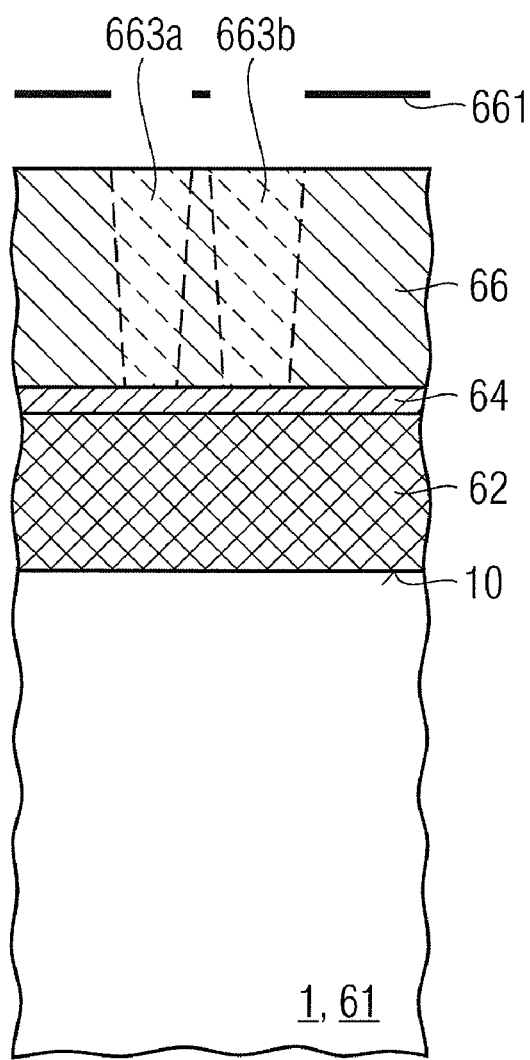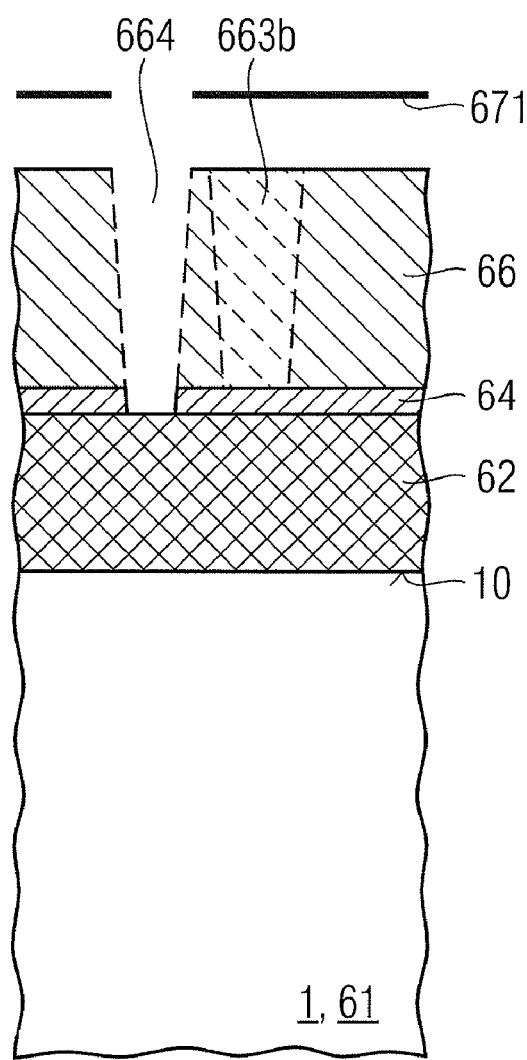

FIG 9C
FIG 9D
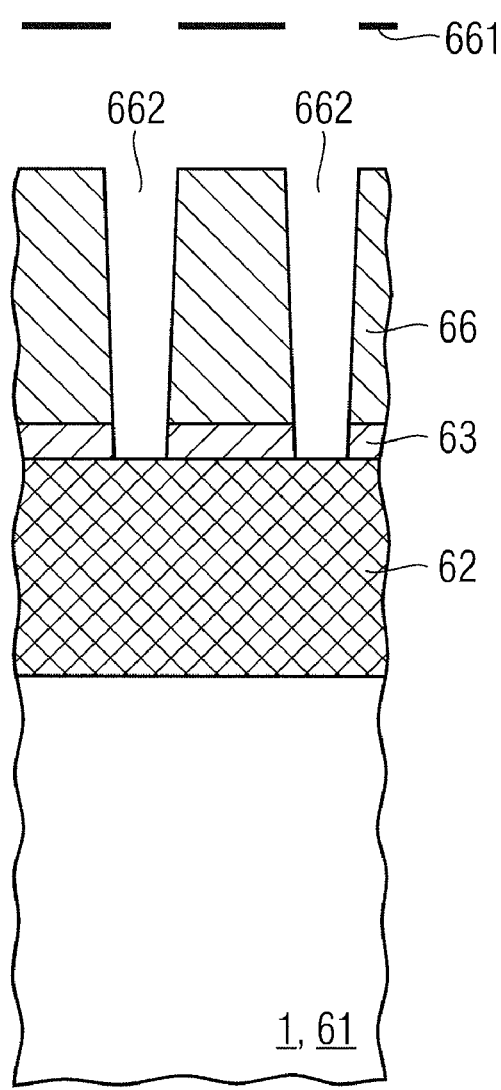
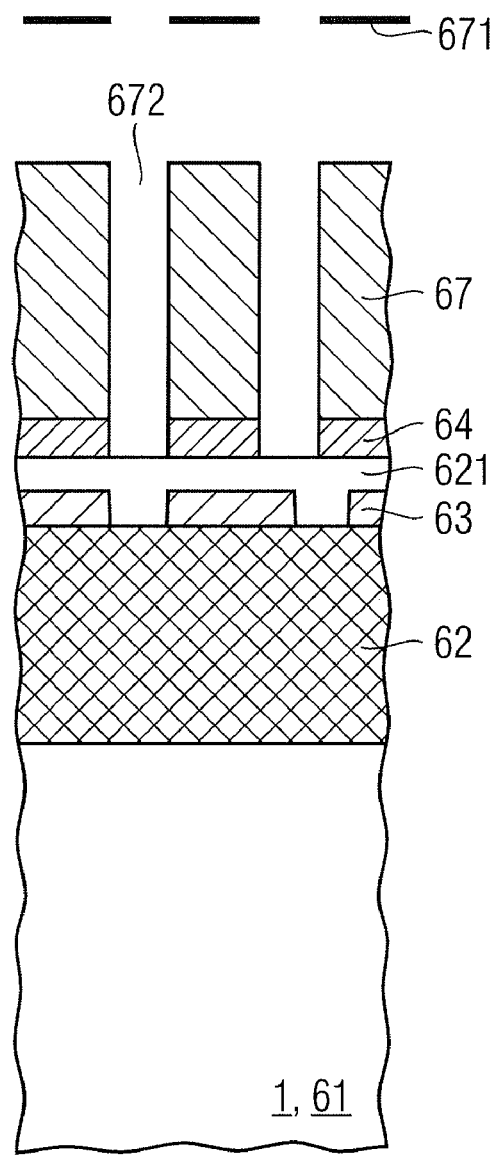

FIG 14A
FIG 14B
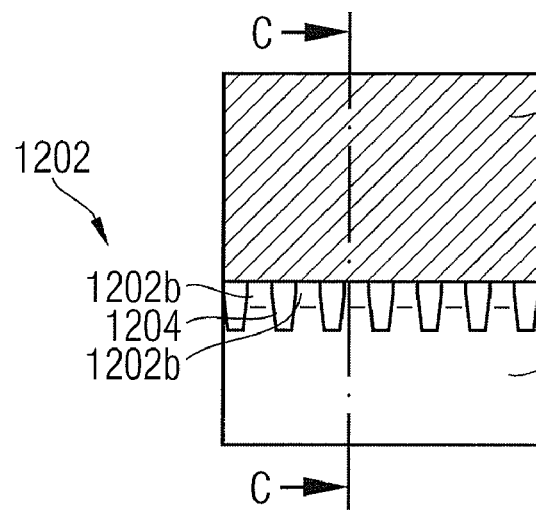
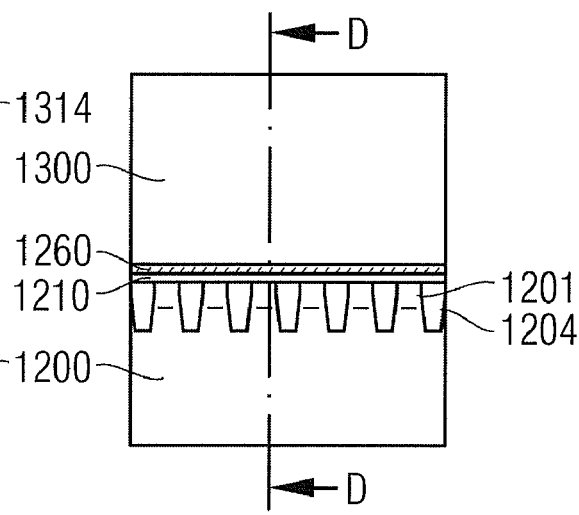
FIG 14C
FIG 14D
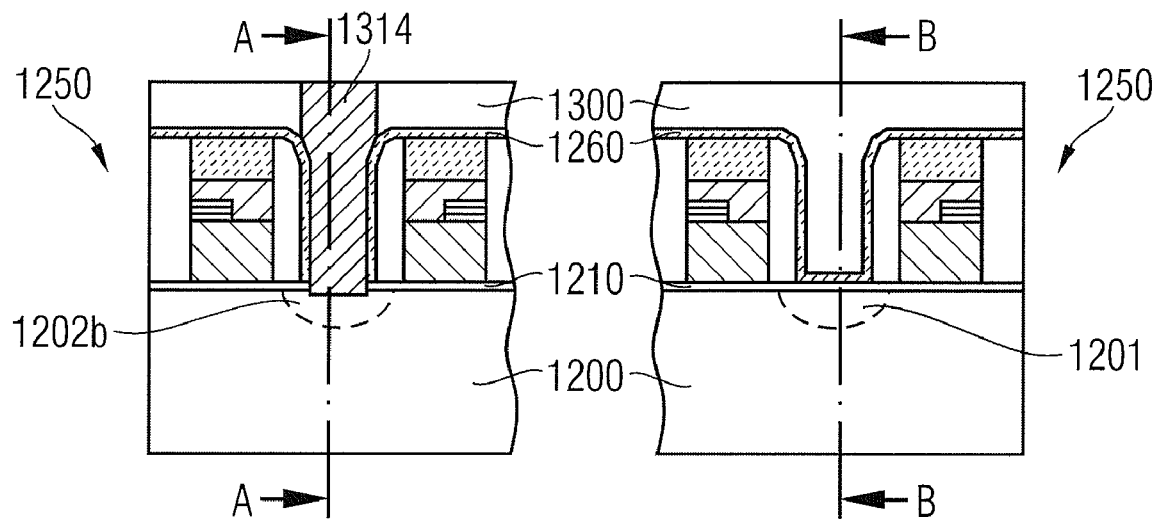

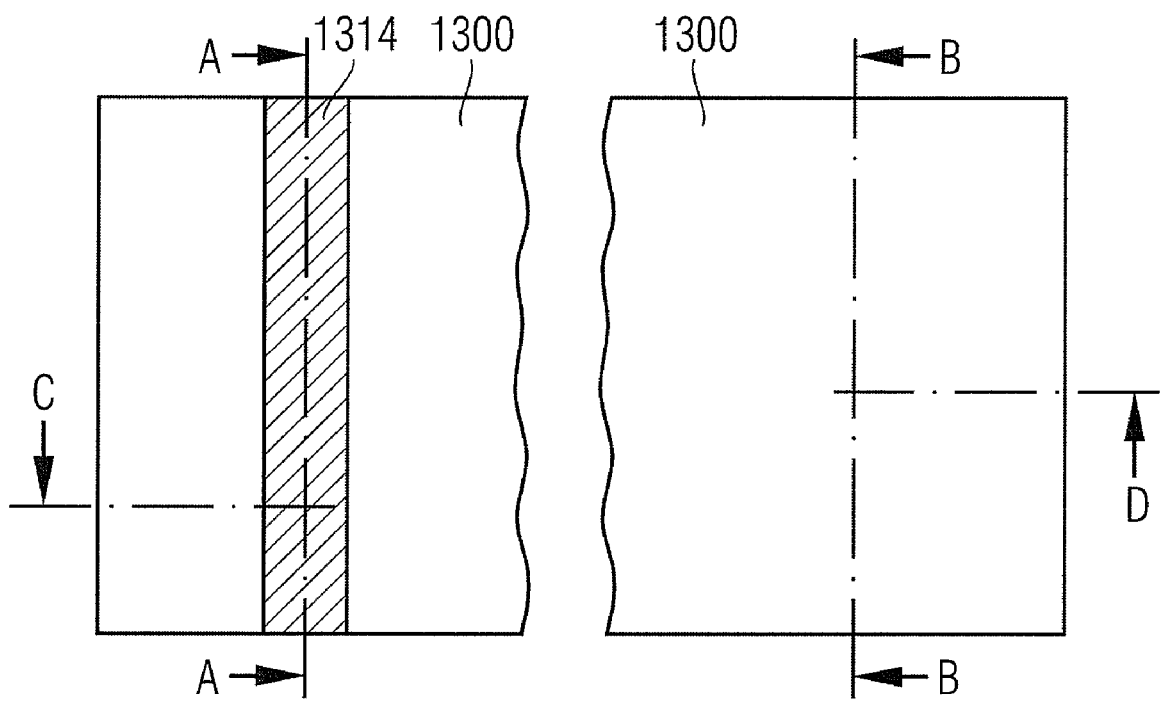

FIG 15E
FIG 15F
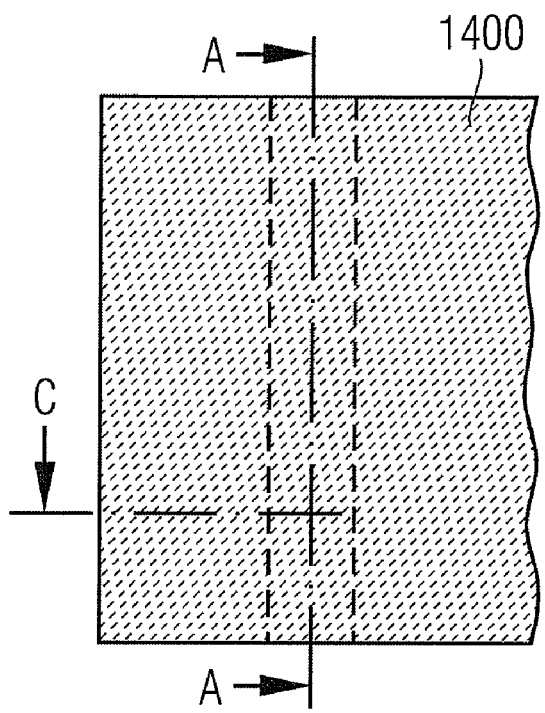
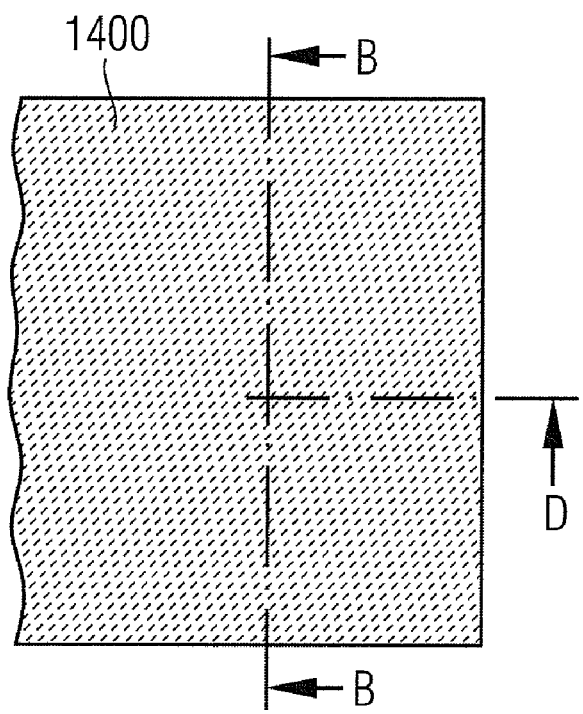

FIG 16E
FIG 16F
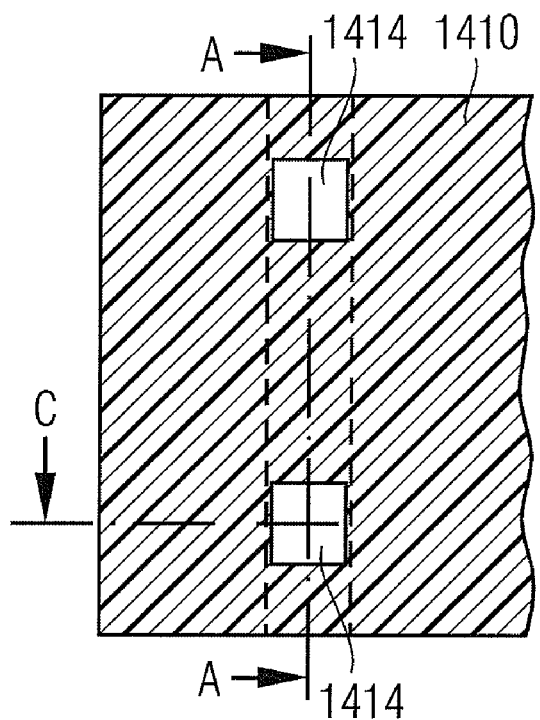
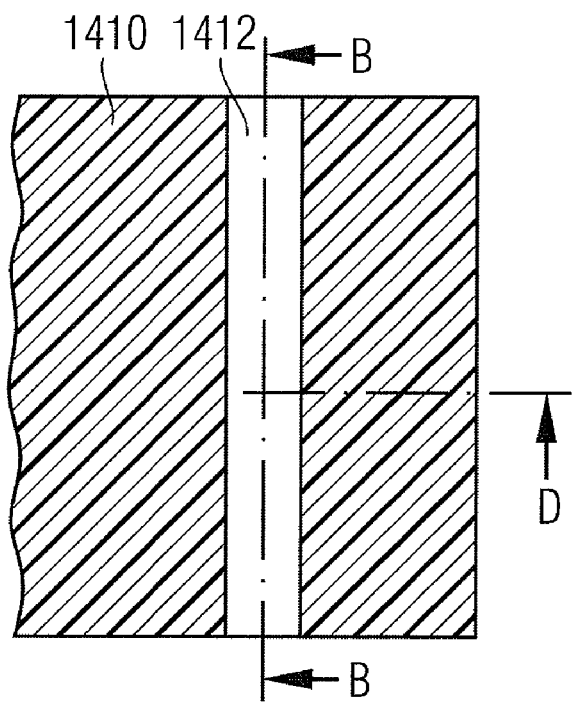

FIG 18A
FIG 18B
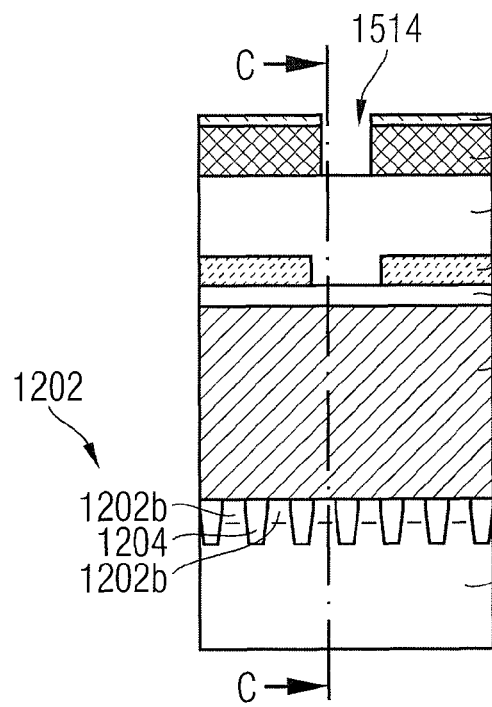
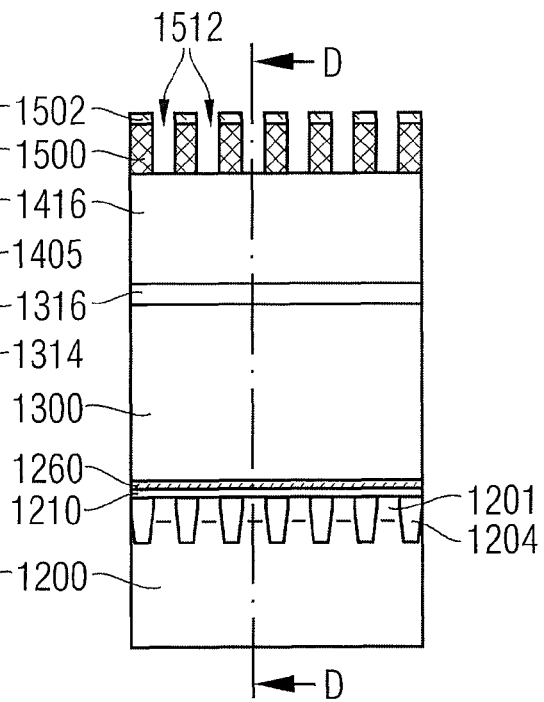
FIG 18C
FIG 18D
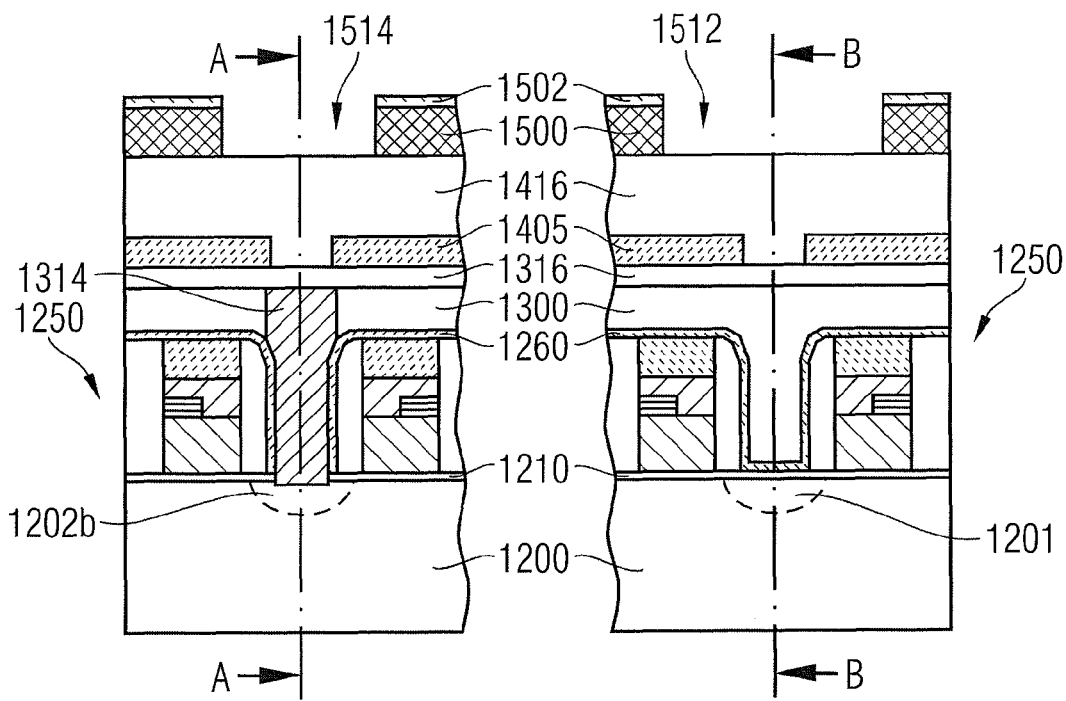

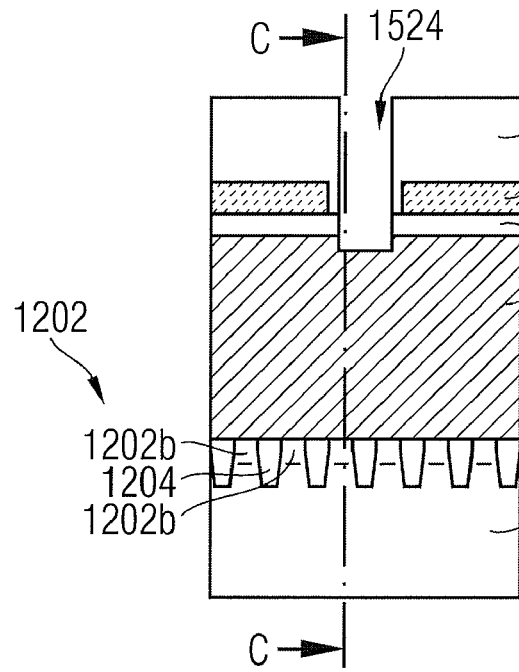
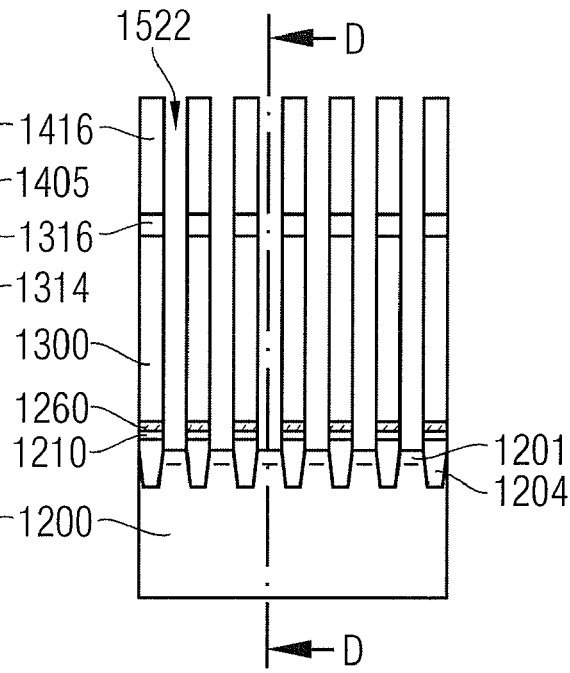
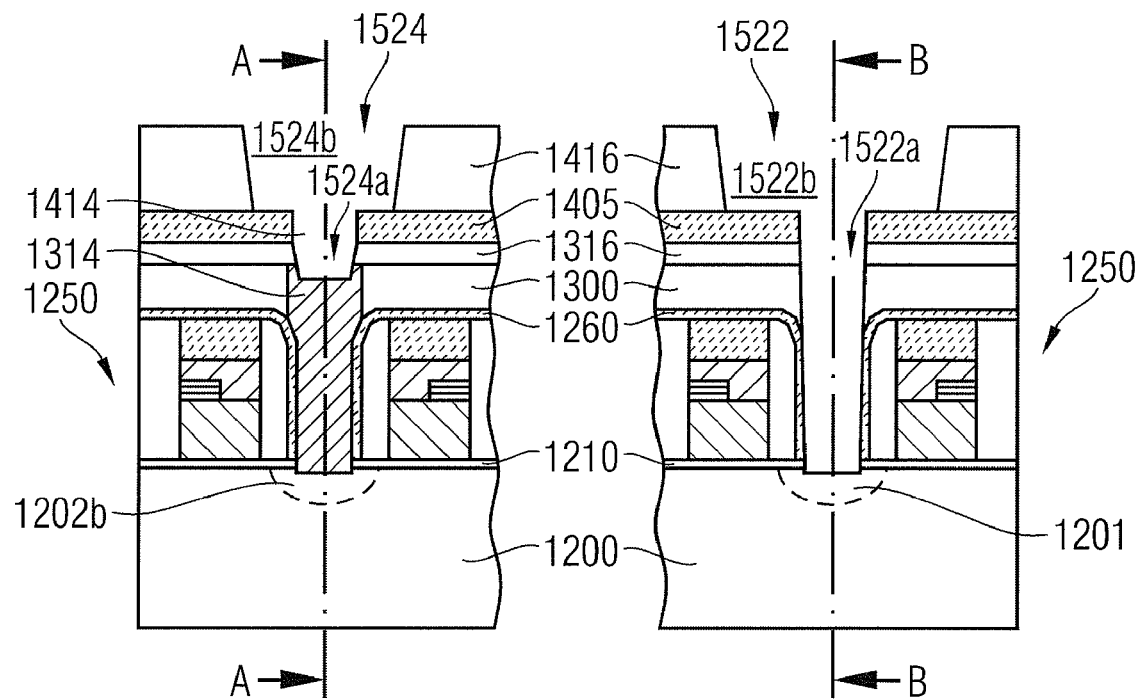

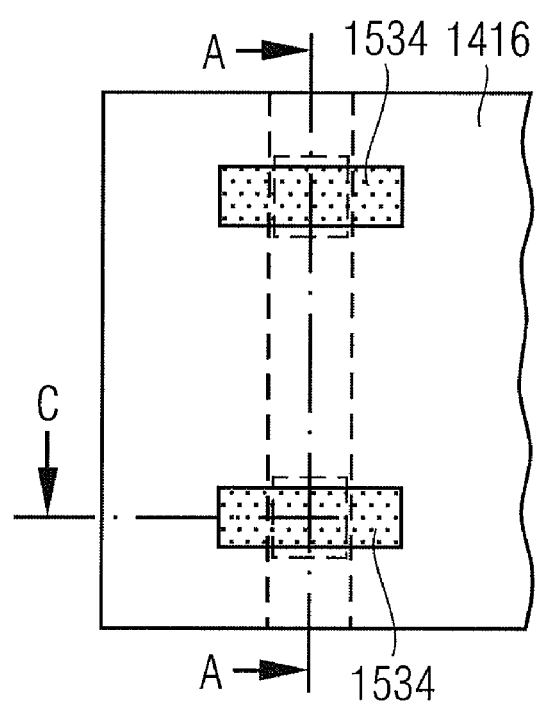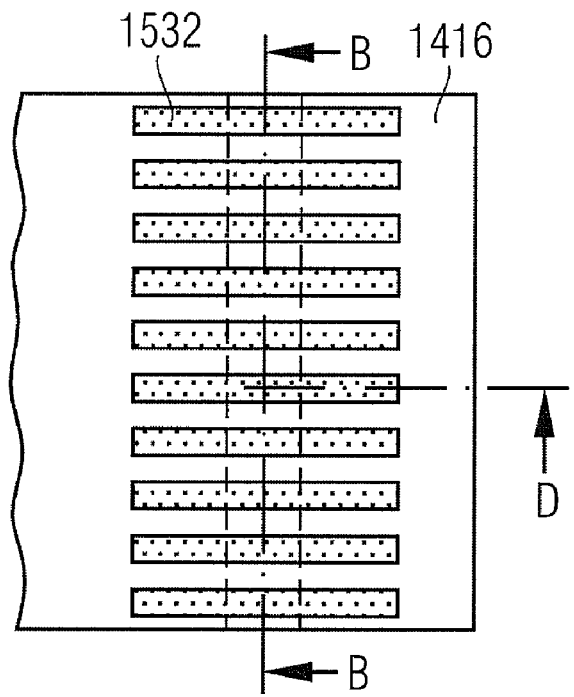

FIG 21E
FIG 21F
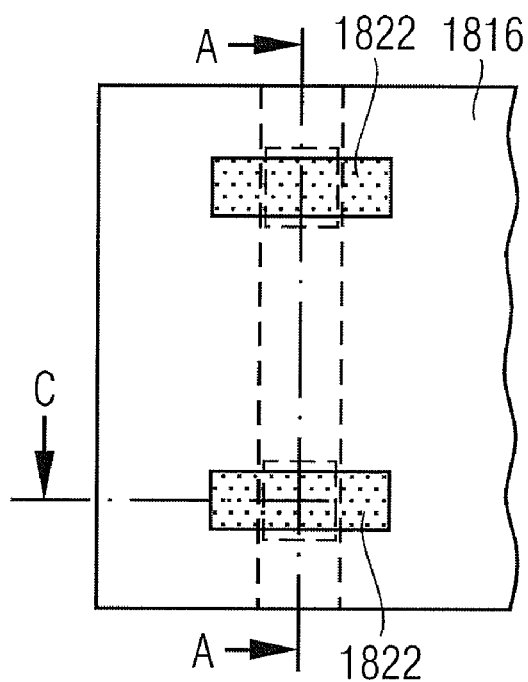
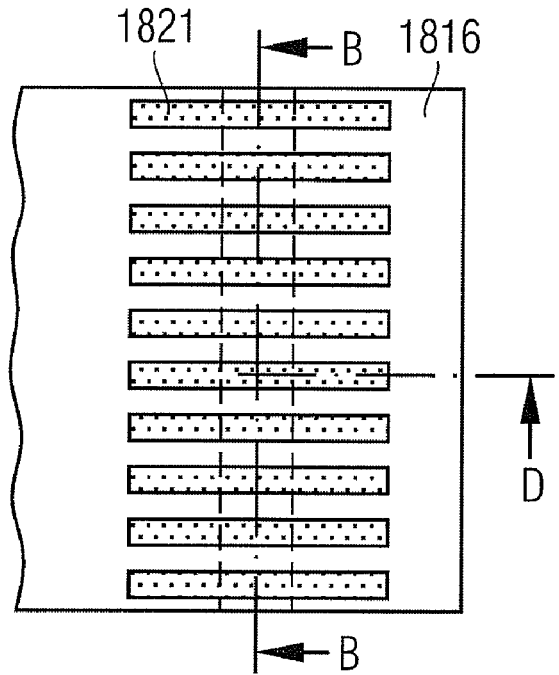

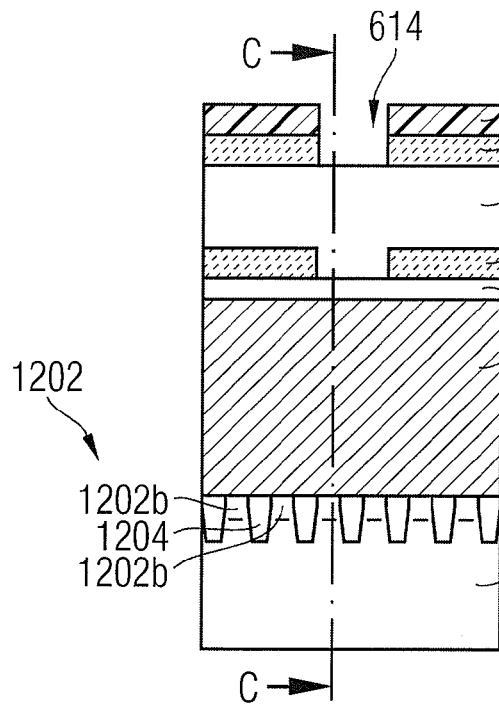
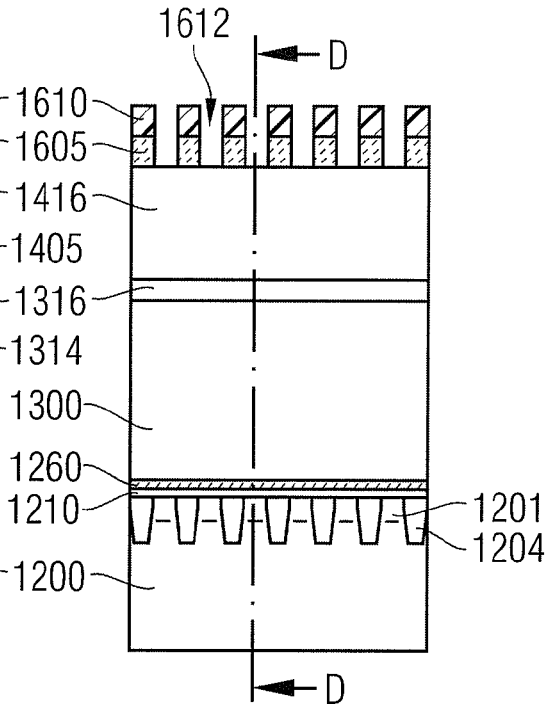
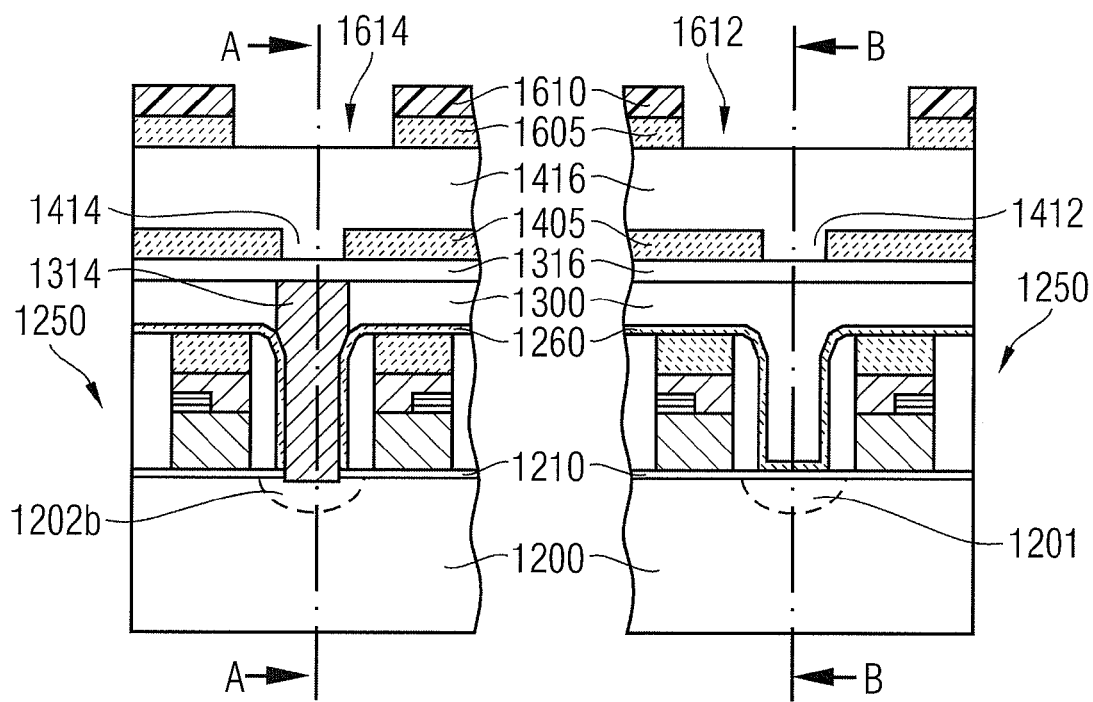

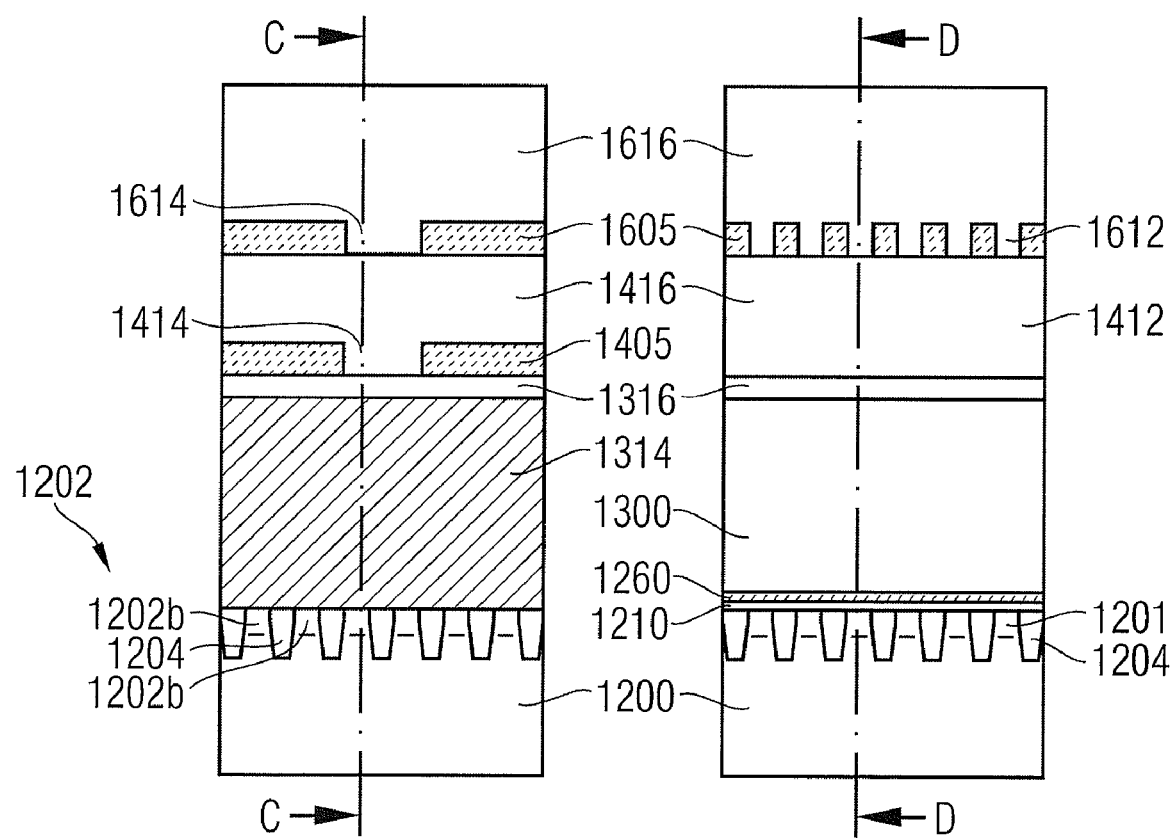

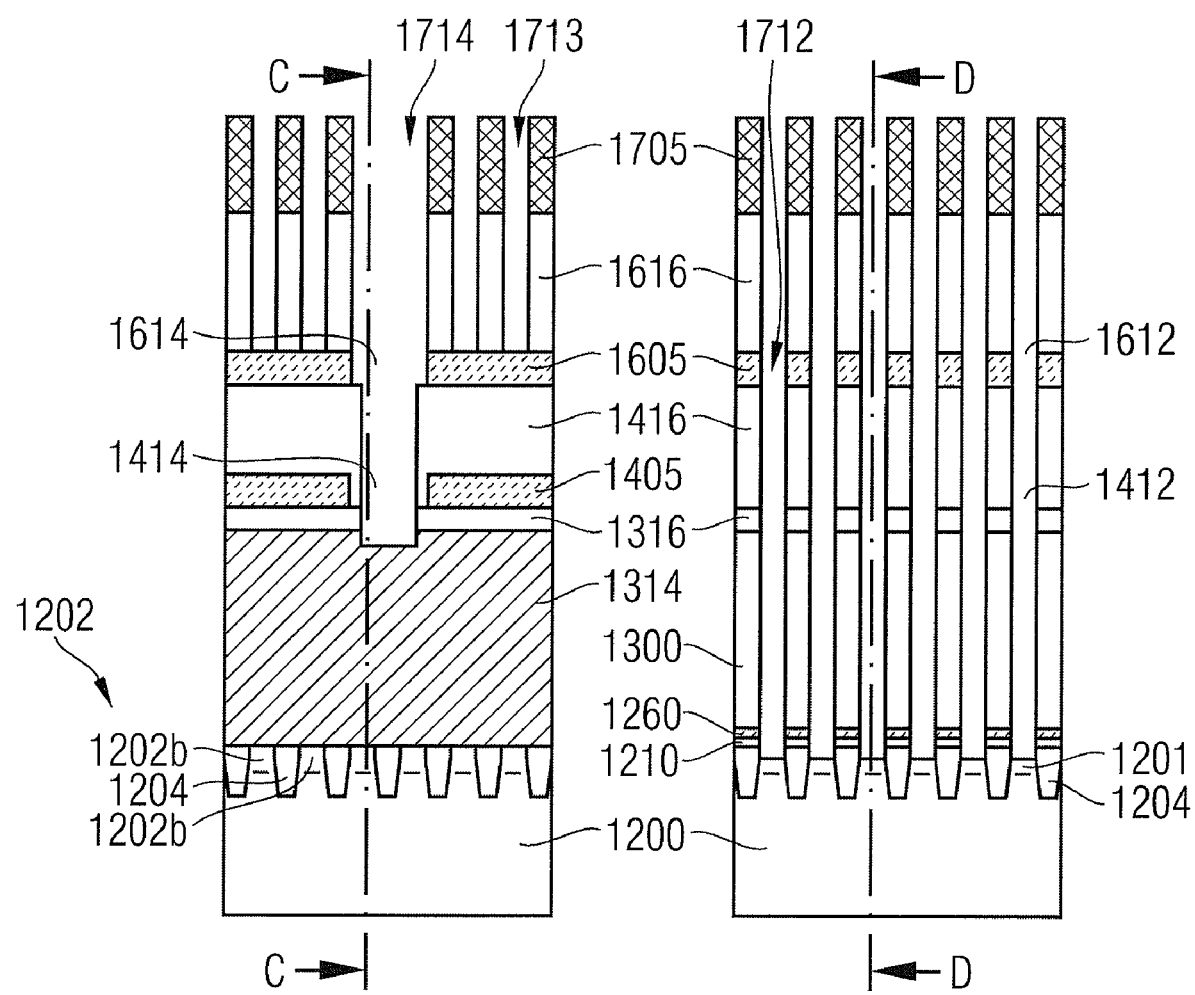

FIG 25C
FIG 25D
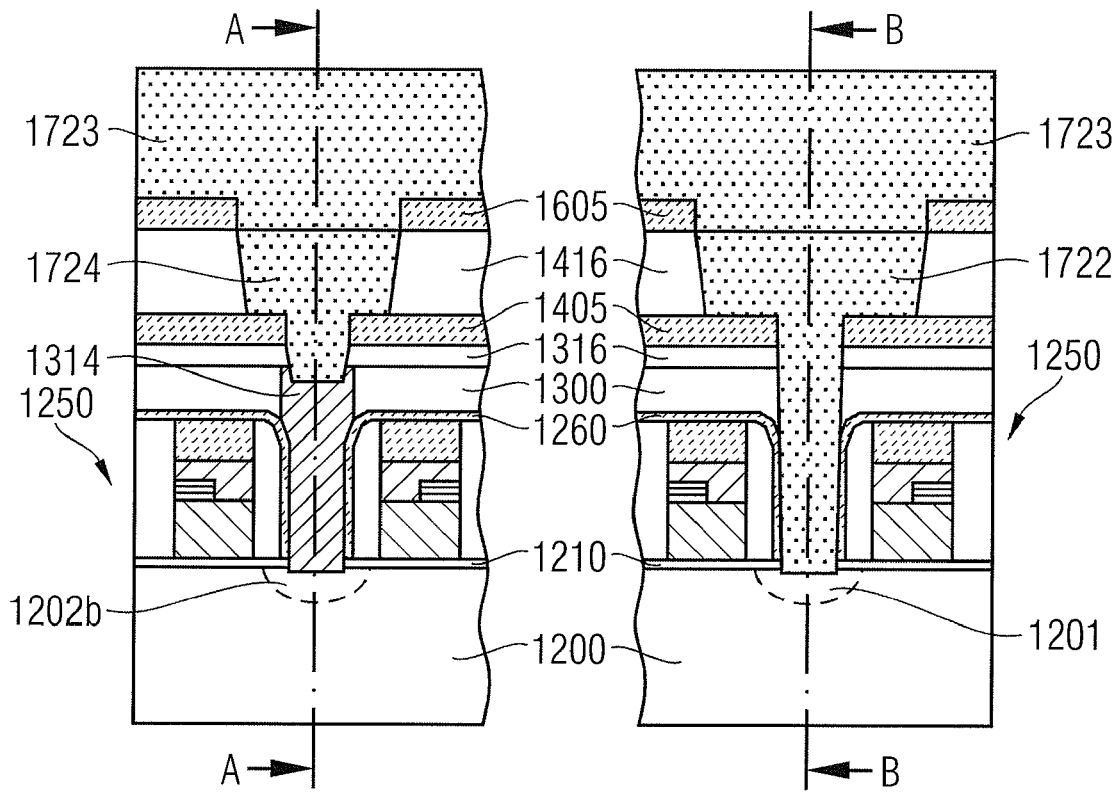
FIG 25E
FIG 25F
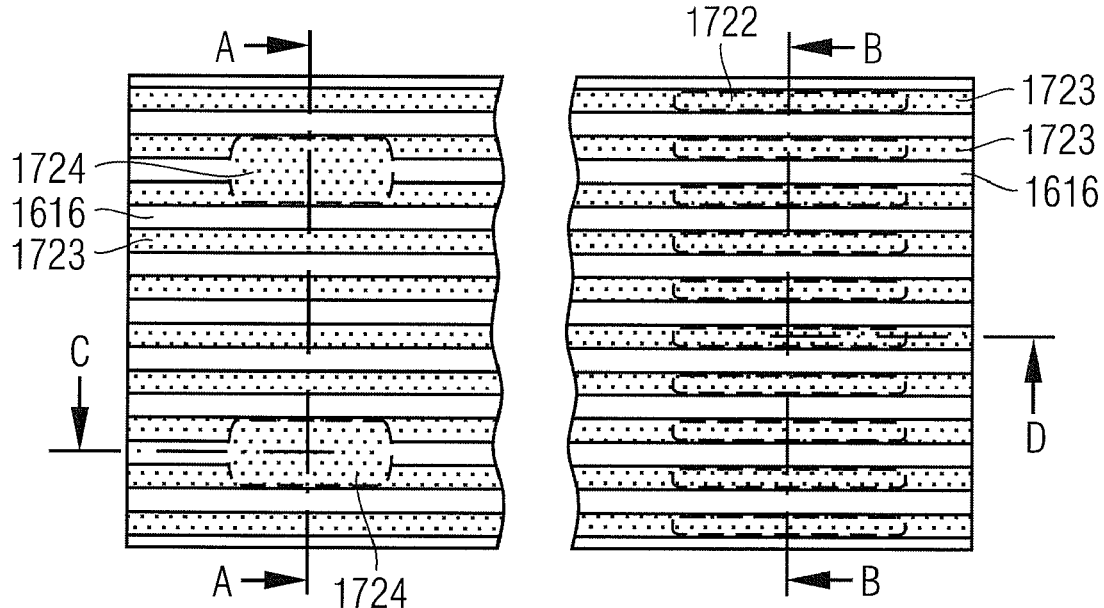

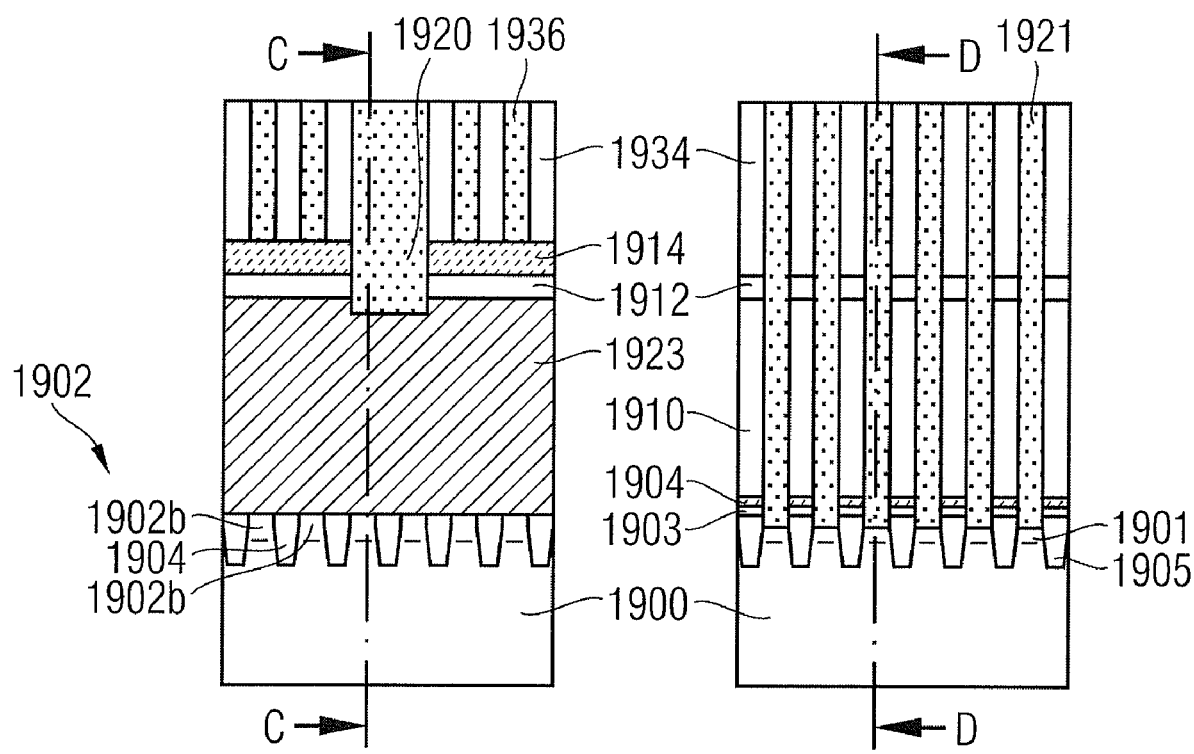

INTEGRATED CIRCUIT INCLUDING STRUCTURES ARRANGED AT DIFFERENT DENSITIES AND METHOD OF FORMING THE SAME

BACKGROUND

Integrated circuits such as memory devices usually comprise conductive lines, for example, bitlines or wordlines, which are arranged in a regular manner so as to form an array of conductive lines. With shrinking feature sizes the pitch of the conductive lines is further reduced. As a consequence, contacts which contact these conductive lines as well as, for example, the substrate are disposed at a very small pitch. Moreover, a proper alignment of the contacts to the conductive lines is sometimes troublesome to obtain.

SUMMARY

Described herein is a method of forming an integrated circuit, e.g., a memory device. According to an embodiment, the method of forming an integrated circuit may comprise forming first structures in a first portion of the integrated circuit and forming second structures, which are arranged denser than the first structures, in a second portion. The first and second structures are defined by lithography processes using photomasks; at least one of the photomasks comprises both openings in a first region for supporting the definition of the first structures and openings in a second region for supporting the definition of the second structures.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The accompanying drawings are included to provide a further understanding of exemplary embodiments and are incorporated in and constitute a part of this specification. The drawings illustrate the exemplary embodiments and together with the description serve to explain the principles. Other embodiments and many of the intended advantages will be readily appreciated, as they become better understood by reference to the following detailed description. The elements of the drawings are not necessarily to scale relative to each other. Like reference numbers designate corresponding similar parts.

FIGS. 5A to 5C illustrate exemplary masks for performing the method according to an exemplary embodiment.

FIGS. 6A to 6C illustrate further exemplary masks for performing the method according to an exemplary embodiment.

FIGS. 7A and 7B illustrate further embodiments of an exemplary mask which may be used for performing the method according to an exemplary embodiment.

FIGS. 9A and 9B illustrate a cross-sectional view of a substrate when performing the method according to a further exemplary embodiment.

FIGS. 9C to 9D show cross-sectional views of a substrate when performing the method according to yet a further exemplary embodiment.

FIGS. 14A-14F are plan views and corresponding cross-sectional views of a first and second section of a substrate which show an exemplary embodiment of a method of manufacturing the contact arrangement of FIGS. 12A-13F after providing a source line shunt.

FIGS. 15A-15F are plan views and corresponding cross-sectional views of a first and second section of a substrate which show an exemplary embodiment of a method of manufacturing the contact arrangement of FIGS. 12A-14F after providing a buried mask layer.

FIGS. 16A-16F are plan views and corresponding cross-sectional views of a first and second section of a substrate which show an exemplary embodiment of a method of manufacturing the contact arrangement of FIGS. 12A-15F after patterning the buried mask layer.

FIGS. 18A-18F are plan views and corresponding cross-sectional views of a first and second section of a substrate which show an exemplary embodiment of a method of manufacturing the contact arrangement of FIGS. 12A-17F after providing the top mask.

FIGS. 19A-19F are plan views and corresponding cross-sectional views of a first and second section of a substrate which show an exemplary embodiment of a method of manufacturing the contact arrangement of FIGS. 12A-18F after etching contact trenches.

FIGS. 20A-20F are plan views and corresponding cross-sectional views of a first and second section of a substrate which show an exemplary embodiment of a method of manufacturing the contact arrangement of FIGS. 12A-19F after providing contacts.

FIGS. 21A-21F are plan views and corresponding cross-sectional views of another embodiment of two sections of an integrated circuit.

FIGS. 22A-22F are plan views and corresponding cross-sectional views of two sections of a substrate which show an exemplary embodiment of a method of manufacturing an interconnection arrangement after providing a top mask.

FIGS. 23A-23F are plan views and corresponding cross-sectional views of two sections of an integrated circuit substrate which show an exemplary embodiment of a method of manufacturing the interconnection arrangement of FIGS. 22A-22F after providing a mold layer.

FIGS. 24A-24F are plan views and corresponding cross-sectional views of two sections of a substrate which show an exemplary embodiment of a method of manufacturing the interconnection arrangement according of FIGS. 22A-23F after etching line and contact trenches.

FIGS. 25A-25F are plan views and corresponding cross-sectional views of two sections of a substrate which show an exemplary embodiment of a method of manufacturing the interconnection arrangement of FIGS. 22A-24F after formation of interconnection lines and contacts.

FIGS. 26A-26F are plan views and corresponding cross-sectional views of a further exemplary embodiment of two sections of an integrated circuit.

DETAILED DESCRIPTION

In the following detailed description reference is made to the accompanying drawings, which form a part hereof and in which are illustrated by way of illustration specific embodiments in which the invention may be practiced. In this regard, directional terminology such as "top," "bottom," "front," "back," "leading," "trailing" etc. is used with reference to the orientation of the Figures being described. Since components of embodiments of the invention can be positioned in a number of different orientations, the directional terminology is used for purposes of illustration and is in no way limiting. Is to be understood that other embodiments may be utilized and structural or logical changes may be made without departing from the scope defined by the claims.

Figure 1:
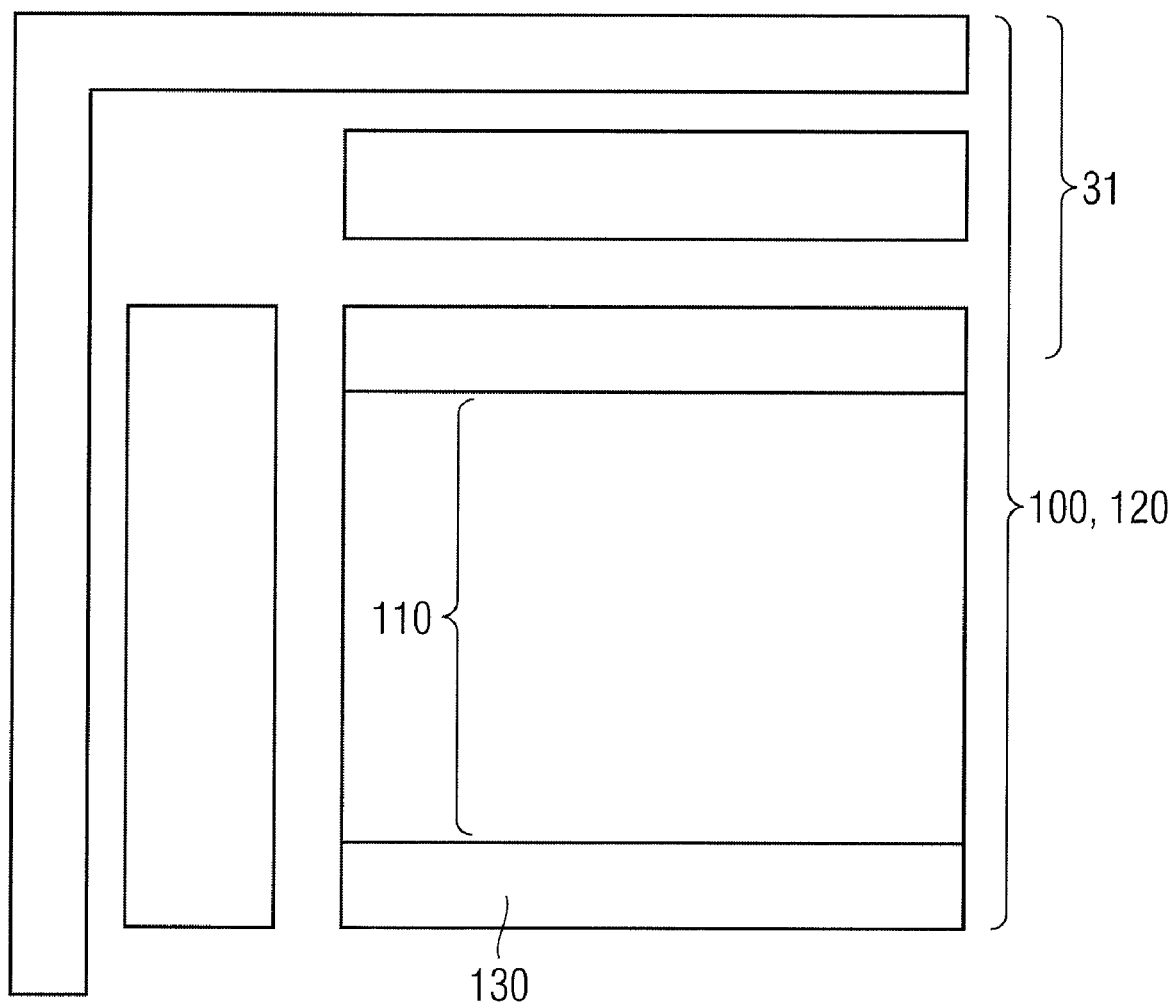
FIG. 1 shows an exemplary plan view of an integrated circuit.

FIG. 1 shows a plan view of an exemplary integrated circuit 100 according to an embodiment. The integrated circuit 100 may be implemented as a memory device 120 or may include a memory device 120. The memory device 120 may comprise a memory cell array 110 and a support portion 31. By way of example, such a memory cell array 110 may comprise individual blocks (not shown) in which the individual memory cells are arranged. Furthermore, such a memory cell array 110 may comprise a plurality of conductive lines (not shown) which are configured to program the individual memory cells, to control a read-out process, and to transmit the respective signals. For example, the information to be stored in the memory cells may be transmitted via corresponding conductive lines. Moreover, control signals which are used to activate predetermined memory cells may as well be transmitted via corresponding conductive lines. As will be shown in FIGS. 2 and 3, these conductive lines of the memory cell array 110 may form a dense pattern extending in the X- or the Y-direction. Depending on the type of memory cell array, a fan-out region 130 may be disposed adjacent to the memory cell array 110. For example, such a fan-out region 130 may be used for contacting the individual conductive lines. Usually, the conductive lines are arranged at a very small pitch in the memory cell array. Accordingly, it is attempted to relax the requirements with respect to the width of the contacts present in the fan-out region. For example, efforts are taken to obtain a reduced contact resistance and to relax the overlay requirements of contacts and conductive lines. The support portion 31 further comprises the peripheral portion and the core circuitry in which specific elements necessary for operating a memory device are disposed. For example, any kinds of wordline drivers, sense amplifiers and others may be disposed in the support portion 31. In the context of the present specification, the support portion refers to the portion of a memory device which lies outside the memory cell array. Accordingly, in the context of the present specification the term "support portion" also refers to the fan-out region 130. In the support portion, for example, transistors and other semiconductor devices may be disposed. Further in accordance with the present specification, the term "array contact" refers to dense contact arrays, wherein, for example optical proximity effects may be used to achieve contact pitches below the nominal lithographic resolution at the respective illumination wavelength. Typically, array contacts are arranged in a regular pattern, for example a grid or matrix with rows and columns. The term "isolated contact" refers to arbitrarily arranged contacts arranged at a pitch at or greater than the nominal lithographic resolution. Typically, the illumination conditions required for the formation of the array and isolated contacts differ substantially from each other.

The memory cells which are disposed in the memory cell array 110 may be implemented in an arbitrary manner. For example, they may be memory cells of a non-volatile memory such as storage transistors comprising charge storing layer such as a floating gate transistor. Nevertheless, any other kind of memory cells may be disposed in the memory cell array 110. Further examples comprise any type of non-volatile memory cells such as NROM, SONOS, SANOS, TANOS and other memory cells, and in addition, DRAM cells, MRAM cells, PCRAM cells, FeRAM cells, Floating-Body transistor memory cells and others. In other words, the memory cells may be any kind of information storing device which may be arranged in an arbitrary manner.

Figure 2:
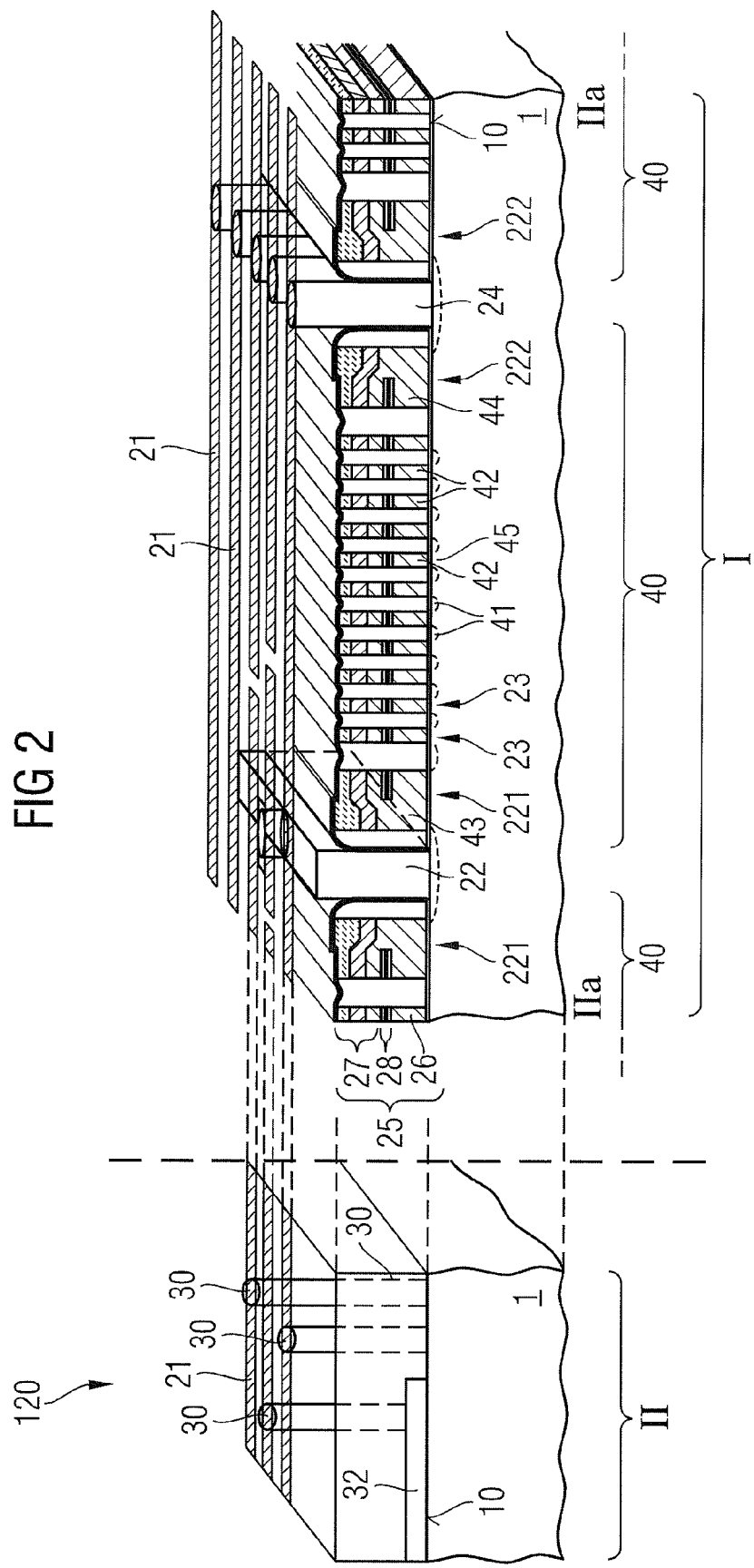
FIG. 2 shows an exemplary cross-sectional view of a memory device.

FIG. 2 illustrates schematically an exemplary cross-sectional view of a memory device 120. In the illustrated embodiment, the memory cells may be implemented as storage transistors 23. Each of the storage transistors 23 comprises doped portions 41. A channel 45 is formed between each of the doped portions 41. The conductivity of the channel 45 is controlled by a corresponding gate electrode 42. The gate electrode 42 is provided as a gate stack 25. In the illustrated embodiment, the gate stack 25 may comprise a charge storing layer 26 which may be made of polysilicon. A control gate portion 27 is insulated from the charge storing layer 26 by a barrier layer stack 28 which may comprise a silicon oxide layer, followed by a silicon nitride layer, followed by a silicon oxide layer, for example. As can be seen from FIG. 2, a plurality of storage transistors 23 are connected in series, thereby forming a so-called NAND string 40. A selected NAND string may be addressed by addressing a common source line 22, activating a corresponding first and second select transistor 221, 222 and reading the signal via a bitline contact 24. To be more specific, the first select transistor 221 may be controlled by a first select gate 43 and the second select transistor 222 by a second select gate 44. The common source line 22 may be directly adjacent to the substrate surface 10 of substrate 1. Accordingly, the common source line 22 may be in physical contact with the surface 10. The common source line 22 may be connected via a source line contact with higher metallization layers. The signal is transmitted via the bitline contact 24 to a corresponding bitline 21 which may be disposed in the M0 metallization layer, for example, the first metallization layer of the device. In addition, further interconnection lines may be disposed in this metallization layer. The right-hand portion of FIG. 2 shows an array portion I comprising the memory cells, and the left-hand portion of FIG. 2 shows a support portion II, which may be for example, the fan-out region 130 according to FIG. 1. In the support portion II, isolated contacts 30 are provided so as to connect the bitlines 21 with conductive structures in the substrate 1, for example source/drain regions of support transistors. The isolated contacts 30 may be formed so as to directly contact the substrate 1. Moreover, they may as well contact a further conductive layer 32 disposed on or over the substrate 1.

The array portion I includes an array of bitline contacts 24. According to other embodiments, individual source contacts may replace the common source line 22. As can further be taken from FIG. 2, the bitlines 21 are connected with the bitline contacts 24 as well as with the isolated contacts 30. According to an embodiment of the invention, the bitline contacts 24 as well as the isolated contacts 30 may be disposed in a self-aligned manner such that the positions of the array and isolated contacts are linked to each other and a displacement of the isolated contacts results in an equivalent displacement of the array contacts and vice versa. Although a NAND-type memory is illustrated as an example, it is clearly to be understood, that embodiments of the invention relate to memory devices being implemented in any arbitrary architecture, for example a NOR-type sensing scheme.

Figure 3:
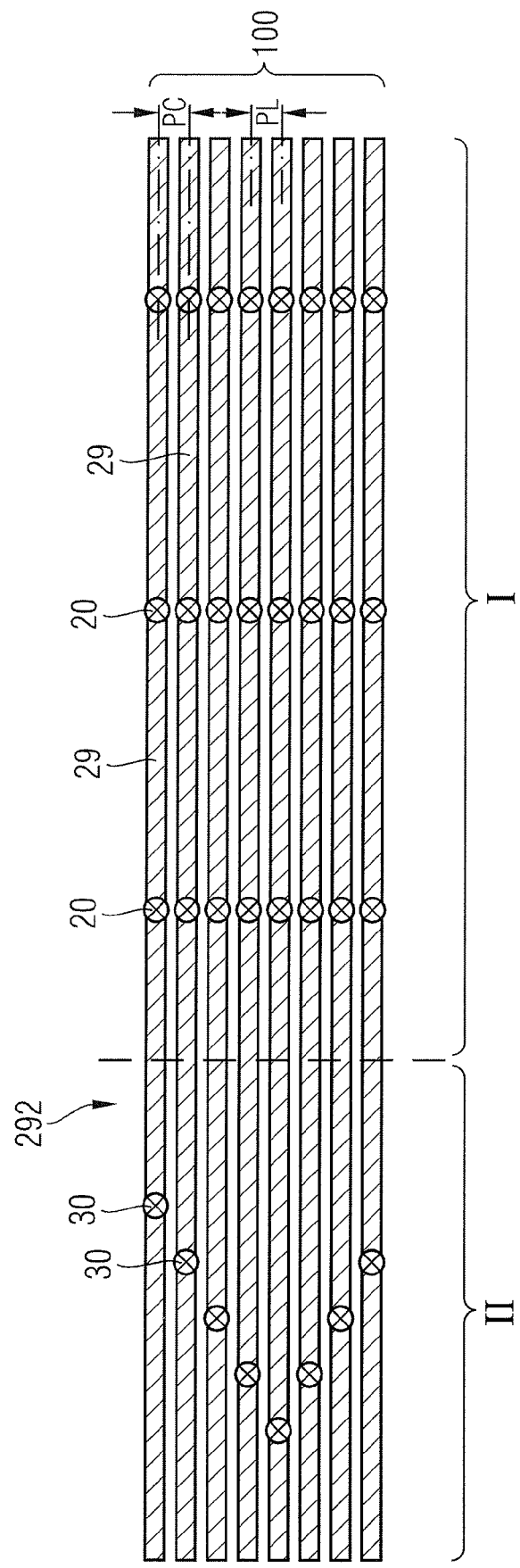
FIG. 3 shows an exemplary plan view of an array of conductive lines including contacts.

FIG. 3 shows a plan view of an integrated circuit 100 according to an embodiment. As is shown, the integrated circuit 100 comprises array contacts 20 which are in electrical contact with conductive structures in or above a semiconductor carrier and isolated contacts 30 which are in electrical contact with further conductive structures in or above the semiconductor carrier, wherein the array contacts 20 and the isolated contacts 30 are disposed in a self-aligned manner to each other. As is used in the context of the present specification, the terms "carrier," "substrate" or "semiconductor substrate" may include any semiconductor-based structure that has a semiconductor surface. These terms are to be understood to include silicon, silicon-on-insulator (SOI), silicon-on-sapphire (SOS), doped and undoped semiconductors, epitaxial layers of silicon supported by a base semiconductor, and other semiconductor conductor structures. The semiconductor need not be silicon-based. The semiconductor could as well be silicon-germanium, germanium, or gallium arsenide. Though explained in detail in context with array and isolated contacts, the embodiments may refer further to the formation of transistors, sensors, trenches or other structures with dimensions at or below the nominal lithographic resolution limit and arranged at different densities in different portions of an integrated circuit.

According to FIG. 3, the array contacts 20 are in electrical contact with conductive structures in or above the semiconductor carrier. The array contacts 20 may be disposed in a dense regular pattern, for example a matrix with rows and columns, and they may form part of the array portion I of the integrated circuit 100. For example, the array contacts 20 may be disposed at a constant pitch PC and they may have a constant distance from each other. The pitch PC of the array contacts 20 may correspond to the minimal structural feature size which may be obtained by the technology used. The pitch PC of the array contacts 20 may also be larger than the minimal structural feature size F which may be obtained by the technology used. The isolated contacts 30 may be disposed in an arbitrary manner to each other so as to enable a simple production process. For example, the isolated contacts 30 may have a mutual distance which is significantly larger than the minimum distance between the array contacts 20. The isolated contacts 30 may have a distance which is larger than the minimal structural feature size which may be obtained by the technology employed. The isolated contacts 30 may be disposed in the support portion II or in the array portion I. As will be explained hereinafter, the array contacts 20 and the isolated contacts 30 are disposed in a self-aligned manner to each other. For example, by performing common (shared) processing steps, the positions of the array contacts 20 and the isolated contacts 30 are in a predetermined relationship. For example, by performing photolithographic processes employing a photomask which includes a pattern for defining the array contacts 20 as well as a pattern for defining the isolated contacts 30, this predetermined relationship may be obtained. The size of the array contacts 20 and the isolated contacts 30 may be equal or different from each other. For example, taking into account the relaxed size relationships in the support portion II, which includes, for example, a fan-out region assigned to the array portion I, the isolated contacts 30 may have a length and a width which is larger than that of the array contacts 20. The integrated circuit 120 may be any kind of integrated circuit, for example a sensor or a logic circuit. The integrated circuit 100 may further comprise an interconnection 292 which is configured to connect the array contacts 20 and the isolated contacts 30. By way of example, the interconnection 292 may comprise conductive lines 29 which may be bitlines, for example. Since the array contacts 20 and the isolated contacts 30 are disposed in a self-aligned manner to each other, the overlay requirements concerning the alignment of the conductive lines 29 and the respective contacts 20, 30 become relaxed. Accordingly, due to the alignment of the isolated contacts 30 to the array contacts 20, the conductive lines 29 are aligned to the isolated contacts 30 if they are arranged in alignment with the array contacts 20 and vice versa. By way of example, a pitch PL of the interconnection lines 29 may be equal to the pitch PC of the array contacts 20. The integrated circuit 100 may be implemented as the memory device 120 shown in FIG. 2, wherein the conductive lines 29 correspond to the bitlines 21 and the array contacts 20 correspond to the bitline contacts 24.

The integrated circuit may be formed by forming array contacts and forming isolated contacts, wherein the array contacts and the isolated contacts are defined by lithographic processes using at least, a first and a second photomask. At least one of the first and the second photomasks is configured to transfer a pattern comprising openings for supporting the definition of the array contacts and openings for supporting the definition of the isolated contacts. Accordingly, since at least one of the first and the second photomasks defines both openings for defining the array contacts and openings for defining the isolated contacts, the isolated contacts may be formed self-aligned with respect to the array contacts and vice versa. By way of example, the array contacts and the isolated contacts may be formed at positions, which correspond to the pattern openings transferred by the first and the second photomasks. Accordingly, both types of contacts may be formed by a superposition of the first and the second photomasks.

Figure 4:
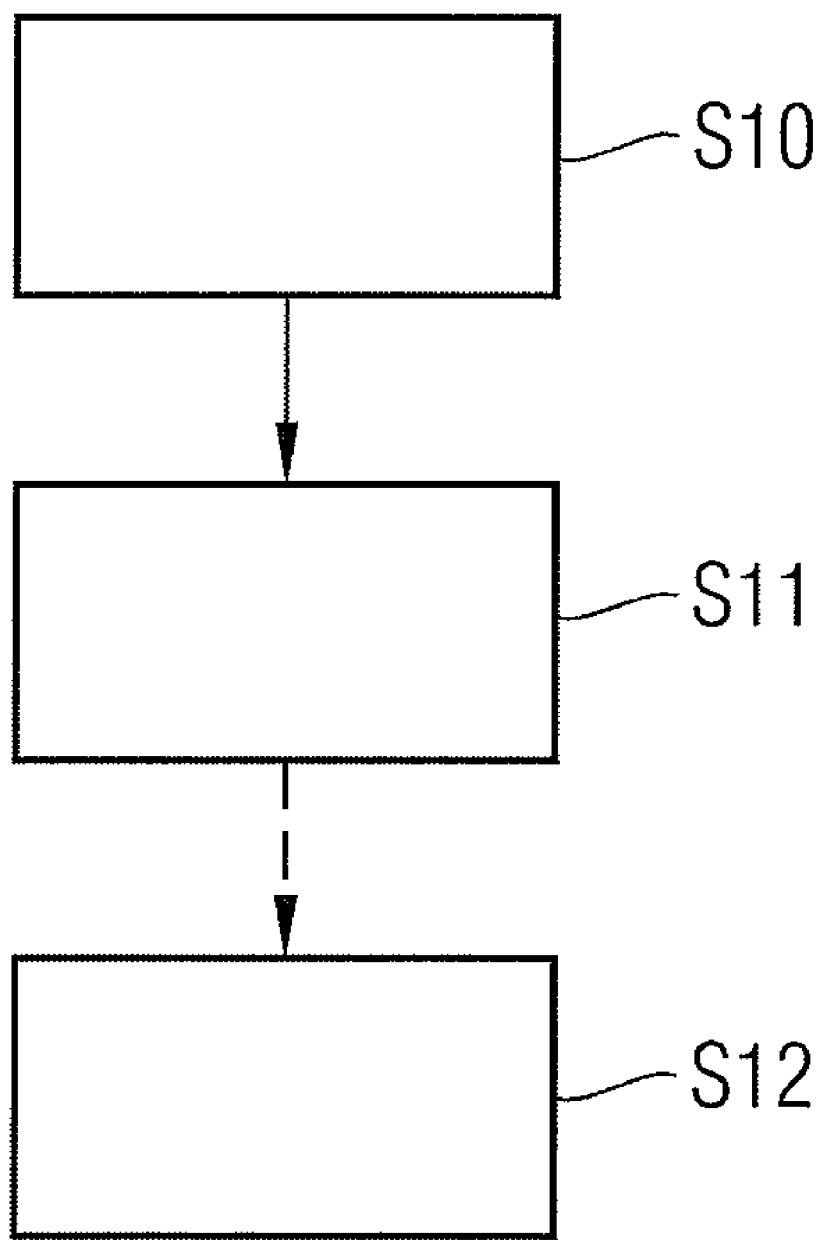
FIG. 4 shows an exemplary flowchart illustrating a method according to an exemplary embodiment.

As illustrated in the schematic flow-chart shown in FIG. 4, in a first photolithographic exposure a first photomask (S10) and in a second photolithographic exposure (S11) a second photomask may be used. The array contacts as well as the isolated contacts are formed by a "superposition" of the two photomasks. In each of the two photolithographic exposures the array contacts as well as the isolated contacts are processed by common (shared) lithographic processes. For example, each of the photolithographic exposure methods may pattern a corresponding hardmask layer, wherein the hardmask layers are disposed above each other.

Further, an interconnection for connecting the array contacts and the isolated contacts (S12) may be provided, for example, after forming the array and isolated contacts. The interconnection 292 may comprise the conductive lines 29 which have been explained above with reference to FIG. 3.

According to a further embodiment, densely arranged array contacts and less densely arranged isolated contacts may be formed in direct electrical contact with a semiconductor carrier, respectively, so that the array contacts and the isolated contacts are self-aligned to each other. For example, by performing photolithographic processes using the same photomasks for patterning of both the array contacts and the isolated contacts, the array contacts and the isolated contacts may be self-aligned to each other.

In the following, embodiments of the invention will be explained by describing photomasks which may be employed for defining the corresponding patterns. Each photomask may be of any kind of photomask which may be usually employed. Although a process using a positive photoresist is explained, it is clearly to be understood that negative resists may be employed as well as using a correspondingly modified photomask. Moreover, the two photolithographic exposure methods may be used for correspondingly patterning different hard mask layers. According to another embodiment, the succession or sequence of different exposure methods using different photomasks may as well be used for exposing a single photoresist layer. Moreover, the different exposure methods using different photomasks may be performed in arbitrary sequence or succession so as to form a pattern in a pattern layer. The pattern results from a "superposition" of the patterns of several photomasks used for the photolithographic processes.

In the following figures, several patterns will be discussed which may be transferred by corresponding photomasks. According to a simple implementation, such a photomask may be a photomask comprising transparent portions and opaque portions. Accordingly, the pattern openings are transferred in accordance with mask openings, for example transparent portions of the photomask. The remaining portions of the patterns, for example the opaque portions may correspond to unexposed portions of the photoresist material. For example, the opaque portions may be made of an opaque material such as chromium, which is present at the corresponding positions of the photomask. In case, the pattern is to be transferred into a negative photoresist material, the positions of transparent and opaque portions are to be interchanged. According to other embodiments, the photomasks may be half tone masks, tritone masks, halftone phase shift masks or others. Furthermore, they may comprise non-printing sub-resolution assist features. Accordingly, the exact construction of the respective photomasks may be achieved in different ways. According to other embodiments, the photomasks are reflective masks comprising an absorber disposed on, for example, a multi-layer mirror. In the following, the patterns which are transferred by the respective photomasks will be discussed. As is clearly to be understood, the embodiments of the invention comprise the use of any photomasks which may transfer the respective patterns.

FIG. 5A shows schematically a first pattern 51 which may be transferred by a first photomask that may be used for performing the method according to an embodiment. The first pattern 51 may comprise first pattern openings 521 in an array region 511 and first pattern openings 522 in a support region 512, wherein the pattern openings 521, 522 correspond to exposed portions of a positive photoresist. The remaining sections of the first pattern 51 may correspond to non-exposed portions of the positive photoresist. Moreover, a similar pattern could be formed by exposing a negative photoresist by interchanging the exposed and non-exposed portions, respectively. The first pattern 51 comprises an array region 511 comprising the pattern openings 521 as well as a support region 512 comprising further pattern openings 522. The pattern openings 521, 522 are disposed in a dense array, wherein the pattern openings 521 in the array region 511 are disposed in the same manner, for example aligned to the same grid, as the pattern openings 522 in the support region 512. Accordingly, the portion of the first pattern 51 which is defined in the array region 511 assigned to an array portion of an integrated circuit comprising the array contacts corresponds to the portion of the first pattern 51 which is formed in the support region corresponding to a support portion comprising the isolated contacts. After exposing a photoresist according to the first pattern 51, a second photolithographic method will be performed. The detailed description of the respective patterning methods according to an embodiment will be described hereinafter with reference to FIG. 8.

As shown in FIG. 5B, a second pattern 53 transferred by a second photomask comprises an array pattern region 531 corresponding to the array portion I of the first pattern 51 and including an array opening 541 as well as an isolated contact pattern region 532 corresponding to the isolated contact region 512 of the first pattern 51 and including second pattern openings 542. The array opening 541 is designed in such a manner that substantially the whole array portion is exposed. In the isolated contact pattern region 532, the second pattern openings 542 open a corresponding resist material only at isolated predetermined positions. Accordingly, by determining the position of the second photomask pattern openings 542, the positions of the isolated contacts to be formed may be determined.

FIG. 5C shows the result of the superposition of the two patterns 51, 53. In the array portion I a dense array of array contacts 543 is formed. In the support portion II, isolated support contacts 544 are defined. The array contacts 543 have a length l and a width d which are substantially equal to the length l and the width d of the isolated support contacts 544, respectively.

In the context of the present specification, the term "superposition" means that the contacts are provided exclusively in those areas which are exposed both by a first photolithographic step using the first photomask and a second photolithographic step using the second photomask.

FIG. 6A to 6D refer to another arrangement of photomasks which may be used for defining array contacts as well as isolated contacts by common (shared) processing steps. A first pattern 55 transferred by a first photomask may comprise first pattern openings 561 in an array region 551 and further first pattern openings 562 in a support region 552, forming continuous lines or line segments. Each of the lines has a width d. Accordingly, the first pattern 55 comprises a lines/spaces pattern. The first pattern openings 561 in the array region 551 and the first pattern openings 562 in the support region 552 are formed in the same manner. Accordingly, the first pattern 55 comprises a pattern of dense lines, wherein no difference may be seen between the isolated contact region (support region) 552 and the array region 551.

Figure 6B:
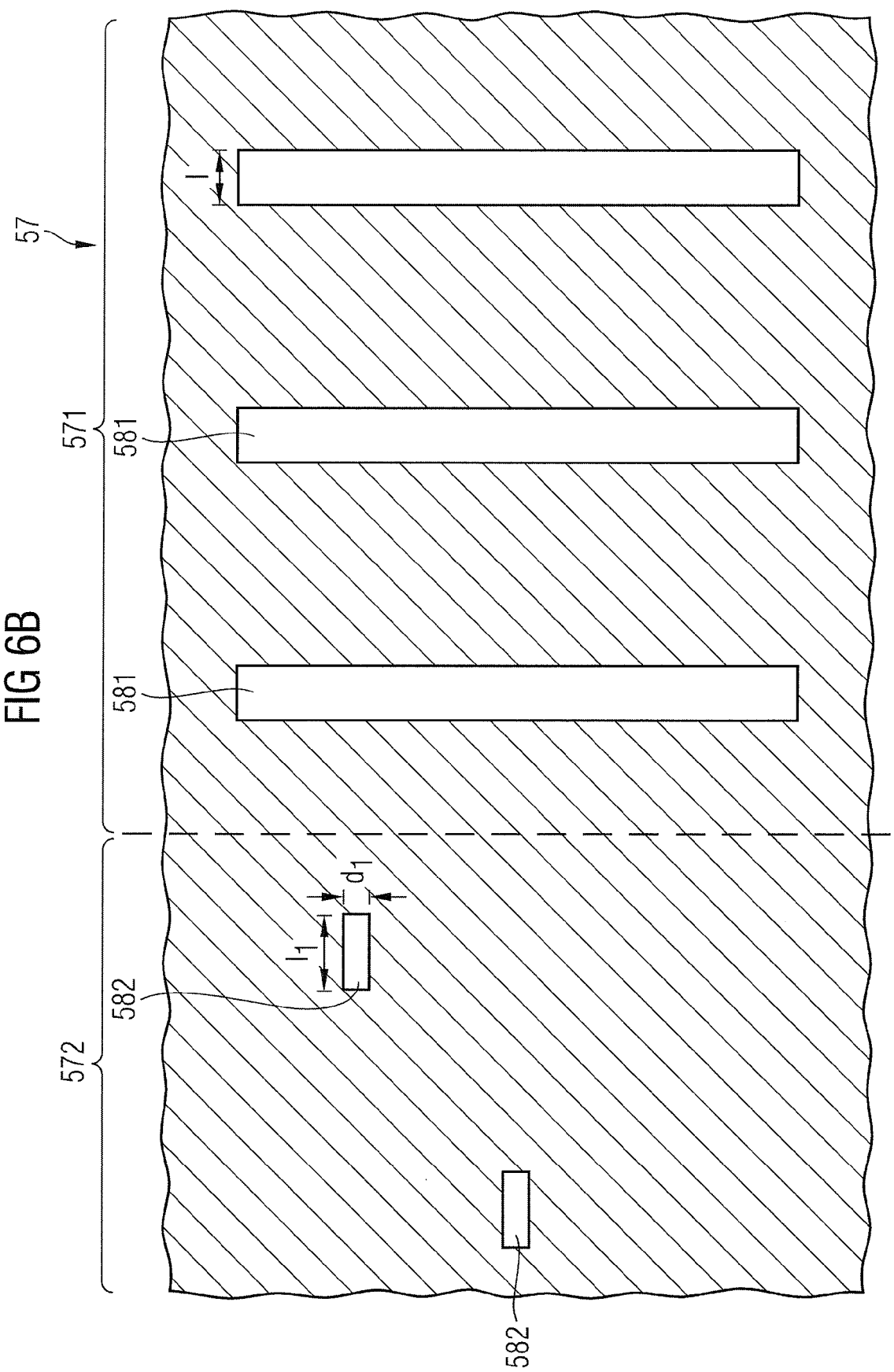

FIG. 6B shows an exemplary plan view of a second pattern 57 which may be transferred by a second photomask. The second pattern 57 comprises an array region 571 including second pattern openings 581 for the array portion which are formed as lines extending in a direction which intersects, for example perpendicularly the direction of the lines 561, 562. The width of the second pattern openings 581 corresponds to, for example, the length l of the array contacts to be formed. The distance between the second pattern openings 581 corresponds to the distance between the columns of the array contacts to be formed in the array portion. Moreover, the second pattern 57 comprises an isolated contact region 572 including isolated pattern openings 582 for defining the isolated contacts to be formed in the support portion. The isolated pattern openings 582 may have an arbitrary shape, for example, a rectangular shape. The length $l_1$ of the isolated pattern openings 582 may be larger than the length l of the second pattern openings 581. Moreover, the width $d_1$ of the isolated pattern openings 582 may be larger than the linewidth d of the first pattern openings 561.

FIG. 6C shows a plan view of a contact pattern which may be obtained by the superposition of the patterns 55, 57 shown in FIGS. 6A and 6B. As can be seen, the pattern of contacts comprises an array portion I in which the array contacts 583 are disposed in a dense array of contacts. The array contacts 583 have a length l and a width d which are determined by the widths of the first and second pattern openings 561, 581 of the patterns 55 and 57. The isolated contacts 584 may have a width d and a length l which may be different from the length l. The isolated contacts 584 are disposed at predetermined positions corresponding to the positions of the pattern openings 582 as shown in FIG. 6B.

Figure 7A:
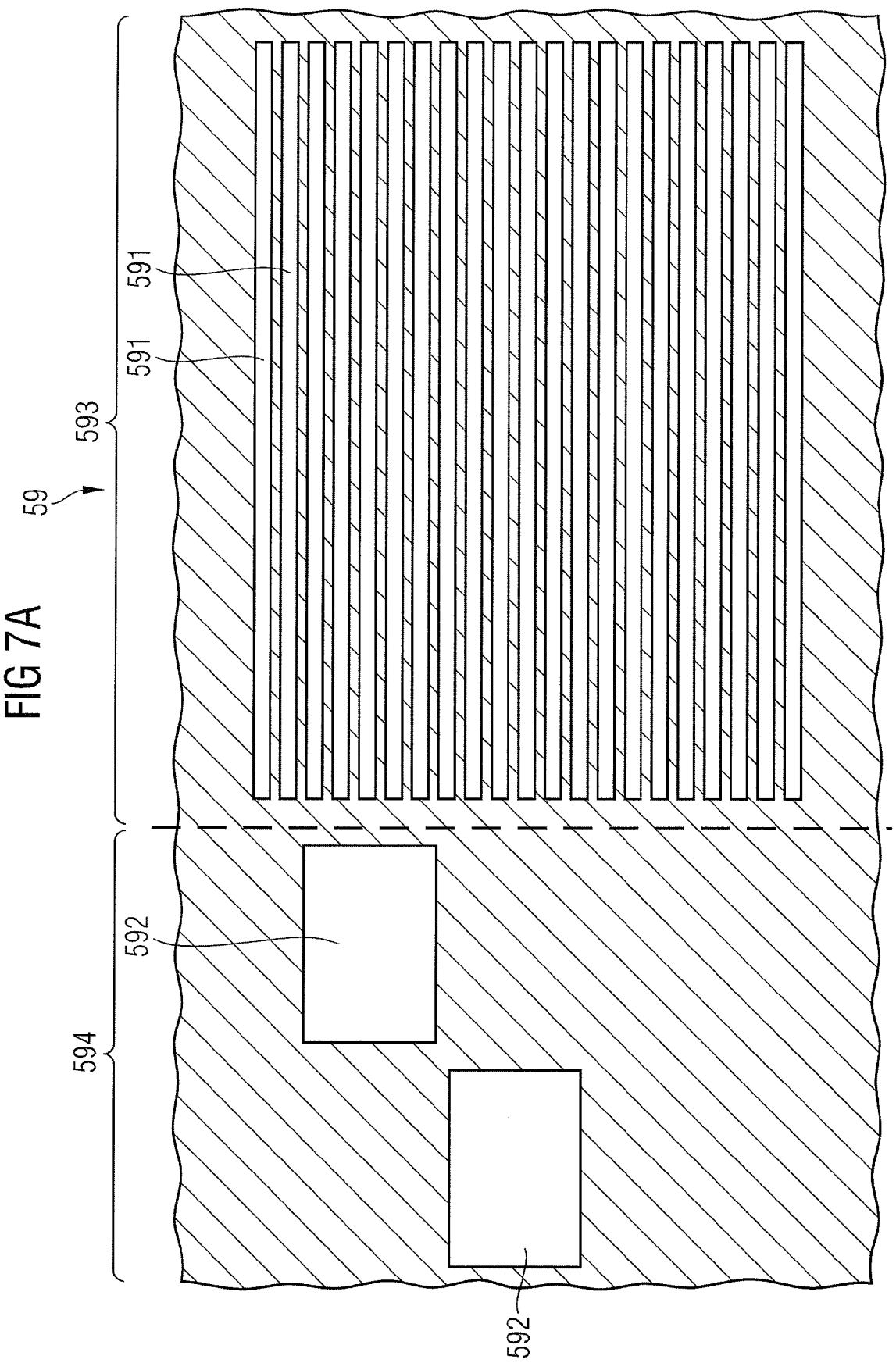

According to a further modification of the set of patterns shown in FIGS. 6A to 6B, a first pattern 59 as is shown in FIG. 7A may be transferred by a corresponding photomask. As can be seen, the first pattern 59 comprises an array region 593 including pattern openings 591 which are disposed in a regular lines/spaces pattern similar to the pattern which is shown on the right hand side of FIG. 6A. Moreover, the first pattern 59 further comprises an isolated contact region 594 including isolated pattern openings 592 which have an arbitrary shape. For example, the isolated pattern openings 592 may have a rectangular shape, an oval shape or a rectangular shape with rounded corners. The second photomask which is used for defining the contact pattern of the integrated circuit may comprise a pattern that is similar to the pattern 57 shown in FIG. 6B and comprises an array region 571 including pattern openings 581 which are formed as lines as well as an isolated contact region 572 including isolated pattern openings 582. Due to the large size of the pattern openings 592, the illumination conditions for performing a photolithographic process may be easier to match to the different structures 591 and 592.

Referring to FIG. 7B, according to a further modification of the pattern 55 shown in FIG. 6A, a lines/spaces pattern 60 may be transferred, wherein in the isolated contact region 604 first pattern openings 602 are locally widened up so as to obtain a larger width d of the resulting contacts. Accordingly, a first exposure step is performed to transfer the line/spaces pattern 60 as a first pattern in a resist material. The lines/spaces pattern 60 comprises an isolated contact region 604 including first pattern openings 601 for the support portion, wherein the first pattern openings 601 are disposed in a regular lines/spaces pattern. In the isolated contact region 604, the first pattern openings 602 for defining the isolated contacts are widened at predetermined positions. The first pattern 60 further comprises a regular lines/spaces pattern in an array region 603. Using a photomask for transferring the first pattern 60 as shown in FIG. 7B, the first photo lithographic step is performed, followed by a second photolithographic step using the mask comprising the pattern shown in FIG. 6B, for example. For example, when using the pattern 57 shown in FIG. 6B, the width d1 of the openings 582 may be larger than the width of the lines d so as to obtain an increased size of the isolated contact. As a result, a reduced contact resistance of the contacts to be formed may be obtained.

In the foregoing, several sets of patterns transferred by corresponding photomasks have been described which enable a simultaneous processing of isolated contacts and array contacts. Due to the special construction of the patterns which have been described with reference to FIGS. 5 to 7, respectively, it becomes possible to simultaneously process array contacts, which are formed in a dense array, as well as isolated contacts, which are disposed at isolated positions. Conventionally, different illumination conditions and photolithographic conditions have been necessary in order to process such array contacts and isolated contacts. Nevertheless, according to embodiments, it becomes possible to form array contacts as well as isolated contacts by common or contemporaneous processing steps.

As has been explained above, the common lithographic processes for simultaneously defining array contacts and isolated contacts may comprise several photolithographic exposure methods using several photomasks. Accordingly, the array contacts as well as the isolated contacts are formed by a "superposition" of the patterns transferred by the several photomasks. This principle may be implemented in various manners. By way of example, the several photomasks may be used for exposing a single photoresist material. Moreover, the several photomasks may be used for patterning several hardmask layers which are disposed above each other.

Figure 8A:
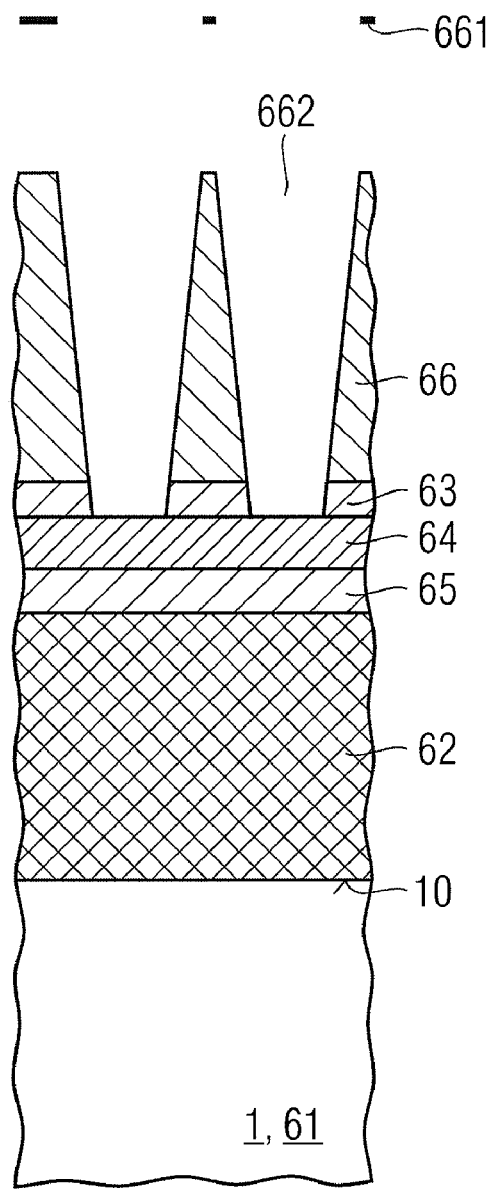
FIGS. 8A to 8D illustrate a cross-sectional view of a substrate when performing the method according to an exemplary embodiment.
Figure 8B:
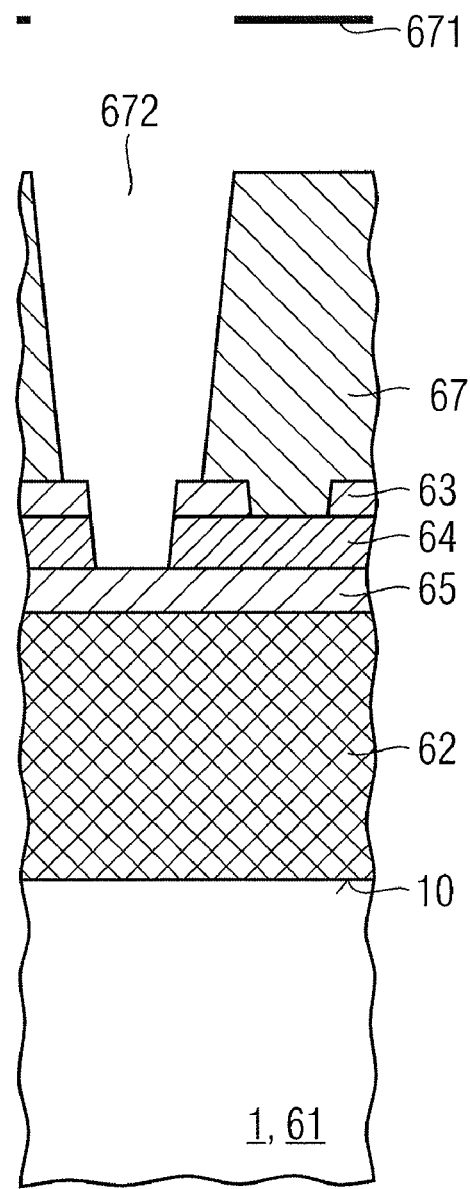
Figure 8C:
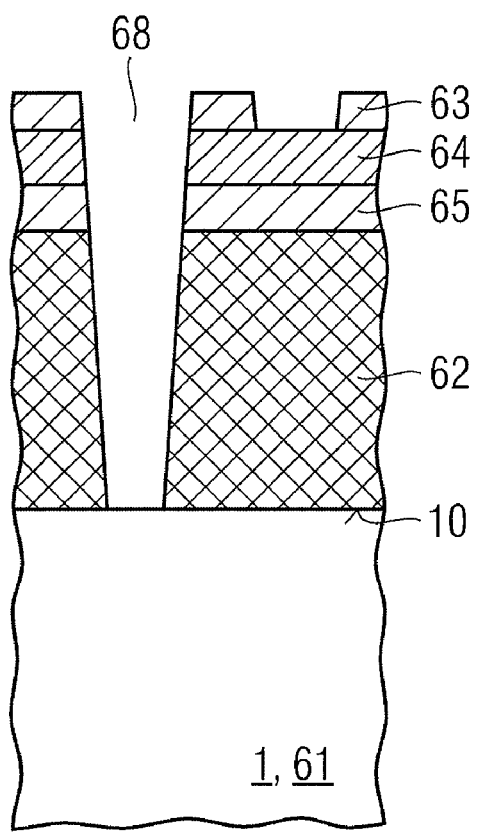

FIGS. 8A to 8C show an exemplary processing sequence for defining contacts using a hardmask layer stack. As shown in FIG. 8A, on the surface 10 of a semiconductor substrate 1 or a semiconductor carrier 61, an insulating layer 62 may be disposed. As is clearly to be understood, several metallization layers may be formed so as to extend across the insulating layer 62 and in the semiconductor substrate 1. Moreover device structures may be formed in the insulating layer 62. Instead of the insulating layer, a suitable carrier layer which may, for example, be made of a conductive or a semiconductor material may be provided. On top of the insulating material 62, a hardmask layer stack may be disposed. In the present embodiment three hardmask layers are shown. Nevertheless as is clearly to be understood, any number of hardmask layers may be present. For example, the hardmask layer stack may comprise two or more than three hardmask layers. The respective materials of the hardmask layers may be arbitrarily chosen. Examples of the materials of the hardmask layers comprise for example, silicon oxide, for example $SiO_2$, silicon nitride, for example $Si_3N_4$, amorphous silicon, polysilicon, carbon, for example a carbon layer which may be made of elemental carbon which is not contained in a chemical compound, SiON and others. The thicknesses of the respective layers may as well be arbitrarily chosen in accordance of the process requirements. For example, the layer 62 may have a thickness of approximately 300 to 1000 nm. On top of the insulating layer 62, a third hardmask layer 65 may be disposed. In the present embodiment, the layer 65 may be made of carbon and may have a thickness of several 100 nanometers, for example 200 to 400 nm. A second hardmask layer 64 which may be made of amorphous silicon may be disposed on top of the third hardmask layer 65. For example, the thickness of the second hardmask layer 64 may be more than 20 nm and less than 50 nm. On top of the second hardmask layer 64, a first hardmask layer 63 which may be made of SiON may be disposed. For example, the thickness of the first hardmask layer 63 may be more than 20 nm and less than 50 nm. Moreover, further hardmask layers may be disposed on top of the first hardmask layer. Furthermore, the third hardmask layer 65 may as well be omitted. In the embodiment shown in FIG. 8A, the first hardmask layer 63 is deposited on the second hardmask layer 64 which has not been patterned.

As shown in FIG. 8A, a suitable photoresist layer 66 may be disposed above the first hardmask layer 63. The photoresist layer 66 is patterned using a first photomask 661 to form openings in the photoresist material 66. The first photomask 661 may, for example, be configured to transfer any of the patterns which have been shown in any of FIGS. 5A, 5B, 6A, 6B, 7A and 7B. Moreover, the first photomask 661 may as well transfer any other suitable pattern. The first hardmask layer 63 is etched at the positions of the first pattern openings 662. Thereafter, the first photoresist material 66 is removed and a second photoresist material 67 is applied.

According to FIG. 8B, a further exposure step is performed using a second photomask 671. The second photomask 671 may, for example, be configured to transfer any of the patterns which have been shown in any of FIGS. 5A, 5B, 6A, 6B, 7A and 7B. Moreover, the second photomask 671 may as well transfer any other suitable pattern. Due to this exposure step, second pattern openings 672 are formed in the second photoresist material 67. The second hardmask layer 64 is etched at the positions at which the first and the second openings 662, 672 have been present. Accordingly, the second hardmask layer 64 is patterned after the first hard mask layer 63 has been patterned. Moreover, the second hardmask layer 64 is opened only at those positions at which openings are formed in accordance with the pattern transferred by the first hardmask layer 63.

Taking the patterned hardmask layers 64, 63 as an etching mask, a further etching step is performed so as to define openings 68 as illustrated in FIG. 8C. By way of example, first, the third hardmask layer 65 is patterned and the patterned third hardmask layer 65 is used as an etching mask for etching the insulating material 62. During the etching steps, parts of the hardmask layers 63, 64 and 65 may be consumed. The opening 68 may extend to the substrate surface 10. Nevertheless, any kind of stopping layer may be disposed above the substrate surface 10 so that the openings 68 may extend only to a predetermined depth. For example, any kind of conductive layer or conductive lines may be present above the substrate surface 10, and the opening 68 may extend to this conductive layer or conductive lines.

Figure 8D:
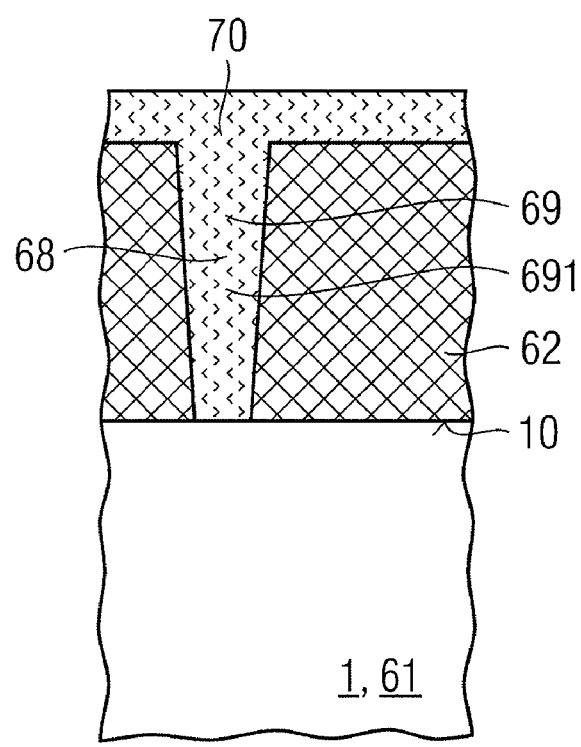

Referring to FIG. 8D, after forming the corresponding openings, optionally, the remaining portions of the hardmask layers may be removed, followed by the deposition of a suitable conductive filling. Nevertheless, as is clearly to be understood, the hardmask layers may as well be removed after providing the conductive filling for defining the contacts. The conductive filling may comprise any arbitrary conductive material, comprising metals, metal compounds, semiconductor material, semiconductor compounds and others. Conductive lines may as well be formed, for example, from the same conductive material. By way of example, a conductive layer may be deposited so as to fill the openings 68, followed by a step of patterning the conductive layer so as to form conductive lines. Nevertheless, the conductive lines and the filling of the contact openings may as well be provided by separate processing steps. Usually, the conductive lines have to be aligned with respect to the contacts. According to an embodiment, due to the self-alignment of array contacts and isolated contacts, if the conductive lines are aligned to the array contacts, they will inherently be aligned with respect to the isolated contacts and vice versa. FIG. 8D shows a cross-sectional view of a substrate 1 after providing a conductive material 69 so as to form an array or an isolated contact 691 as well as a corresponding conductive line 70.

The method of forming an integrated circuit according to exemplary embodiments may be implemented in any arbitrary manner. By way of example, a combination of two photomasks as has been explained above may as well be used for patterning a single photoresist layer as will be explained in the following.

As is shown in FIG. 9A, on the surface 10 of a semiconductor substrate 1 or a carrier 61, an insulating layer 62 may be provided. The layer 62 may be made of any material as has been explained above and may further comprise patterned structures, conductive lines and others as has also been explained above. Optionally, a hard mask layer 64 may be disposed over the insulating layer 62. Nevertheless, the hardmask layer 64 may as well be omitted. A photoresist material 66 is disposed above the insulating layer 62. Using a first photomask 661 which may transfer any of the first or second patterns as has been explained above, an exposure step is performed. The first photomask 661 may as well transfer another suitable pattern. During this exposure step, the illumination dose is adjusted so that the photoresist material 66 only becomes semi-exposed. Accordingly, the illumination dose which is imposed during this exposure step is not sufficient to entirely expose the photoresist material 66 so that it becomes soluble in a suitable developer which may be employed during a subsequent developing step. The semi-exposed portions 663a, 663b are formed in accordance with the pattern to be transferred by the first photomask 661.

Thereafter, as is shown in FIG. 9B, a second exposure step is performed using the second photomask 671 that may as well be configured to transfer any of the patterns which have been shown in any of FIGS. 5A, 5B, 6A, 6B, 7A and 7B. Moreover, the second photomask 671 may as well transfer any other suitable pattern. Also the exposure dose during this exposure step is adjusted so that the photoresist layer 66 only becomes semi-exposed. Accordingly, due to the addition of the exposure doses irradiated during the first and the second exposure steps, the photoresist material becomes soluble at those positions at which pattern openings are present both in the first and the second patterns. Hence, after a suitable developing step, a photoresist opening 664 is formed, whereas semi-exposed portions 663b remain in the photoresist material 66. By way of example, the hard mask layer 64 may be patterned taking the patterned photoresist mask as an etching mask. Nevertheless, also the patterned photoresist mask 66 itself may be taken as an etching mask for etching an opening in the insulating layer 62 in a similar manner as has been explained above with reference to FIGS. 8A to 8D.

According to a further embodiment, a first hardmask layer may be patterned using a first photomask, and thereafter, a second hardmask layer is disposed above the patterned first hardmask layer. Then, the second hardmask layer is patterned using a second photomask.

For example, as is shown in FIG. 9C, a first hardmask layer 63 may be provided over an insulating layer 62. The insulating layer 62 as well as the substrate 1 or the carrier 61 may be similar to the insulating layer and the substrate as has been described above. Using a first photomask 661, a photoresist material 66 which is disposed above the first hard mask layer 63 is patterned so as to form first openings 662. The first photomask 661 may, for example, be configured to transfer any of the patterns which have been shown in any of FIGS. 5A, 5B, 6A, 6B, 7A and 7B. Moreover, the first photomask 661 may as well transfer any other suitable pattern. The first hardmask layer 63 is etched taking the patterned photoresist layer 66 as an etching mask.

Figure 10:
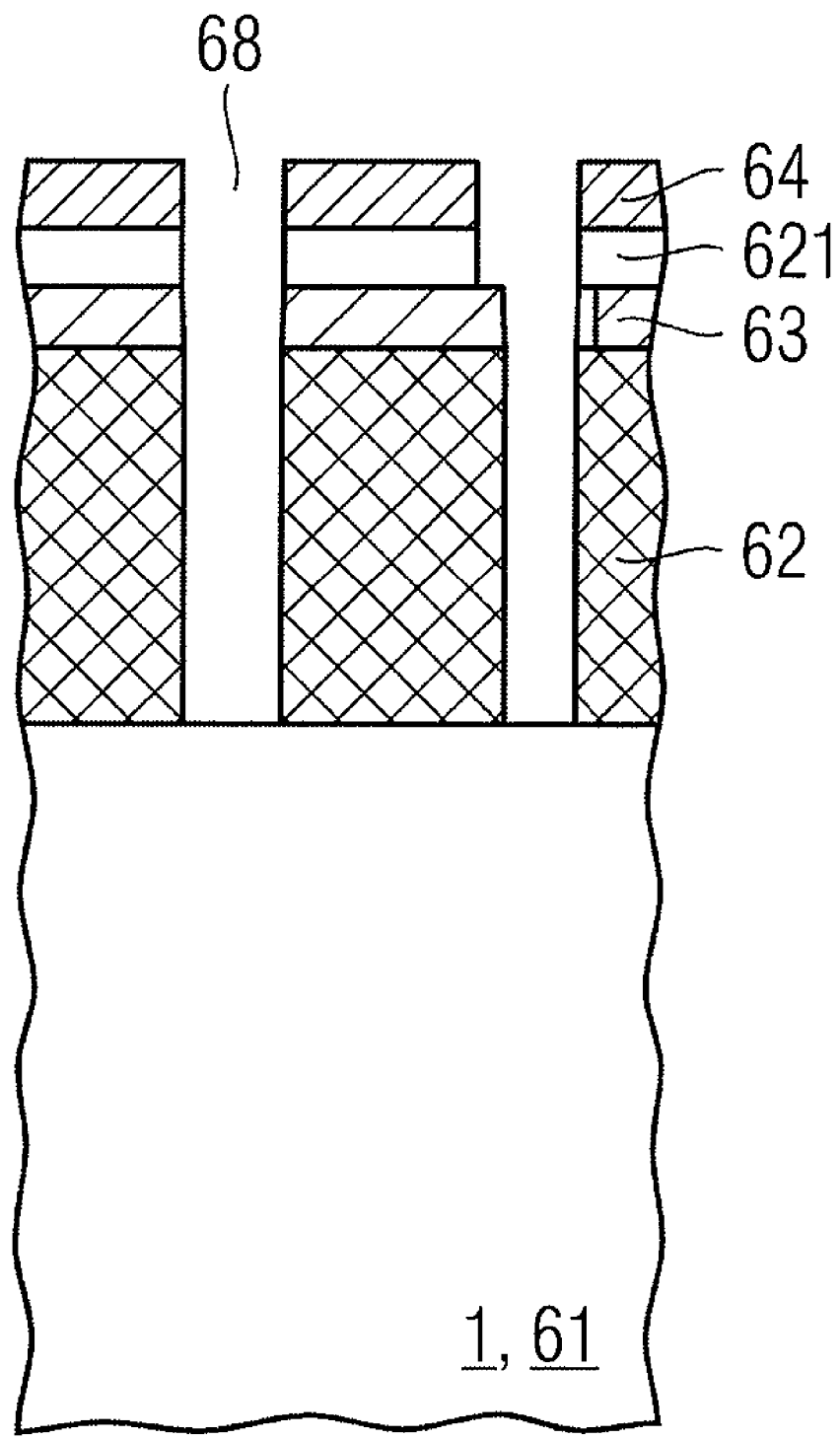
FIG. 10 is a cross-sectional view of a substrate with two patterned hardmask layers resulting from the method illustrated in FIGS. 9A-9D.

Referring to FIG. 9D, the remaining portions of the first photoresist layer 66 are removed. Then, first, a suitable planarizing layer 621 may be provided so as to fill the openings formed in the first hardmask layer 63. Thereafter, a second hardmask layer 64 is provided. According to another embodiment, the second hardmask layer 64 may be disposed directly in contact with the first hardmask layer 63. Optionally, planarizing steps may be performed. Then, a second photoresist material 67 is provided above the second hardmask layer 64. Using a second photomask 671, a further exposure step is performed. The second photomask 671 may, for example, be configured to transfer any of the patterns which have been shown in any of FIGS. 5A, 5B, 6A, 6B, 7A and 7B. The pattern of the second photomask 671 may transfer any other suitable pattern. Due to this exposure step, openings 672 are formed in the second photoresist material 67. Taking the patterned photoresist material 67 as an etching mask, the openings 672 are transferred into the second hardmask layer 64 as shown in FIG. 9D. Referring to FIG. 10 after, optionally, the remaining portions of the second photoresist material 67 may be removed and a further etching step is performed, for optionally etching the planarizing layer 621 and the insulating layer, whereas the first hardmask layer 63 is not substantially etched. If no planarizing layer 621 is present, etching the layer 64 must not substantially etch the layer 63. Hence, in a following step of etching the insulating layer 62, a superposition of the patterns produced in the first and the second hardmask layers 63, 64 is taken as an etching mask. As a result, openings 68 are formed in the insulating layer 62. The integrated circuit may be further processed in the same manner as has been explained above with reference to FIGS. 8A to 8D.

Figure 11:
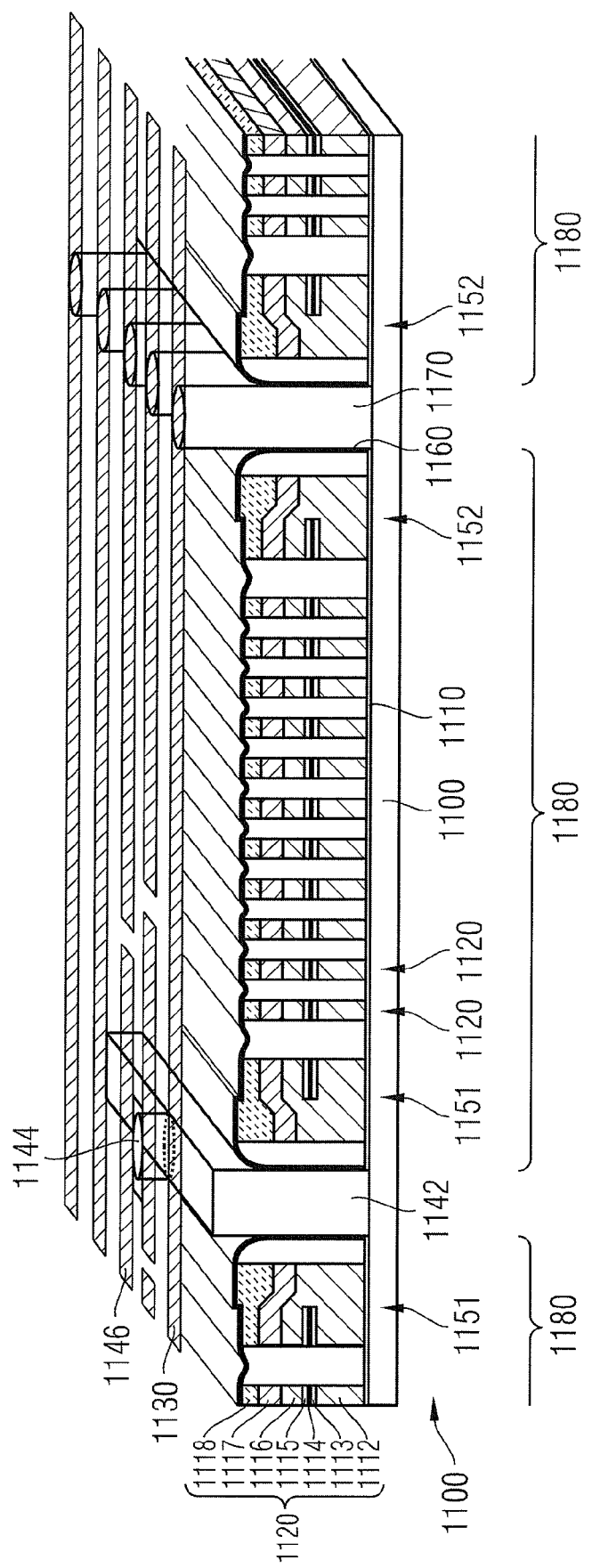
FIG. 11 is a schematic perspective view of a non-volatile NAND memory cell array comprising floating-gate memory cells and an interconnection arrangement.
Figure 12A:
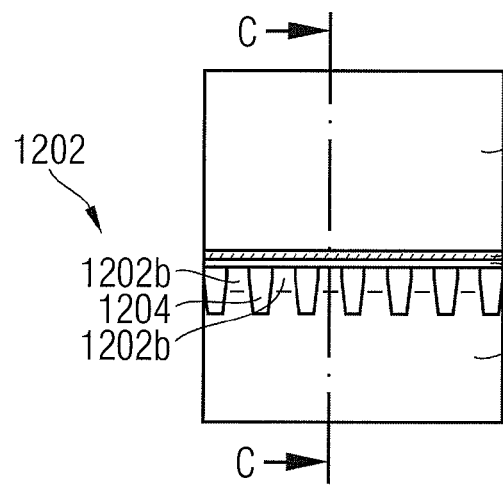
FIGS. 12A-12F are planar views and corresponding cross-sectional views of a first and a second section of a substrate which show an exemplary embodiment of a method of manufacturing a contact arrangement after providing an interlayer.
Figure 12B:
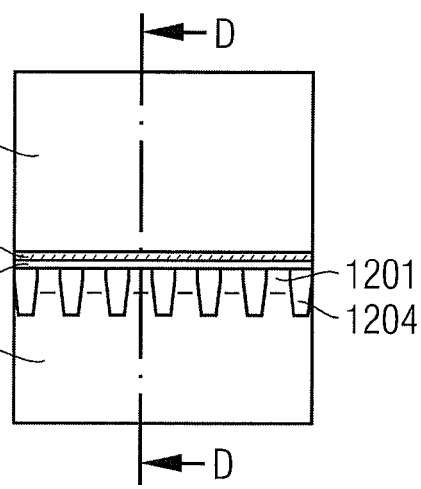
Figure 12C:
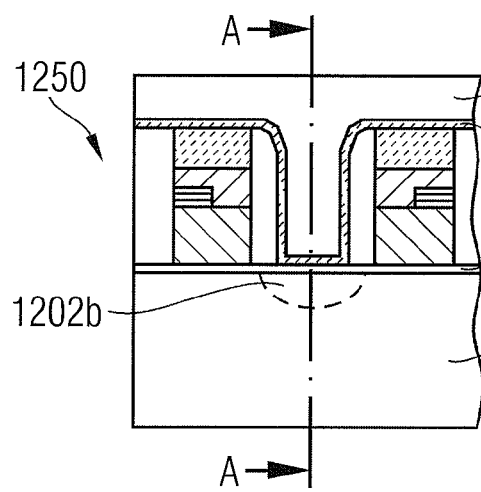
Figure 12D:
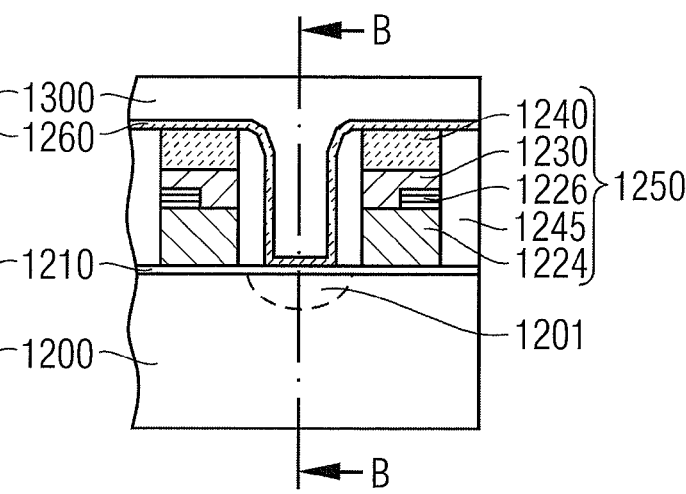
Figure 12E:
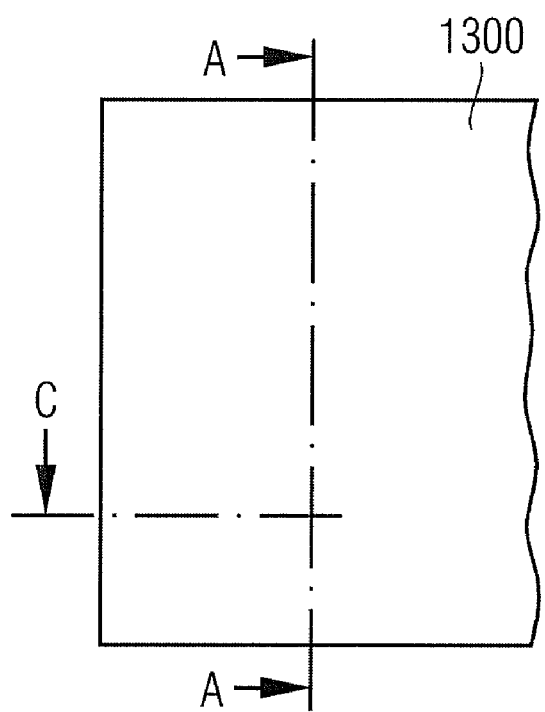
Figure 12F:
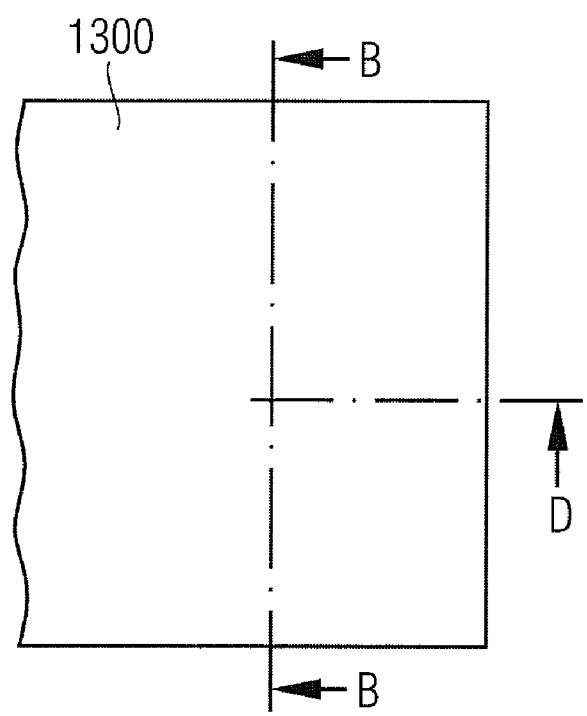
Figure 13A:
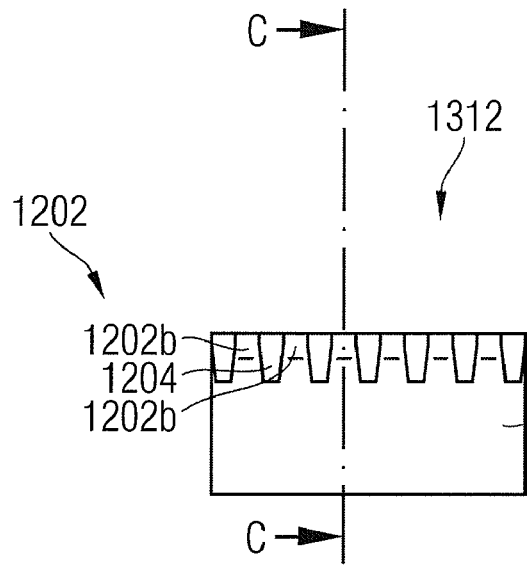
FIGS. 13A-13F are plan views and corresponding cross-sectional views of a first and second section of a substrate which show an exemplary embodiment of a method of manufacturing the contact arrangement of FIGS. 12A-12F after etching a contact trench.
Figure 13B:
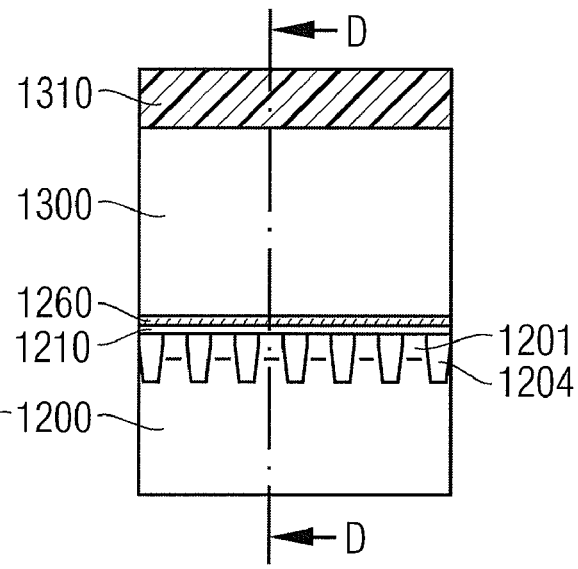
Figure 13C:
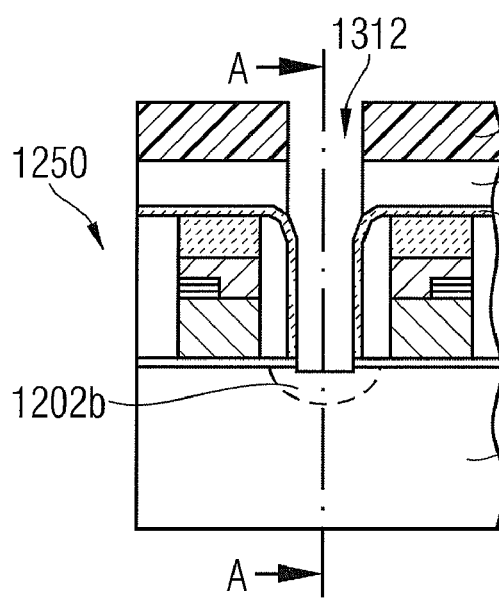
Figure 13D:
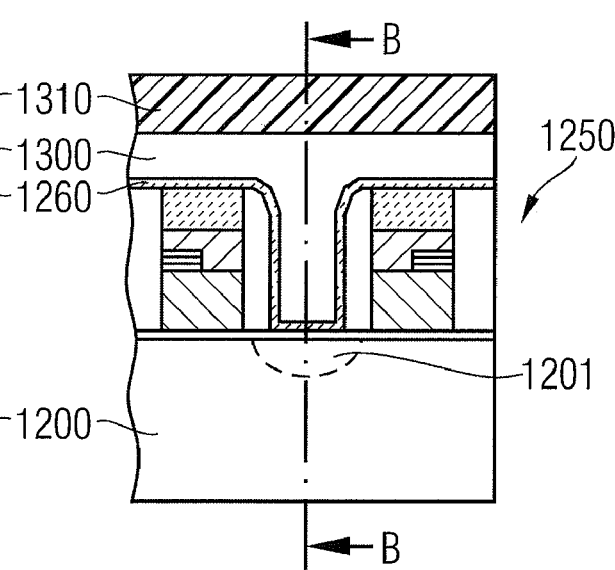
Figure 13E:
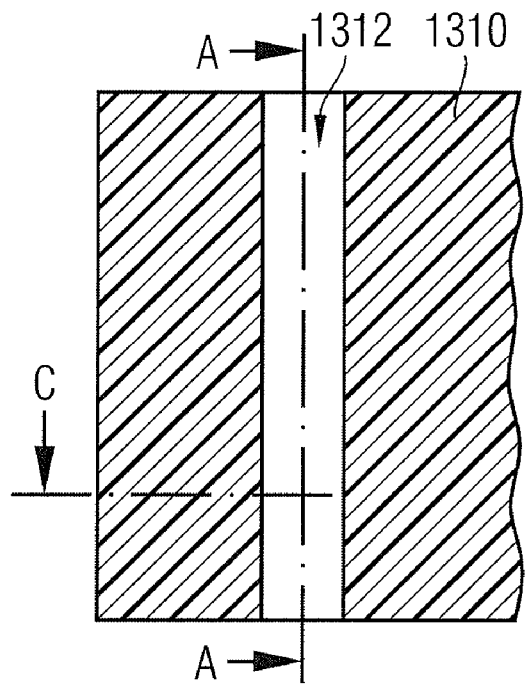
Figure 13F:
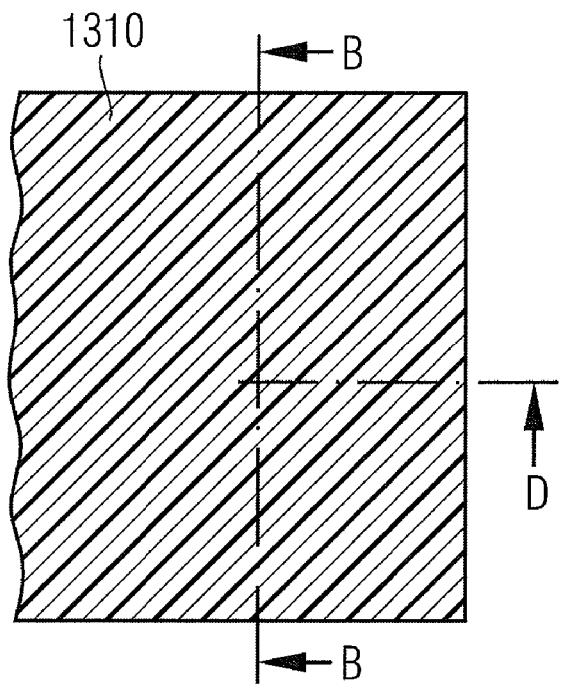
Figure 15A:
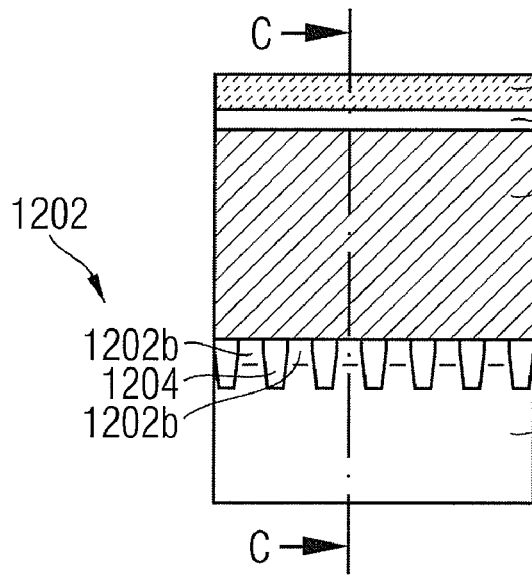
Figure 15B:
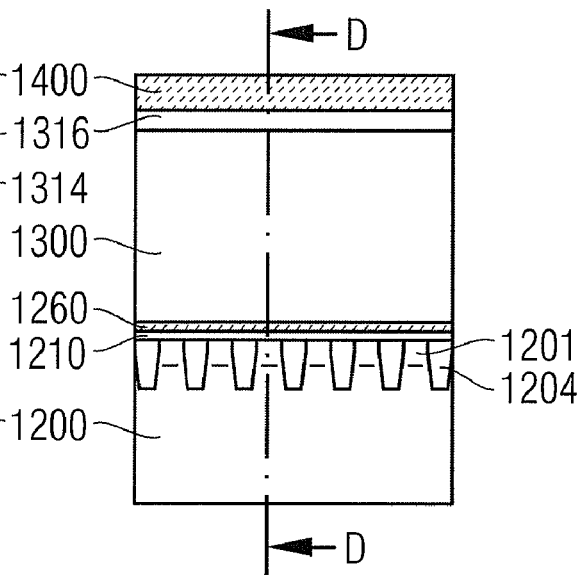
Figure 15C:
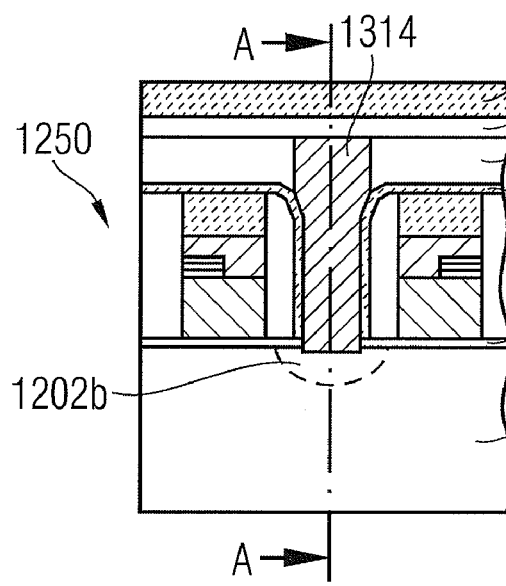
Figure 15D:
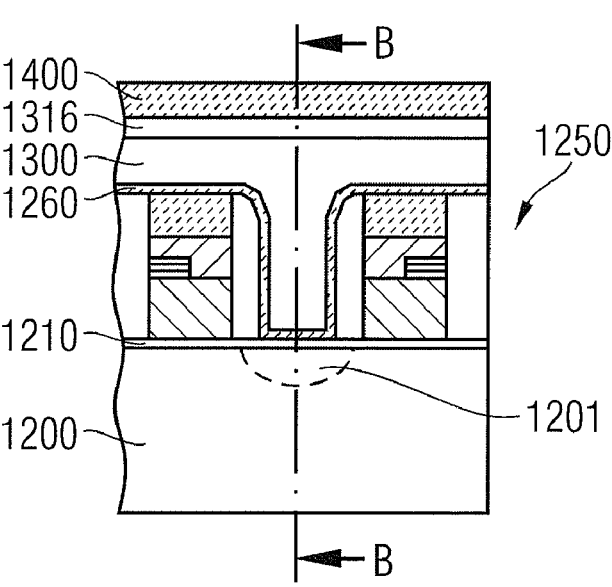
Figure 16A:
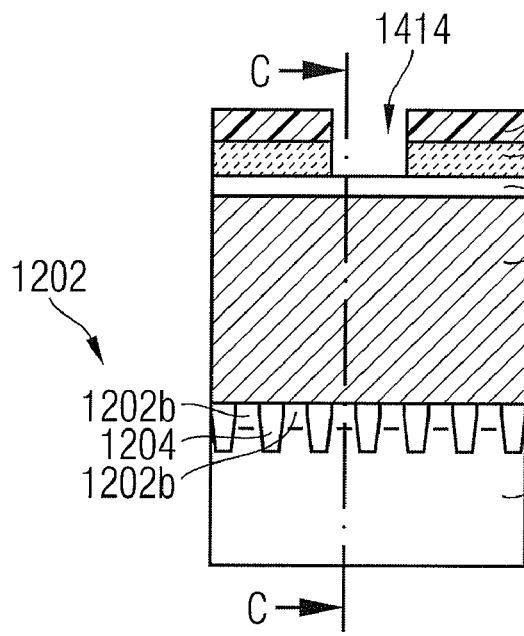
Figure 16B:
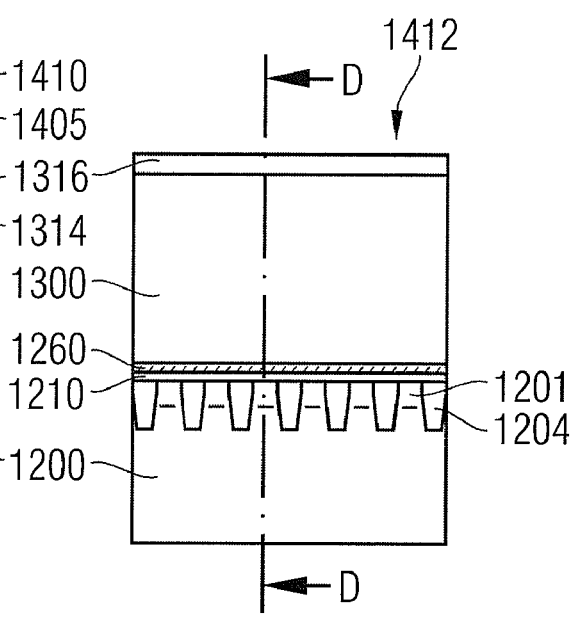
Figure 16C:
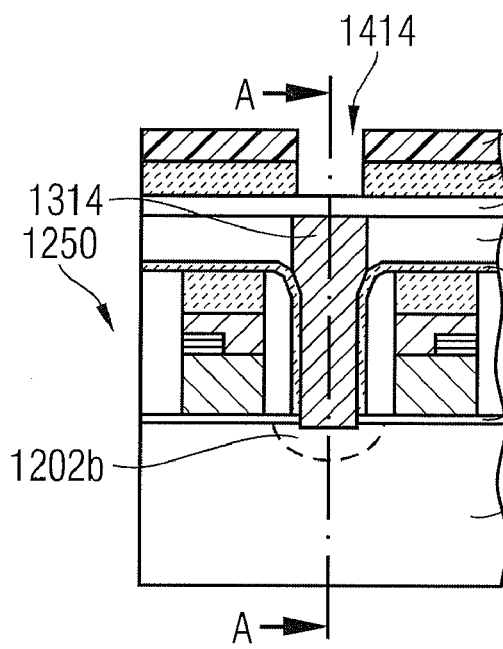
Figure 16D:
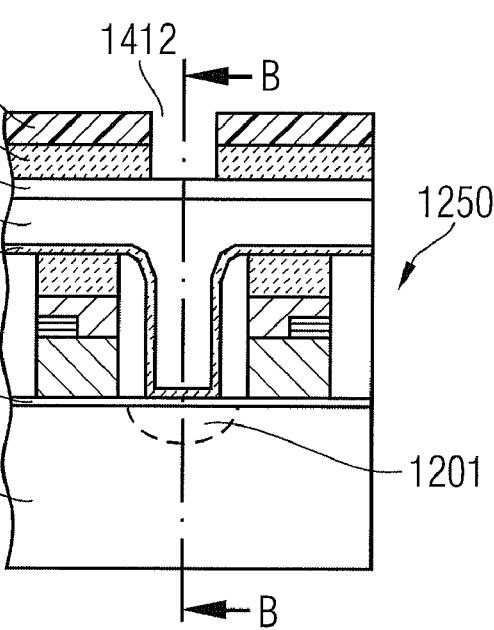
Figure 17A:
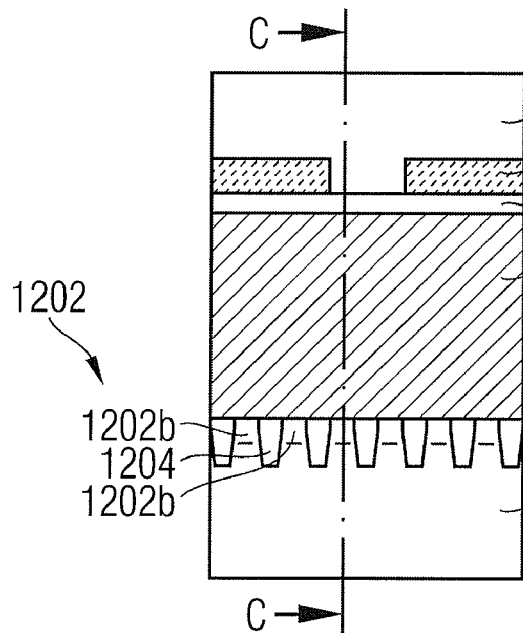
FIGS. 17A-17F are plan views and corresponding cross-sectional views of a first and second section of a substrate which show an exemplary embodiment of a method of manufacturing the contact arrangement of FIGS. 12A-16F after providing a fill material.
Figure 17B:
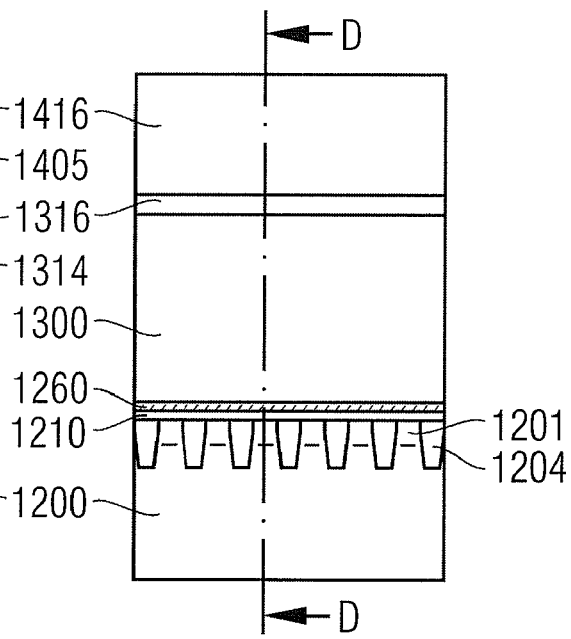
Figure 17C:
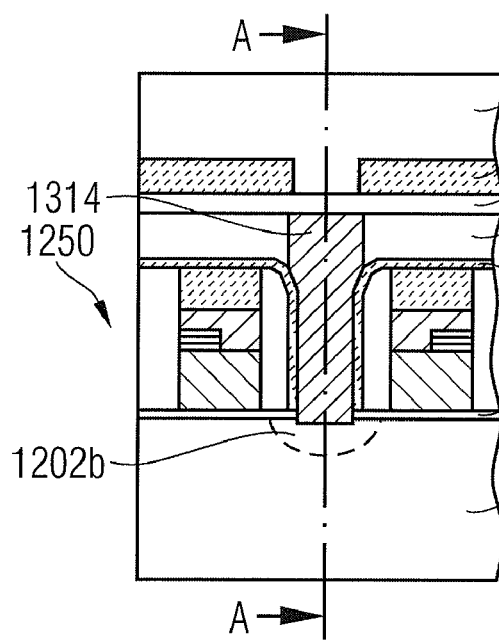
Figure 17D:
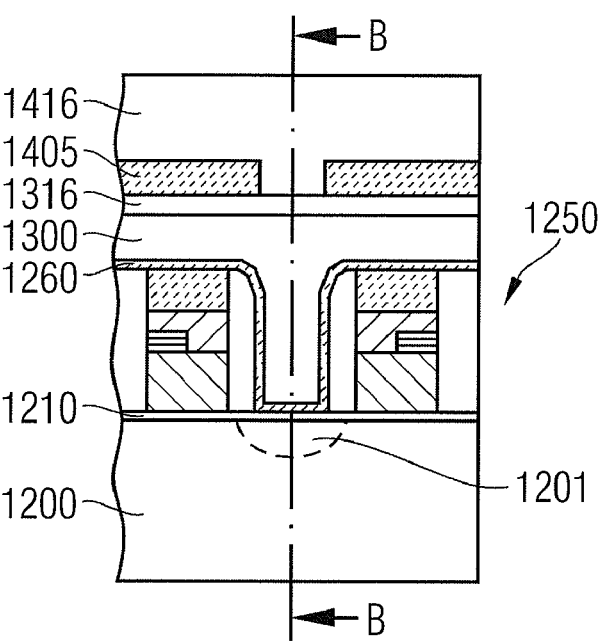
Figure 17E:
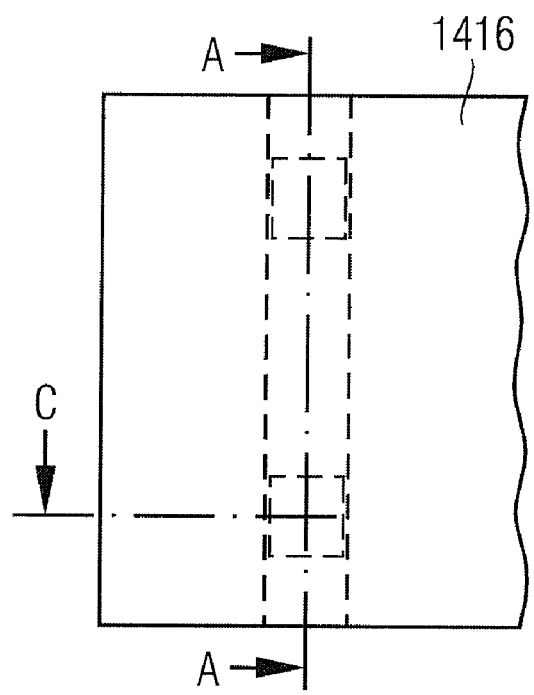
Figure 17F:
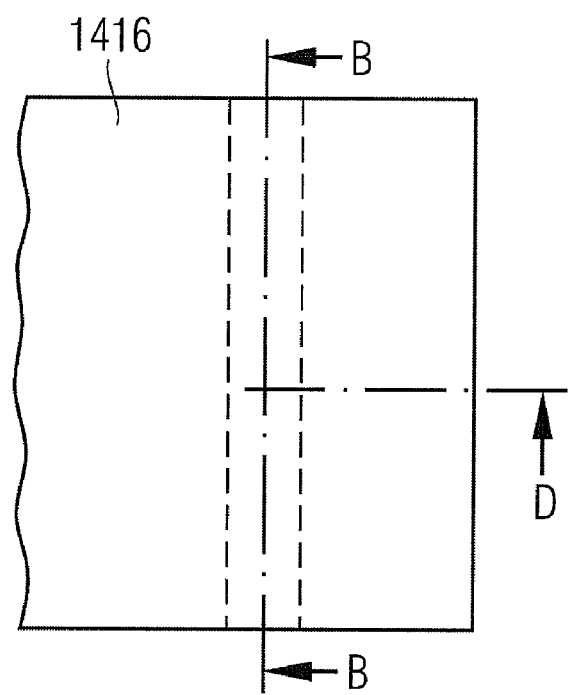

FIG. 11 schematically depicts a section of a NAND-type flash memory device with floating gate memory cells. Each memory cell comprises a gate stack 1120 and an active region formed within a substrate 1100. A barrier layer 1110 separates in each case the gate stack 1120 and the substrate 1100. Each gate stack 1120 comprises further an insulated storage layer 1112 which forms the floating gate and is, for example, a polysilicon layer. The storage layer 1112 is sandwiched between the barrier layer 1110 and a barrier system, which may comprise a nitride liner 1114 sandwiched between two silicon oxide liners 1113, 1115. According to other embodiments, the barrier system 1113, 1114, 1115 may be a single liner or comprise other liner materials. A gate layer 1116, which may be a polysilicon layer, may be disposed on the barrier system 1113, 1114, 1115. The gate stack 1120 may further comprise a metal layer 1117, which may be a tungsten layer and further barrier and adhesive layers between the metal layer 1117 and the gate layer 1116. An insulating cap layer 1118, which may be a silicon nitride layer, may be disposed on top of the metal layer 1117.

Groups of memory cells are arranged along a bit line direction and form in each case a NAND string 1180. An etch stop liner 1160 may cover the NAND strings 1180. First select transistors 1151 connect the NAND strings 1180 to a buried source line in the substrate 1100. A source line shunt 1142 may be disposed on the buried source line. The source line shunt 1142 is arranged between gate stacks of two first select transistors 1151 of neighboring NAND strings 1180 that are arranged along a bit line direction.

Source line vias 1144 may connect the source line shunt 1142 to a connection line 1146 that may be formed in a connection plane of the NAND-type flash memory. The source line shunt 1142 is connected to a plurality of neighboring NAND strings 1180. A second select transistor 1152 connects the NAND string 1180 to a corresponding bit line contact 1170. The bit line contacts 1170 of neighboring NAND strings 1180 are connected to bit lines 1130 that may be formed in the same connection plane as the connection lines 1146. Both connection and bit lines 1146, 1130 may run along the bit line direction. The bit line contacts 1170 may have a width and a length in each case equal to a minimum lithographic feature size "F" for evenly spaced lines. As the bit line contacts 1170 have no equivalent neighboring structures in the bit line direction, resolution enhancement techniques are difficult to apply. The requirements concerning the formation of the bit line contacts 1170, the source line shunts 1142 and the source line vias 1144 may differ from each other.

FIGS. 12A to 20F refer to a method of manufacturing a contact arrangement comprising dense contact chains and an isolated contact. The contact chain may be, for example, a row of bit line contacts and the isolated contact a source contact of a memory cell array. The memory cell array may be, for example, a NAND-type flash memory device.

The figures described below that are designated by "F" refer in each case to a plan view of a first section of a substrate 1200 and the figures designated by "E" refer in each case to a plan view of a second section of the substrate 1200. The first section may include first regions 1201 arranged along the cross section B-B. The first regions 1201 may be impurity regions forming bit line terminals of a NAND string and may be separated by insulator structures 1204. The second section may include a second region 1202. The second region 1202 may be another impurity region forming source line terminals of a NAND string. The figures designated by "A," "B," "C" and "D" illustrate the cross-sections along the lines A-A, B-B, C-C, D-D as depicted in the figures designated by "E" and "F." The cross-sections C-C and D-D run along a first direction, which may be a bit line direction of a NAND flash memory and the cross-sections A-A and B-B along a second direction perpendicular thereto. Although FIGS. 12A-12F to 20A-20F are described in context with a method of manufacturing a contact arrangement, they may also be part of a method of manufacturing an interconnection arrangement. Though FIGS. 12A-12F to 20A-20F are described in context with a NAND flash memory device, the method described in relation to these figures is also applicable for other semiconductor devices comprising dense contact chains and isolated contacts.

Referring to FIGS. 12A to 12F, a substrate 1200 is provided. The substrate 1200 may be a single crystalline semiconductor substrate as for example a silicon wafer and may include other layers that have previously been fabricated. The substrate may comprise doped and undoped sections, epitaxial semiconductor layers supported by a base semiconductor or a base insulator as well as other semiconductor and insulator structures. According to an exemplary embodiment, gate stacks 1250 of NAND-type memory cells and select transistors may be provided above the substrate 1200. The gate stacks 1250 may comprise a storage layer 1224, which may be polysilicon layer. A gate layer 1230, which may be a polysilicon layer, may be at least partially in contact with the storage layer 1224 in case of select transistors. Due to mask overlay tolerances, the gate stacks 1250 of the select transistors may comprise portions of a barrier system 1226 that insulates the gate layer 1230 and the storage layer 1224 in the gate stacks of the NAND-type memory cells. A barrier layer 1210, for example a silicon oxide layer, may be disposed between the substrate 1200 and the gate stacks 1250. Insulating sidewall spacers 1245, which may be silicon oxide spacers, may extend along vertical sidewalls of the gate stacks 1250. An etch stop liner 1260, which may be, for example, a silicon nitride or silicon oxynitride liner, and which may have a thickness of 1 to 15 nm, may cover the gate stacks 1250 and sections of the substrate 1200 between the gate stacks 1250. The substrate 1200 includes first regions 1201 being arranged along a first axis along cross-sectional plane B-B in the first section and at least a second region 1202 extending along the first axis in the second section. The first regions 1201 may be evenly spaced at a pitch of 2 F. An interlayer 1300 may fill the spaces between the gate stacks 1250 and may cover the gate stacks 1250 to provide a plane surface. The first axis will be referred to as row axis in the following figures.

Referring to FIGS. 13A-13F, a resist layer may be deposited on the interlayer 1300 and may be patterned by photolithographic techniques to form a stripe resist mask 1310, with a stripe opening above the second region 1202.

Using the stripe resist mask 1310 as an etch mask, an etch process may be performed that etches the interlayer 1300 selectively against the etch stop liner 1260 and the stripe resist mask 1310. An anisotropic etch of a section of the etch stop liner 1260 covering the second region 1202 may follow to form a stripe opening 1312 in the interlayer 1300, wherein the stripe opening 1312 exposes the second region 1202 and may extend between neighboring source select transistors of two NAND-strings that share a common source line.

According to FIGS. 14A-14F, the stripe opening 1312 may be filled with a conductive material, such as tungsten to provide a source line shunt 1314 in the stripe opening 1312. A titanium nitride liner lining the bar opening 1312 may be provided prior to the tungsten fill.

As shown in FIGS. 15A-15F, a spacer layer 1316, for example a silicon oxide layer, may be provided that covers the interlayer 1300 and the source line shunt 1314. A mask layer 1400 is deposited above the interlayer 1300 and the source line shunt 1314, for example on the spacing layer 1316. The mask layer 1400 is, according to an exemplary embodiment, a silicon nitride layer.

Referring to FIGS. 16A-16F, a further resist layer may be deposited and patterned by photolithographic techniques to form a trim resist mask 1410. Using the trim resist mask 1410 as etch mask, a first trim opening 1412 may be formed above the first regions 1201 and second trim openings 1414 may be formed above the source line shunt 1314 in the same mask layer 1400 to form a buried mask 1405 from the mask layer 1400.

As shown in FIG. 16E, the second trim openings 1414 are formed above the source line bar 1314. Referring to FIG. 16F, the first trim opening 1412 extends above the first regions 1201 along the row axis. The width of the first trim opening 1412 may correspond to F. Either width or length of the isolated second trim opening 1414 or both width and length may exceed F.

As shown in FIGS. 17A-17F, the trim resist mask 1410 is removed and a fill material 1416 is deposited which fills the first and second openings 1412, 1414 and which may cover the buried mask 1405. The fill material 1416 is, by way of example, the same as that of the interlayer 1300, for example a silicon oxide, and may provide a plane surface.

Referring to FIGS. 18A-18F, a top mask layer, which may be an amorphous carbon layer, is provided on the fill material 1416. An auxiliary layer, for example a silicon nitride layer may be disposed on the top mask layer and may be patterned by photolithographic techniques. The pattern may be transferred into the top mask layer to form a top mask 1500 with first template openings 1512 and at least one second template opening 1514. A protective layer 1502, for example a silicon oxynitride layer, may cover the top mask 1500.

Figure 18E:
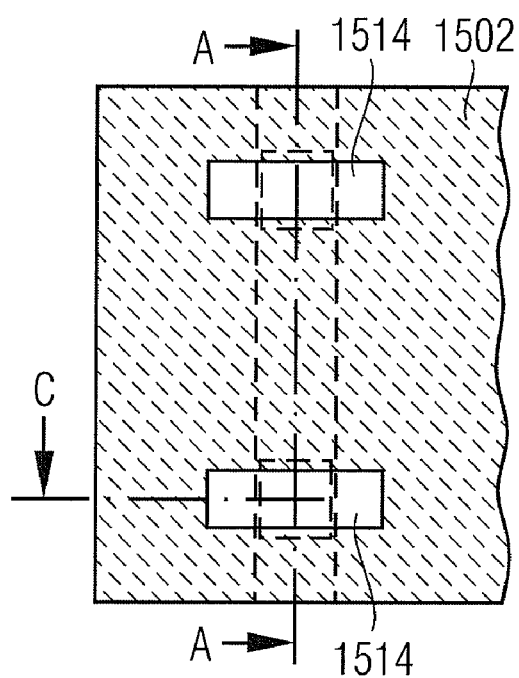
Figure 18F:
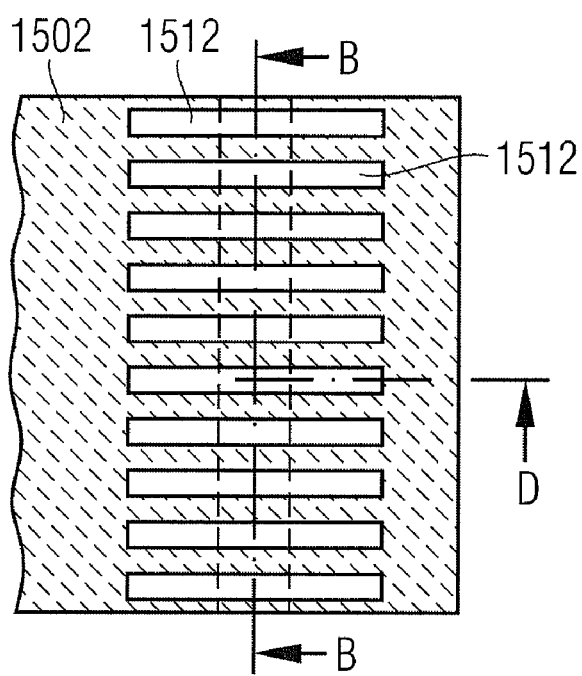

As shown in FIG. 18E, the second template openings 1514 extend along a second axis which may intersect the row axis perpendicularly and cross the second trim opening 1414 above the source line shunt 1314. The first template openings 1512 may extend also along the second axis and cross in each case one of the first regions 1201 above the first trim opening 1412. As the first template openings 1512 may be arranged at the minimum pitch that may be achieved at a nominal minimum lithographic resolution F, for example at a pitch of 2 F, and as further the first template openings 1512 lack of suitable neighboring structures, the length of the template openings 1512 is typically about 4 to 5 times the width.

Referring to FIGS. 19A-19F, the fill material 1416, the spacer layer 1316, and the interlayer 1300 may be etched step-by-step or in a single step. During etching, the top mask 1500 may be consumed at least partly. Residual portions of the top mask 1500 may be removed after etching. In the second section of the substrate 1200, contact trenches 1524 are formed that may extend between the upper edge of the fill material 1416 and the upper edge of the source line shunt 1314. The second template opening 1514 may define along the row axis a width W2 of a bottom portion 1524a of a second contact trench 1524 below the buried mask 1405. Along the second axis, the second trim opening 1414 may define a length L2 of the bottom portion 1524a.

Figure 19E:
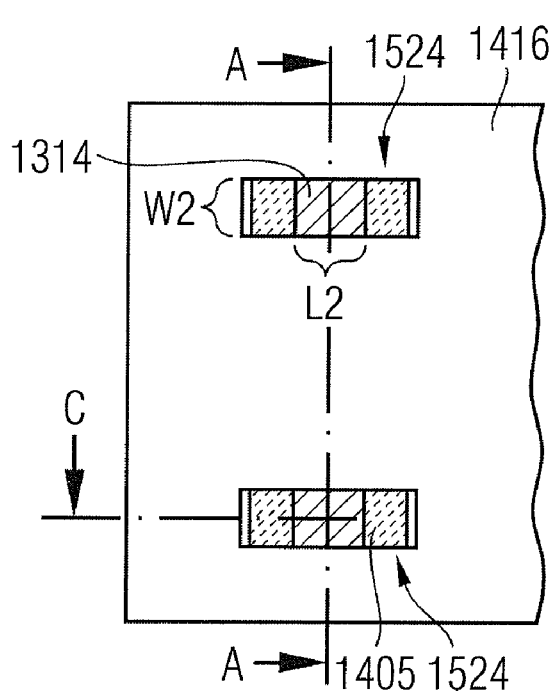
Figure 19F:
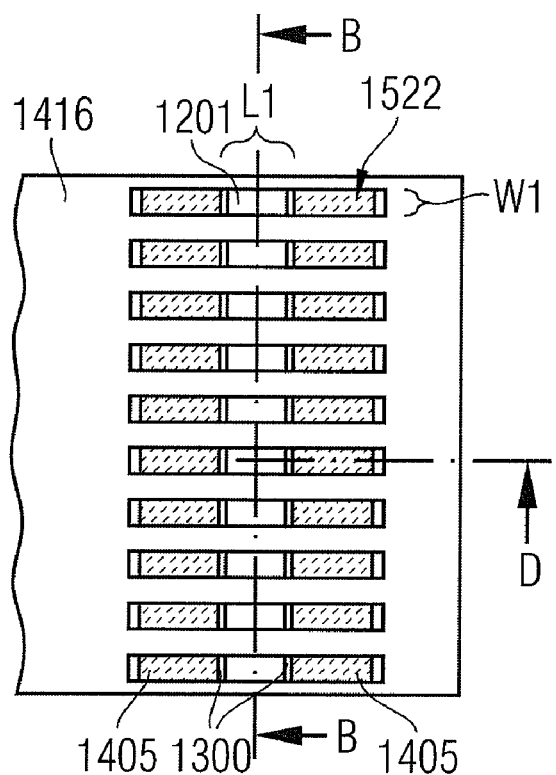
Figure 20A:
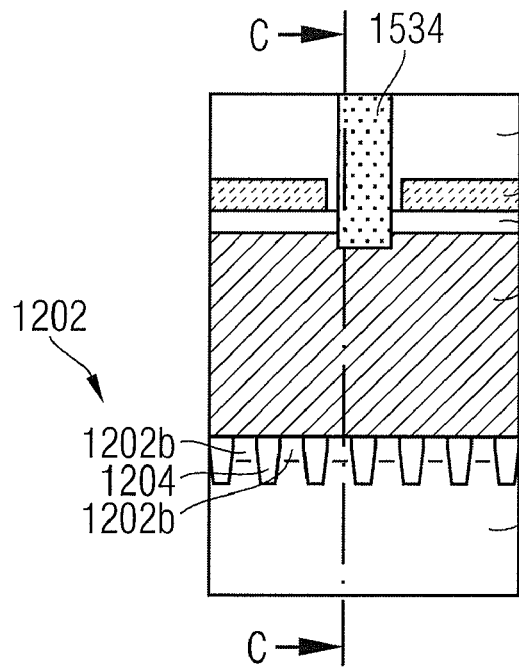
Figure 20B:
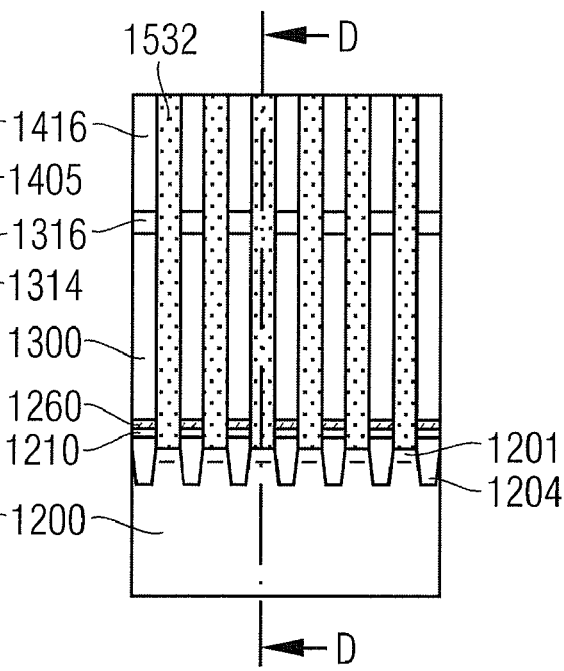
Figure 20C:
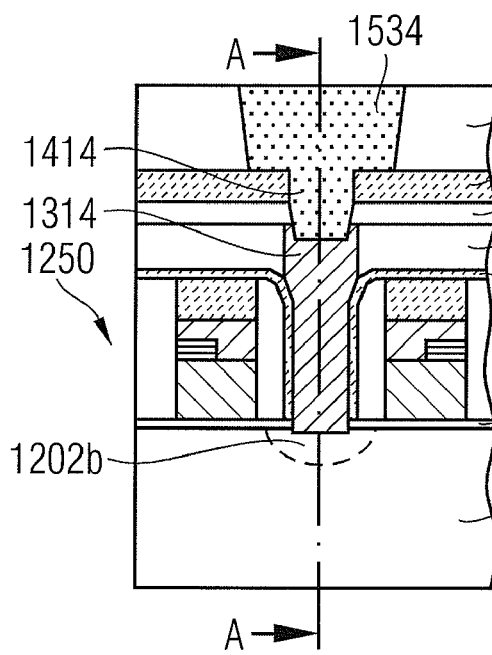
Figure 20D:
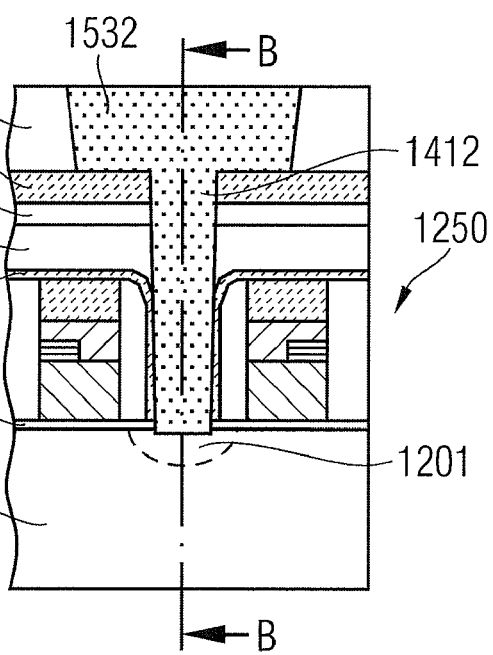

Referring to FIGS. 19B, 19D and 19F, the length L1 and the width W1 of bottom portions 1522a of first contact trenches 1522 below the buried mask 1405 are determined by the width of the first trim opening 1412 along the second axis and by the width of the template openings 1512 along the row axis.

The buried mask 1405 controls etching of the bottom portions 1522a, 1524a of the contact trenches 1522, 1524 and may protect structures adjoining the first regions 1201 and the second region 1202, as for example the gate structures 1250. The buried mask defines the dimension of the bottom portion 1522a. The distance between neighboring gate structures may therefore correspond substantially to the width of the first trim opening (trim width) which is significantly smaller than a minimum length of the template openings 1512.

Referring to FIGS. 20A-20F, a titanium or titanium nitride liner may be deposited to line the first and second contact trenches 1522, 1524. A conductive material such as tungsten may be deposited to fill the contact trenches 1522, 1524, wherein first and second contacts are formed in the corresponding contact trenches 1522, 1524. The first contacts may be bit line contacts 1532 and the second contacts source line contacts 1534. A chemical mechanical polishing step may be performed to remove deposited tungsten from the upper surface of the fill material 1416. The source line shunt may minimize a voltage drop of the source voltage between adjacent NAND-strings.

FIGS. 21A-21F show a contact arrangement of an integrated circuit according to an exemplary embodiment. First regions 1801 and second regions 1802 are provided in a first section and a second section of a substrate 1800 respectively. The first regions 1801 are arranged along a row axis, which is parallel to the cross-sectional line B-B, and may be separated by insulator structures 1804. The substrate 1800 may be a p-doped single crystalline silicon substrate. The first and second regions 1801, 1802 may be active areas, for example n-doped impurity regions forming source/drain-regions of transistors or conductive terminal structures. The first regions 1801 may be evenly spaced at a pitch 2F, wherein F corresponds to a minimal feature size that is achievable for evenly spaced lines by resolution enhancement techniques. The first and second regions 1801, 1802 may adjoin a substrate surface of the substrate 1800.

The contact arrangement may further comprise a contact 1823, for example a source line shunt, which is in contact with the second region 1802. The source line shunt may minimize a voltage drop of the source voltage between adjacent NAND-strings. An interlayer 1300 is arranged above the substrate 1800. The upper edge of the interlayer 1300 may be flush with an upper edge of the contact 1823. The interlayer 1300 may be a dielectric layer, for example a silicon oxide layer. A buried mask 1814 is arranged above the contact 1823 and the interlayer 1300. The buried mask 1814 comprises a first trim opening 1818 and a second trim opening 1820. The first trim opening 1818 extends above the first regions 1801 along the row axis. The second trim opening 1820 is formed above the contact 1823. The buried mask 1814 may be formed from a dielectric material, against which the dielectric material of the interlayer may be etched with high selectivity. The buried mask 1814 may be a silicon nitride mask or a silicon oxynitride mask. A fill material 1816 fills partially the first and second trim openings 1818, 1820. Further portions of the fill material 1816 may form a fill material layer covering the buried mask 1814.

The contact arrangement further comprises first contacts 1821. Each first contact 1821 comprises a bottom portion 1821a extending from the upper edge of the buried mask 1814 to the substrate surface of substrate 1800, wherein each first contact 1821 is in contact with one of the first regions 1801.

Figure 21A:
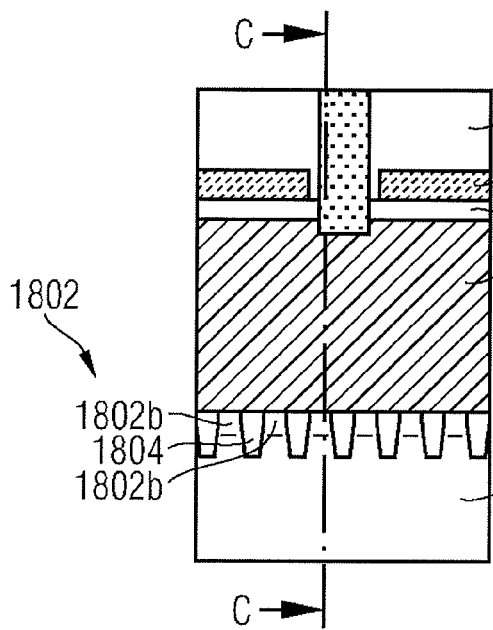
Figure 21B:
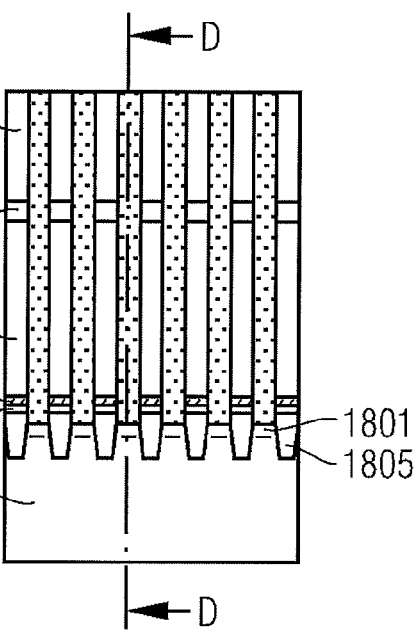
Figure 21C:
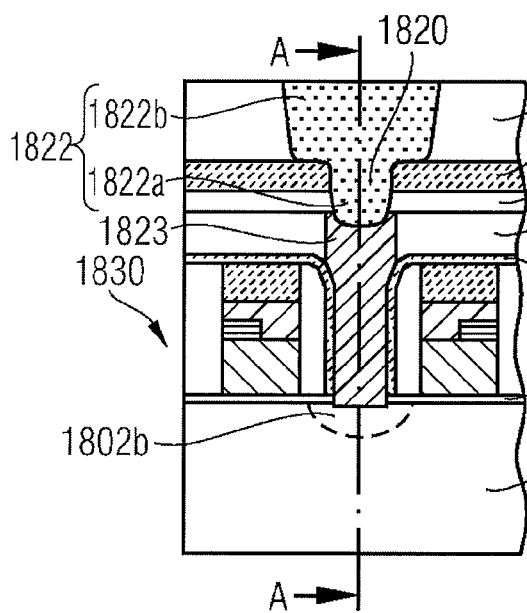
Figure 21D:
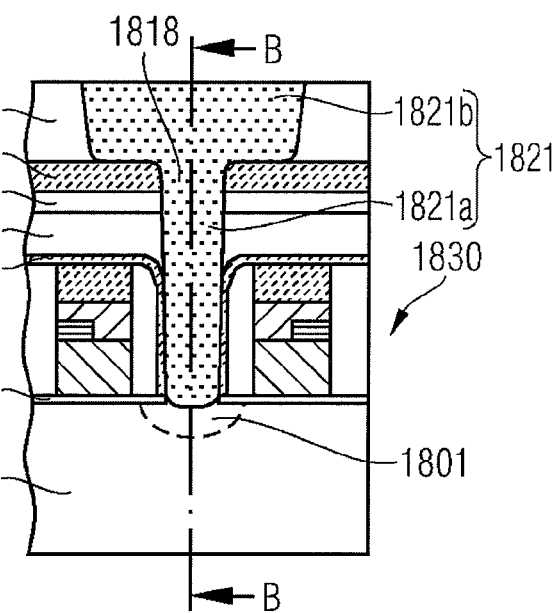
Figure 22E:
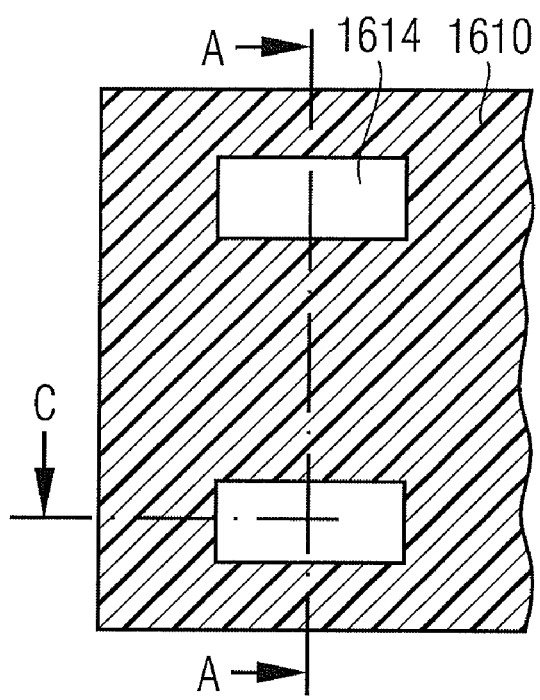
Figure 22F:
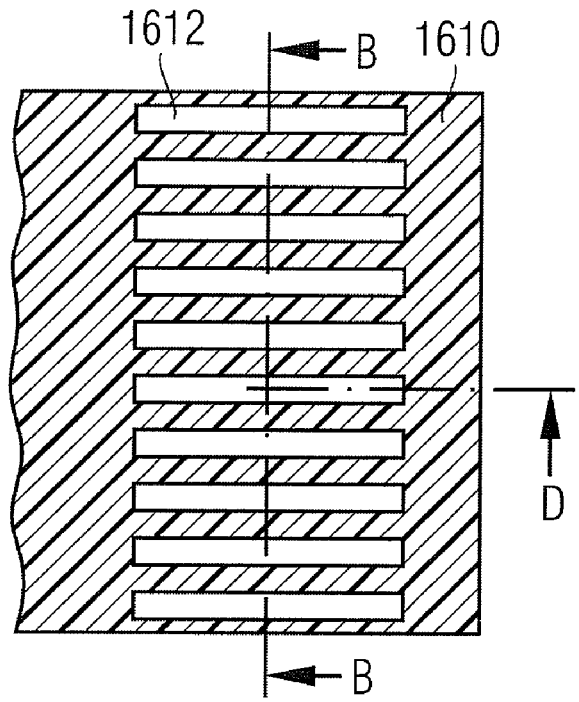
Figure 23C:
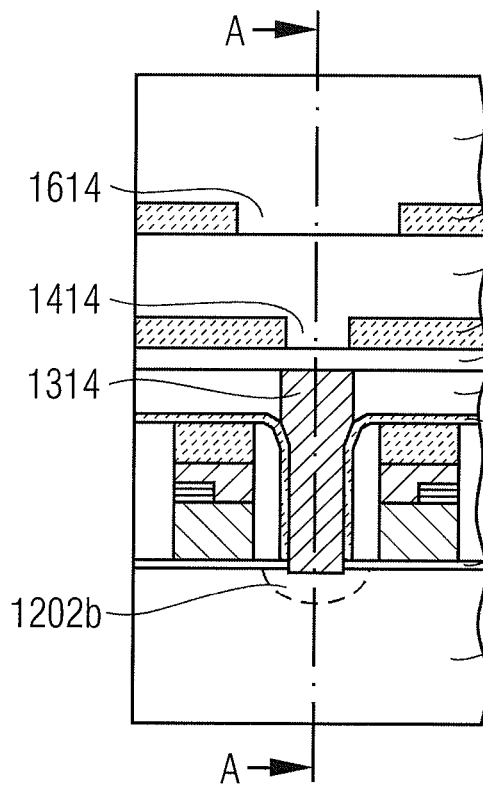
Figure 23D:
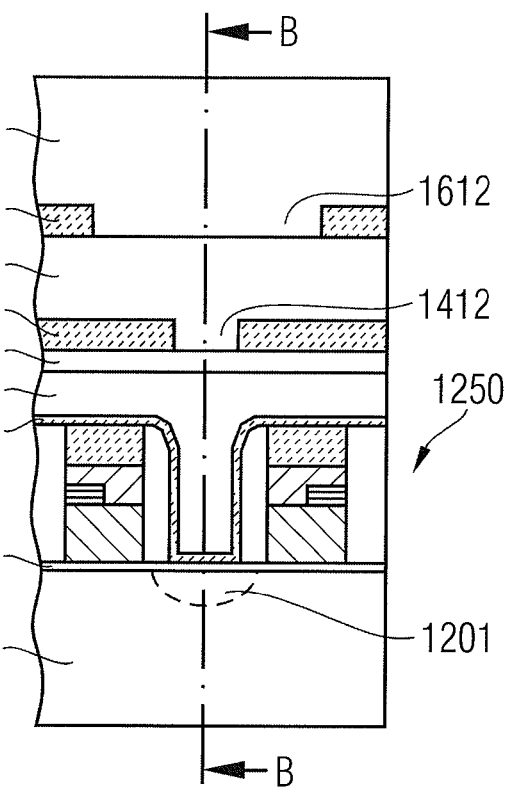
Figure 23E:
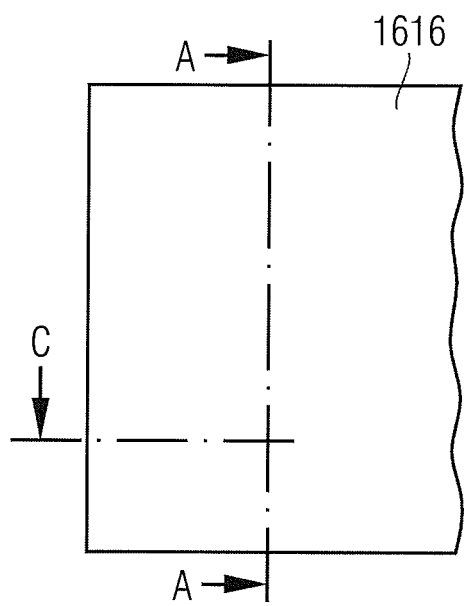
Figure 23F:
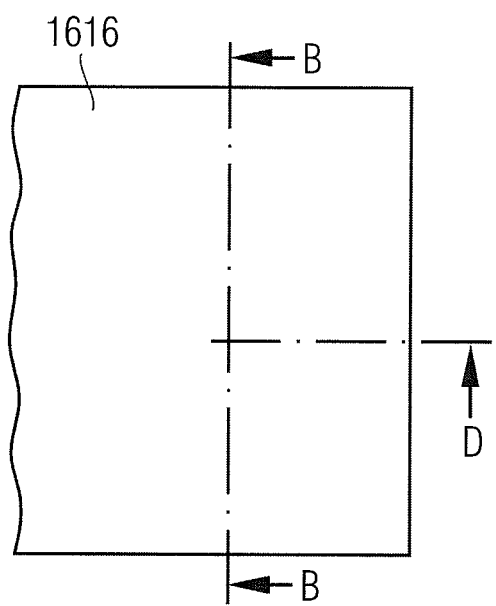

The buried mask 1814 is in contact with each of the first contacts on two opposing sides along a first axis. Along a second axis, which is perpendicular to the first axis, portions of the fill material 1816 separate the first contacts 1821 from each other. The first axis may be, as shown in FIGS. 21C-21D, perpendicular to the row axis. According to another embodiment, the first axis is parallel to the row axis.

An upper portion 1821b of the first contacts 1821 may extend above the buried mask 1814 and may bear in portions on the buried mask 1814. The upper portions 1821b of the first contacts 1821 may cross the row axis, for example perpendicularly. A length of the upper portions 1821b may be 4 to 5 times the width thereof. The pitch of the first contacts 1821 is equivalent to the pitch of the first regions 1801. The top dimensions of the first contacts 1821 are enlarged with regard to the dimensions of the first regions and requirements for further structures contacting the first contacts 1821 from a further interconnection plane are relaxed.

Accordingly, each second contact 1822 comprises at least a bottom portion 1822a extending between the upper edge of the buried mask 1814 and the upper edge of the contact 1823. The bottom portion 1822a is in contact with the buried mask 1814 on two opposing sides along a first axis, which may be an axis perpendicular to the row axis. Along an axis perpendicular to the first axis, for example the row axis, portions of the fill material 1816 separate the second contact 1822 and the buried mask 1814. An upper portion 1822b of the second contact 1822 may bear partly on the lower portion 1822a and the buried mask 1814.

The integrated circuit may further comprise gate electrode structures 1830 extending on opposing sides along the contact rows. The gate electrode structures 1830 may be assigned to, for example, selection transistors of NAND strings. An etch stop liner 1804 may cover the gate electrode structures 1830 and a barrier layer 1810 may separate the gate electrode structures 1830 and the substrate 1800.

The trim openings 1818, 1820 direct the etch of the contact trenches between the gate electrode structures 1830 which are shielded by the buried mask 1814. Thus, by way of example, the distance between neighboring NAND-strings may be reduced to the minimum feature size F to save substrate area. The buried mask 1814, which may be a silicon nitride mask, may shield, by way of example, floating gate or trapping layer memory cells against UV-radiation, caused by plasma enhanced processes performed in course of further processing of the integrated circuit. UV-radiation may generate charge carriers precharging the floating gates or the trapping layers and shifting the initial threshold voltage of the memory cells to higher values.

The material of the first and second contacts 1821, 1822 may be any conductive material such as heavily doped polysilicon or a metal layer system. For example, the contacts 1821, 1822 may comprise a titanium nitride liner lining the sidewalls of the contacts 1821, 1822 and tungsten in the rest.

FIGS. 22A-25F illustrate a method of manufacturing an interconnection arrangement. An interlayer 1416 covering first regions 1201 in a first section of a substrate 1200 is provided as shown in FIGS. 22A-22F. Above a second region 1202 in a second section of the substrate 1200, a contact structure 1314 which may be a source line shunt of a NAND memory cell array may be provided. A buried mask 1405 including a first trim opening 1412 crossing above the first regions 1201 and second trim openings 1414 above the contact structure 1314 is provided. The buried mask 1405 is filled with a fill material 1416. Above the fill material 1416, which may form a fill material layer above the buried mask 1405, a buried template mask 1605 may be provided. The buried template mask 1605 may be provided using a template resist mask 1610, which is patterned by photolithographic techniques. Using the template resist mask 1610 as an etch mask, first and second template openings 1612, 1614 are formed in the buried template mask 1605. Remnant portions of the template resist mask 1610 may be removed. In other embodiments, the buried template mask 1605 is omitted.

Referring to FIGS. 23A to 23F, a mold layer 1616 is deposited above the buried template mask 1605, where the template openings 1612, 1614 are filled with the material of the mold layer 1616. The template mask 1605 may be provided from the same material as the buried mask 1405, for example silicon nitride. The material of the mold layer 1616 may be the same as the material of the interlayer 1300 and the fill material 1416 or a similar, for example a silicon oxide. According to other embodiments, the mold layer 1616 may be disposed on the buried mask 1405.

A line mask 1705 is provided above the mold layer 1616 as shown in FIGS. 24A to 24F. The pattern of the line mask 1705 may be essentially a line/space-pattern, for example the pattern of connection lines, which may comprise first lines that are to be connected with the first regions 1201 and at least a second line that is to be connected with the second region 1202. The first lines may be, for example, the bit lines of a NAND memory cell array and the second line may be, for example, a source line.

Referring to FIG. 24A, line trenches 1713 are formed in the mold layer 1616 that end on top of the buried template mask 1605. In the second section, at least one damascene etch is etched through the mold layer 1616, the fill material 1416 and the interlayer 1300, wherein a damascene trench 1714 is formed that passes the buried template mask 1605 and the buried mask 1405. The second template opening 1614 determines the extension of the damascene trench 1714 along a first axis. The second trim opening 1414 determines the dimension of the damascene trench 1714 along a second axis, which is perpendicular to the first axis. The damascene trench 1714 in the second section of the substrate 1200 exposes the contact 1314.

Accordingly, in the first section of the substrate, triple damascene trenches 1712 may be formed extending between the upper edge of the mold layer 1616 and the upper edge of the substrate 1200, where in each case one of the first regions 1201 is exposed. Above the template mask 1605, line trenches 1713 are formed that end on the buried template mask 1605. A bottom portion of the triple damascene trench 1712 is formed between the upper edge of the buried mask 1405 and the upper edge of the substrate 1200. In the bottom portion, the dimensions of the triple damascene trench are determined along the first axis by the width of the first template openings 1612 and along a second axis by the width of the first trim opening 1412. The first axis may correspond to the row axis and the second axis to the bit line axis.

Figure 24C:
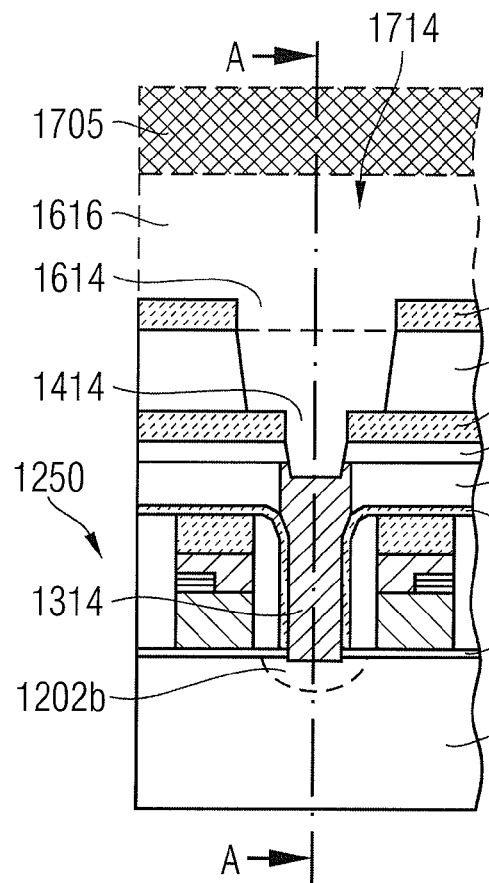
Figure 24D:
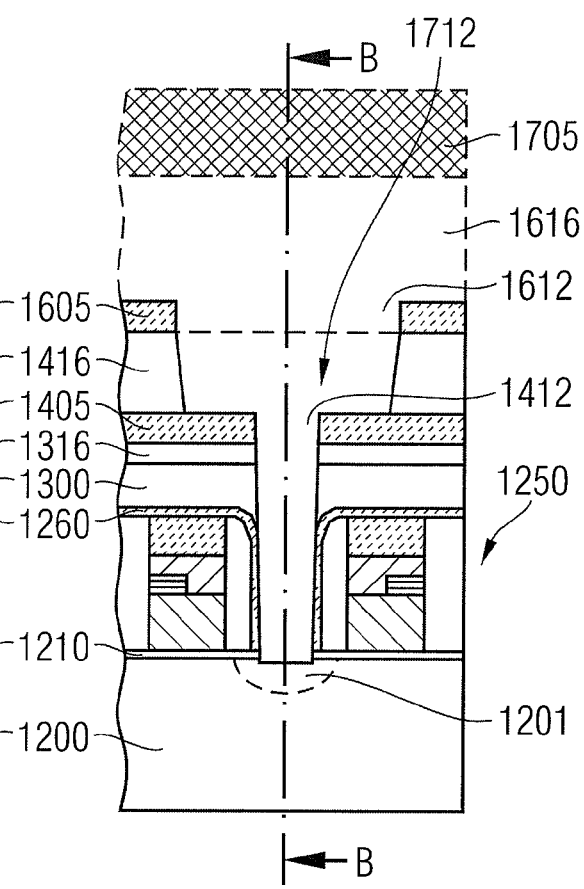
Figure 24E:
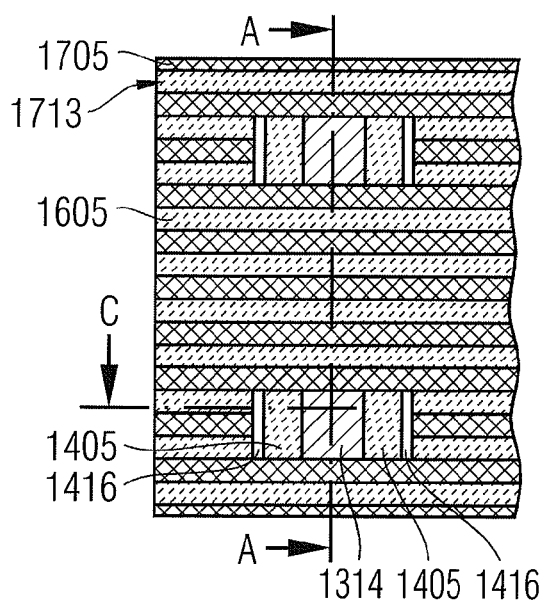
Figure 24F:
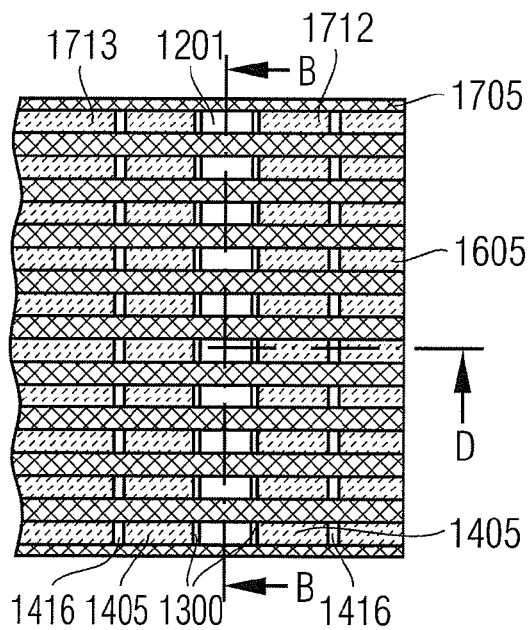
Figures 25A, 25B:
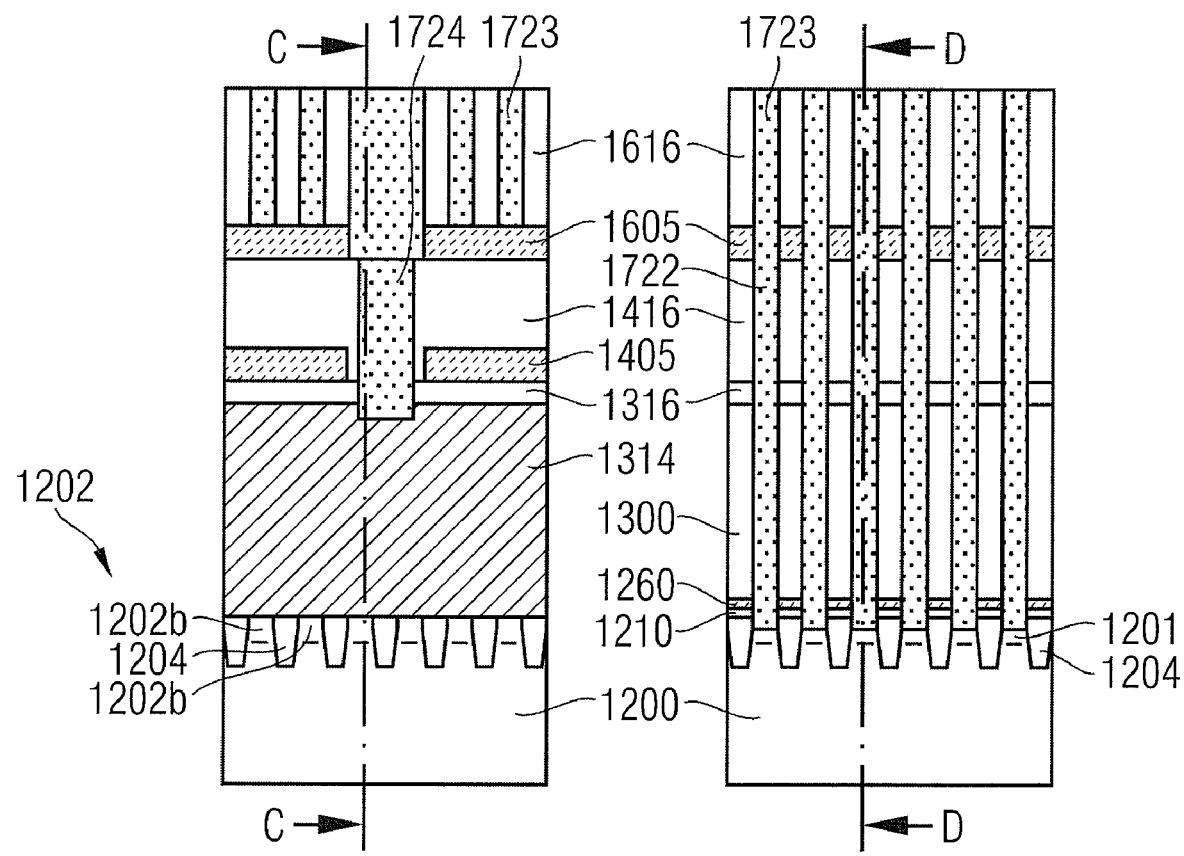
Figure 26C:
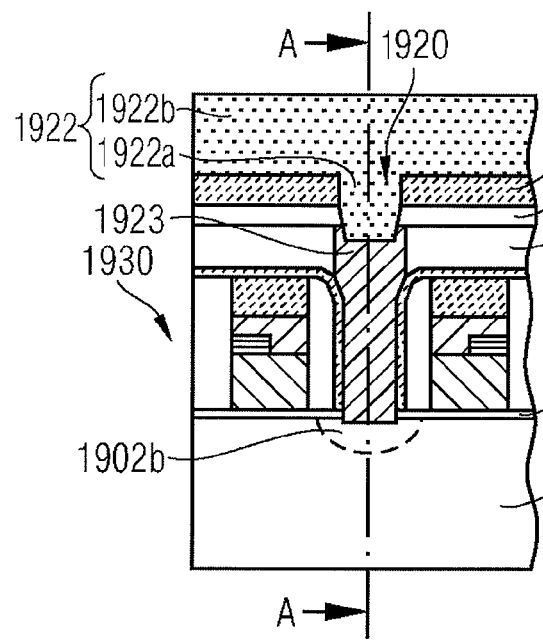
Figure 26D:
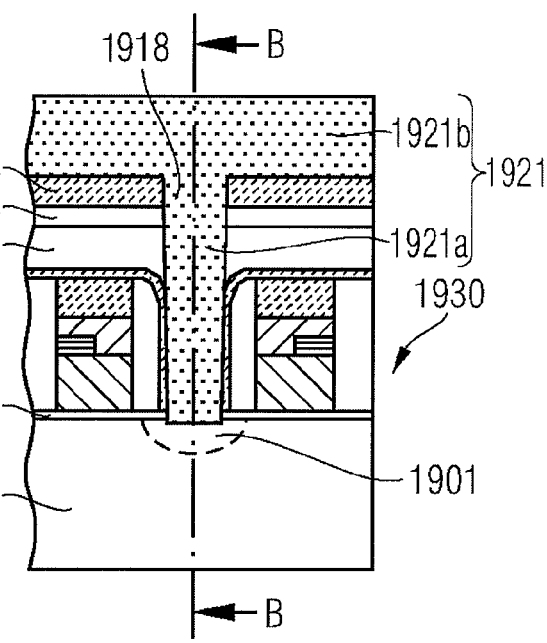
Figure 26E:
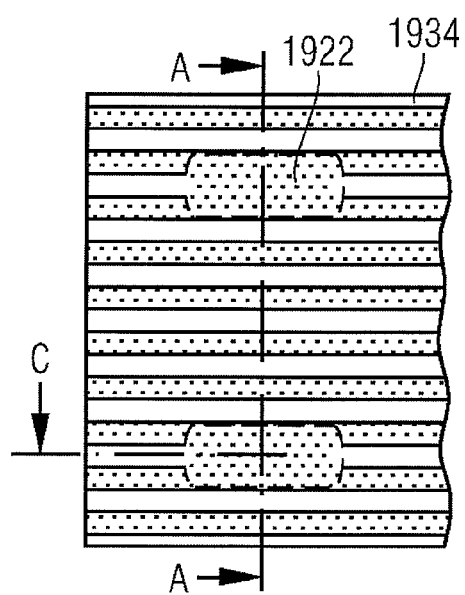
Figure 26F:
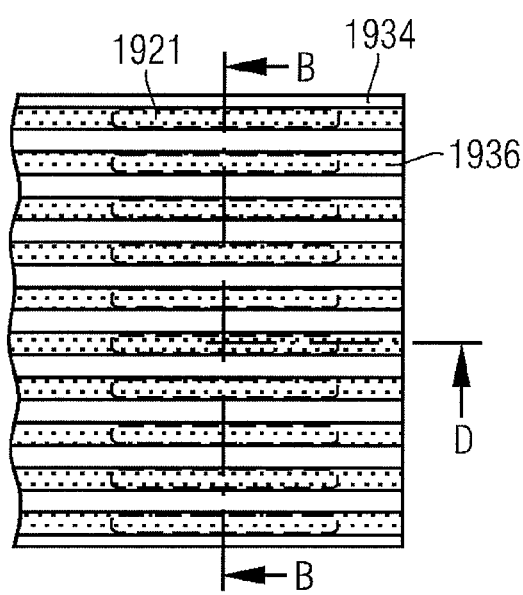

FIGS. 24C and 24D depict cross-sectional views along the dual damascene trench 1714 in the second section and the triple damascene trench 1712 in the first section. The dotted lines refer to the profiles of the mold layer 1616 and the line mask 1705 confining the intersected damascene trenches 1712, 1714 in a plane parallel to the cross-section plane.

Referring to FIGS. 25A-25F, the first and second damascene trenches 1712 and 1714 are filled with conductive material to form connection lines 1723, first contacts 1722 and second contacts 1724. A chemical mechanical polishing (CMP) may be performed to remove portions of the conductive material being deposited outside the trenches 1712-1714. Remnant portions of the line mask 1705 may be removed.

Above the buried template mask 1605, connection lines 1723 may be formed in the mold layer 1616. The connection lines 1723 may extend along the second axis and may form source and bit lines in a metallization plane of a NAND memory cell array. Above the contact structure 1314, a further contact section 1724 is formed between corresponding connection lines 1723 and the contact section 1314. A first dimension of the second contact section 1724 along a first axis is determined by the second template opening 1514 in the buried template mask 1605. A second dimension along a second axis, which is perpendicular to the first axis, is determined by the second trim opening 1414 in the buried mask 1405.

Accordingly, in the first section of the substrate, first contacts 1722 are formed between corresponding connection lines 1723 and first regions 1201. A first dimension of the first contact 1722 along a first axis is defined by the buried template mask 1605 and a second dimension along a second axis which is perpendicular to the first axis is defined by the second trim openings 1414 of the buried mask 1405. The first direction may be the row axis and the second direction may be the bit line axis.

FIGS. 26A to 26F show an interconnection arrangement of an integrated circuit resulting from the above described method, where the formation of the buried template mask is omitted. A substrate 1900 comprises in a first section first regions 1901 and in a second section second regions 1902. The first regions 1901 are arranged along a row axis, which is parallel to the cross-sectional line B-B. The substrate 1900 may be a p-doped single crystalline silicon substrate. The first and second regions 1901, 1902 may be active areas, for example n-doped impurity regions forming source/drain regions of transistors or conductive terminal structures. The first regions 1901 may be separated by insulator structures 1904, which may be for example silicon oxide structures. The first regions 1901 may be evenly spaced at a pitch of 2 F, wherein F corresponds to a minimal lithographic features size for evenly spaced lines. The interconnection arrangement may further comprise a contact structure 1923 arranged above the second region 1902. Gate structures 1930 of transistors, e.g., floating gate memory cells or selection transistors, may be arranged above the substrate 1900. An interlayer 1910 is arranged above the substrate 1900 and may bury the gate structures 1930. The interlayer 1910 is a dielectric layer, for example a silicon oxide layer. A buried mask 1914 is provided above the contact structure 1923 and the interlayer 1910. The buried mask 1914 comprises a first trim opening 1918 and may comprise a second trim opening 1920. The first trim opening 1918 extends above the first regions 1901 along the row axis. The second trim opening 1920 is formed above the contact structure 1923. The buried mask 1914 may be formed from a dielectric material, against which the material of the interlayer may be etched with high selectivity. For example, the buried mask 1914 is a silicon nitride mask or a silicon oxynitride mask.

The interconnection arrangement further comprises first interconnection structures 1921 and may further comprise second interconnection structures 1922. Each first interconnection structure 1921 comprises a bottom portion 1921a extending between the upper edge of the buried mask 1914 and the substrate 1900, wherein each bottom portion 1921a is in contact with one of the first regions 1901. A line portion 1921b of the interconnection structure 1921 is disposed within a mold layer 1934 and bears in sections on the buried mask 1914 and the bottom portion 1921a. In a similar way, the second interconnection structure 1922 comprises a line portion 1922b and a bottom portion 1922a, where the bottom portion 1922a extends essentially between the upper edge of the buried mask 1914 and the upper edge of the contact structure 1923. Further portions of the mold layer 1934 may fill partially the first and second trim openings 1918, 1920.

The buried mask 1914 is in contact with each of the first interconnection structures 1921 in each case on two opposing sides along a first axis. Along a second axis, which is perpendicular to the first axis, portions of the mold layer 1934 separate the first interconnection structures 1921 from each other. The first axis may be perpendicular to the row axis as shown in FIGS. 26A to 26D. The material of the first and second interconnections structures 1921, 1922 may be any conductive material such as heavily doped polysilicon or a metal layer system. For example, the interconnection structures 1921, 1922 may comprise a titanium nitride liner lining the sidewalls of the interconnection structures 1921, 1922 and tungsten in the rest.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method of forming an integrated circuit, the method comprising:
   forming first structures arranged in a first portion of the integrated circuit; and
   forming second structures arranged in a second portion of the integrated circuit, the second structures being arranged denser than the first structures;
   wherein the first and second structures are formed by lithography processes that comprise:
   transferring a first pattern to the first and second portions using a first photomask with first pattern openings in both first and second regions respectively corresponding to the first and second portions of the integrated circuit; and
   transferring a second pattern to the first and second portions using a second photomask with second pattern openings in both first and second regions respectively corresponding to the first and second portions of the integrated circuit, the second pattern differing from the first pattern,
   wherein the first structures are formed in the first portion of the integrated circuit via a superposition of the first and second patterns, and the second structures are formed in the second portion of the integrated circuit via a superposition of the first and second patterns.

2. The method of claim 1, wherein the second structures are arranged at a sub-lithographic pitch.

3. The method of claim 1, wherein the second structures are formed via optical proximity effects.

4. The method of claim 1, wherein:
the second structures are array contacts electrically coupling memory cells of the integrated circuit to conductive lines; and
the first structures are isolated contacts electrically coupling the conductive lines to a support circuitry configured to control the memory cells.

5. The method of claim 4, further comprising:
forming an interconnection including a plurality of conductive lines, each conductive line connecting individual ones of the array contacts and an isolated contact.

6. The method of claim 1, wherein forming the first and second structures comprises:
patterning a first hardmask layer disposed above a second hardmask layer, wherein the first pattern openings of the first photomask are transferred into the first hardmask layer; and
patterning a second hardmask layer, wherein the second pattern openings of the second photomask are transferred into the second hardmask layer.

7. The method of claim 6, wherein:
one of the first pattern openings and second pattern openings defines first hardmask openings in the corresponding hardmask layer at positions arranged in an array pattern extending over the first and second portions;
the other of the first pattern openings and second pattern openings defines second hardmask openings in the corresponding hardmask layer at isolated positions corresponding to individual ones of the first hardmask openings in the first portion; and
the other of the first pattern openings and second pattern openings or pattern openings of a further photomask define a further hardmask opening in a corresponding hardmask layer, wherein the further hardmask opening corresponds to a plurality of the first hardmask openings in the second portion.

8. The method of claim 6, wherein:
one of the first pattern openings and second pattern openings defines first hardmask openings in the respective hardmask layer to form a lines/spaces pattern extending over the first and second portions;
the other of the first pattern openings and second pattern openings defines second hardmask openings in the corresponding hardmask layer at isolated positions corresponding to sections of the first hardmask openings in the first portion; and
the other of the first pattern openings and second pattern openings or openings of a further photomask define further hardmask openings in the respective hardmask layer that correspond to sections of a plurality of the first hardmask openings in the second portion.

9. The method of claim 6, wherein one of the first pattern openings and second pattern openings defines first hardmask openings in the respective hardmask layer to form a lines/spaces pattern extending over the second portion and to define second hardmask openings in the respective hardmask layer at isolated positions in the first portion.

10. The method of claim 6, wherein the first hardmask layer is formed above the second hardmask layer prior to patterning the second hardmask layer.

11. The method of claim 6, wherein the first hardmask layer is formed above the second hardmask layer subsequent to patterning the second hardmask layer.

12. The method of claim 1, wherein forming the first and second structures comprises:
exposing a photoresist material, the first and the second photomasks being used in at least two exposure processes;
wherein an exposure dose of each of the exposure processes is adjusted such that the photoresist material is semi-exposed by a single one of the exposure processes, respectively.

13. The method of claim 12, wherein:
the first photomask is configured to expose the photoresist material at first positions arranged in an array pattern extending over the first and second portions;
the second photomask is configured to expose the photoresist material at isolated positions corresponding to individual ones of the first positions in the first portion; and
the second or a further photomask is configured to expose the photoresist material at further positions corresponding to a plurality of the first positions in the second portion.

14. The method of claim 12, wherein:
the first photomask is configured to expose the photoresist material to form a lines/spaces pattern extending over the first and second portions;
the second photomask is configured to expose the photoresist material at isolated positions corresponding to sections of the lines/spaces pattern in the first portion; and
the second or a further photomask is configured to expose the photoresist material at further positions corresponding to sections of a plurality of the lines/spaces pattern in the second portion.

15. The method of claim 12, wherein:
one of the first and second photomasks is configured to expose the photoresist material at first positions to form a lines/spaces pattern extending over the second portion and at isolated positions in the first portion.

16. The method of claim 1, wherein the first and the second structures are self-aligned to each other.

* * * * *